(12) United States Patent
Toyota et al.

(10) Patent No.: US 7,297,469 B2
(45) Date of Patent: Nov. 20, 2007

(54) METHOD OF PATTERNING A THICK-FILM PASTE MATERIAL LAYER, METHOD OF MANUFACTURING COLD- CATHODE FIELD EMISSION DEVICE, AND METHOD OF MANUFACTURING A COLD-CATHODE FIELD EMISSION DISPLAY

(75) Inventors: Motohiro Toyota, Kanagawa (JP); Mika Ishiwata, Kanagawa (JP)

(73) Assignee: Sony Corporation (JP)

( * ) Notice: Subject to any disclaimer, the term of this patent is extended or adjusted under 35 U.S.C. 154(b) by 651 days.

(21) Appl. No.: 10/496,295

(22) PCT Filed: Mar. 20, 2003

(86) PCT No.: PCT/JP03/03417

§ 371 (c)(1),
(2), (4) Date: May 21, 2004

(87) PCT Pub. No.: WO03/083889

PCT Pub. Date: Oct. 9, 2003

(65) Prior Publication Data
US 2006/0078829 A1    Apr. 13, 2006

(30) Foreign Application Priority Data
Apr. 2, 2002    (JP) .............................. 2002-099884

(51) Int. Cl.
*H01J 1/30*    (2006.01)
(52) U.S. Cl. ...................... 430/315; 430/319; 430/321; 445/24
(58) Field of Classification Search ............... None
See application file for complete search history.

(56) References Cited

U.S. PATENT DOCUMENTS 6,811,457 B2 * 11/2004 Cheng et al. .................. 445/24
2003/0141495 A1 *  7/2003 Lee et al. ...................... 257/10

FOREIGN PATENT DOCUMENTS

JP          59-201482          11/1984

(Continued)

OTHER PUBLICATIONS

International Search Report dated Jun. 17, 2003.

(Continued)

*Primary Examiner*—John A. McPherson
(74) *Attorney, Agent, or Firm*—Rader Fishman & Grauer PLLC; Ronald P. Kananen

(57) ABSTRACT

In a method of manufacturing a cold cathode field emission device, a cathode electrode 11, an insulating layer 12 and a gate electrode 13 are formed; an opening portion 14 is formed through the gate electrode 13 and the insulating layer 12 to expose the cathode electrode 11; a resist-material layer 20 covering the side wall of the opening portion 14, the gate electrode 13 and the insulating layer 12 is formed; the surface of the resist-material layer is modified to form a modified layer 21; an electron emitting portion 15 constituted of the thick-film-paste-material layer 22 is formed on the cathode electrode 11 positioned in the bottom portion of the opening portion 14; and then, the resist-material layer 20 is removed.

69 Claims, 38 Drawing Sheets

FOREIGN PATENT DOCUMENTS

| | | |
|---|---|---|
| JP | 5-313379 | 11/1993 |
| JP | 6-222370 | 8/1994 |
| JP | 7-065708 A * | 3/1995 |
| JP | 7-320629 | 12/1995 |
| JP | 7-320636 | 12/1995 |
| JP | 8-153714 | 6/1996 |
| JP | 11-317153 | 11/1999 |
| JP | 2001-143602 | 5/2001 |
| JP | 2001-256884 | 9/2001 |
| JP | 2002-245928 | 8/2002 |

OTHER PUBLICATIONS

PCT Written Opinion with Translation.
International Preliminary Examination Report with translation.

* cited by examiner

[STEP-100]

[STEP-110]

[STEP-120]

[STEP-130]

[STEP-220]

[STEP-230]

[STEP-230] CONTINUED

[STEP-240]

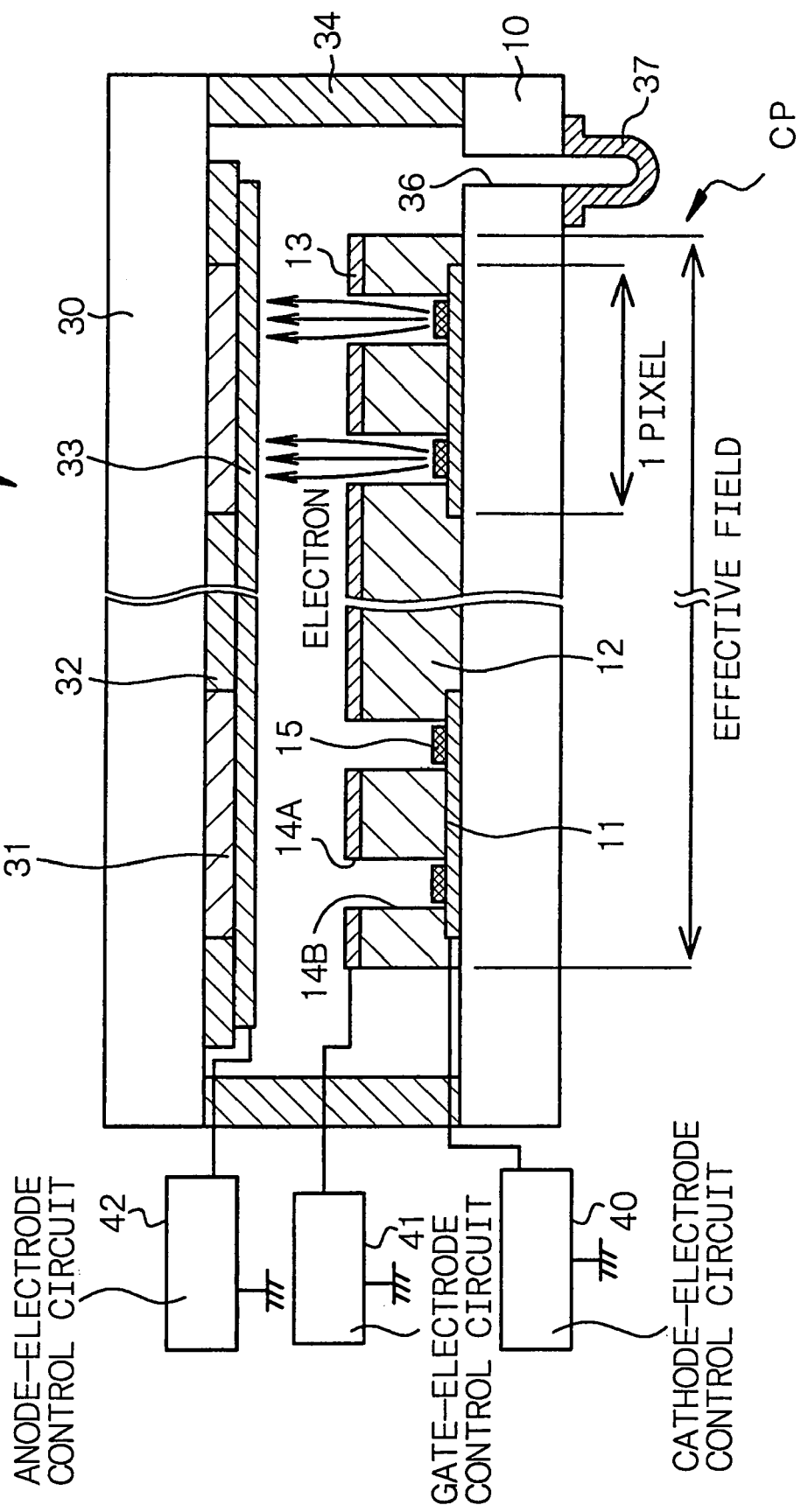

[STEP-320]

[STEP-330]

[STEP-340]

[STEP-350]

[STEP-360]

[STEP-360] CONTINUED

[STEP-370]

[STEP-380]

Fig. 7A
[STEP-400]
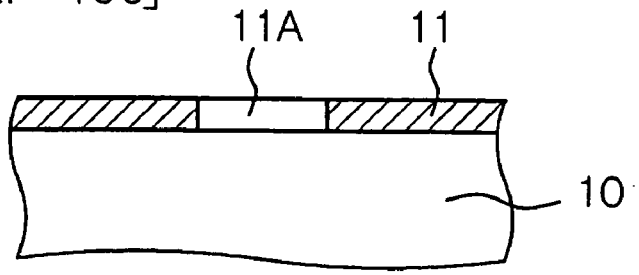
Fig. 7B
[STEP-420]
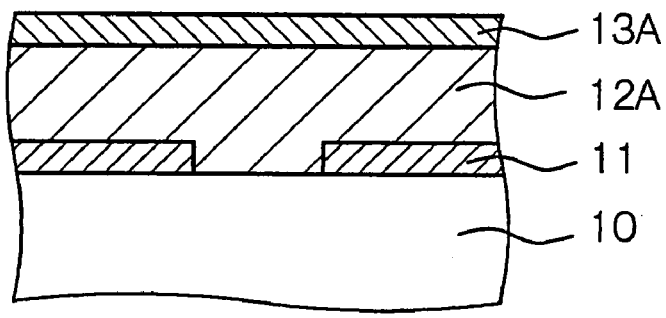
Fig. 7C
[STEP-430]
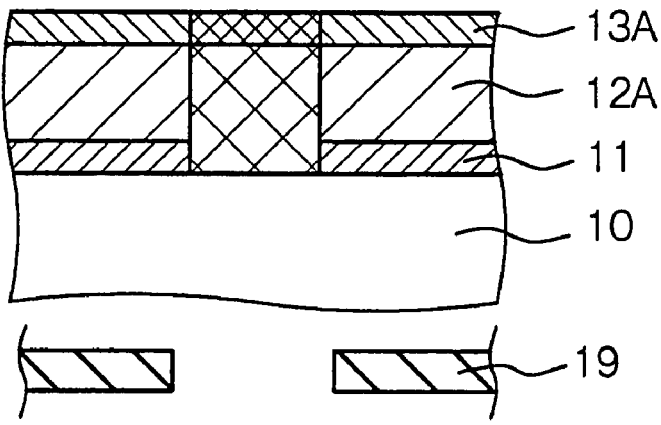
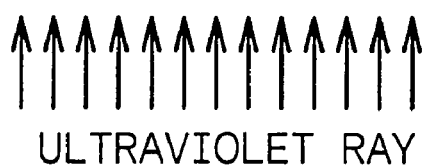
ULTRAVIOLET RAY

[STEP-430] CONTINUED

[STEP-440]

[STEP-450]

[STEP-460]

[STEP-470]

ULTRAVIOLET RAY

[STEP-470] CONTINUED

[STEP-480]

[STEP-480] CONTINUED

Fig. 12A
[STEP-530]
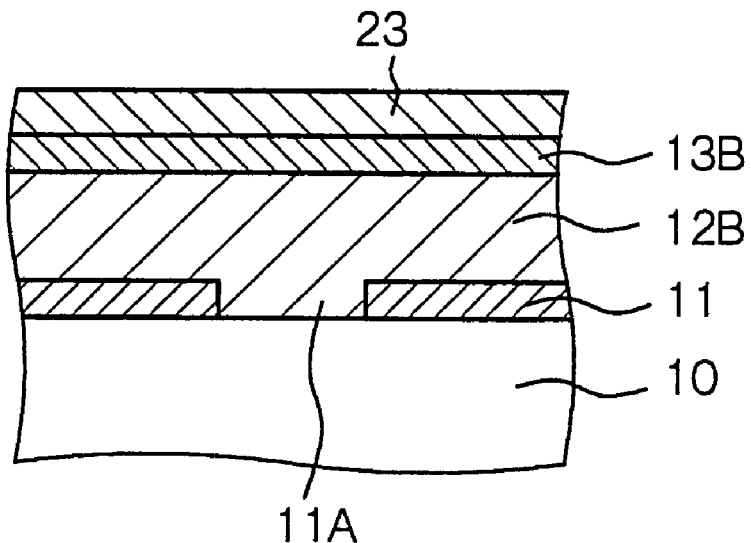
Fig. 12B
[STEP-540]
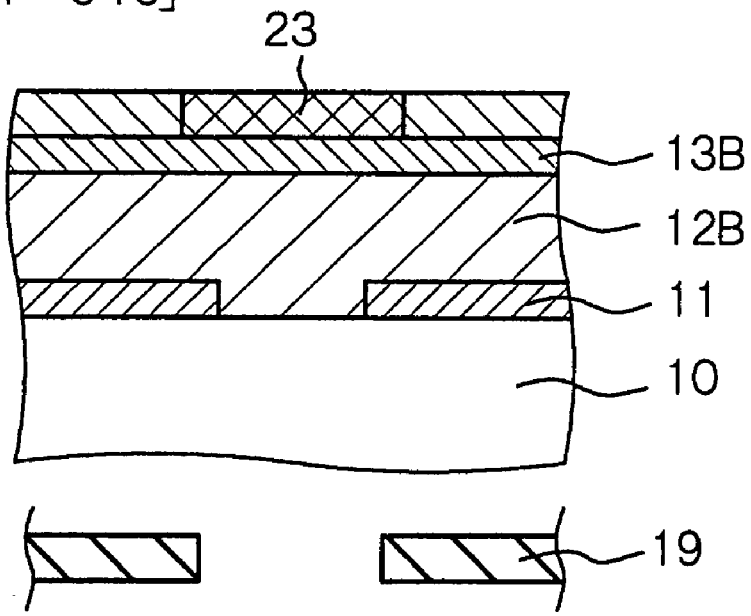
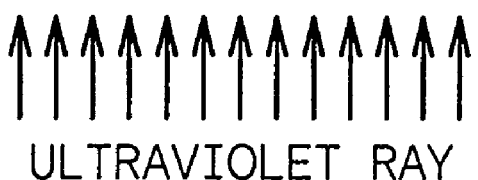
ULTRAVIOLET RAY

[STEP-540] CONTINUED

[STEP-550]

Fig. 14A
[STEP-620]
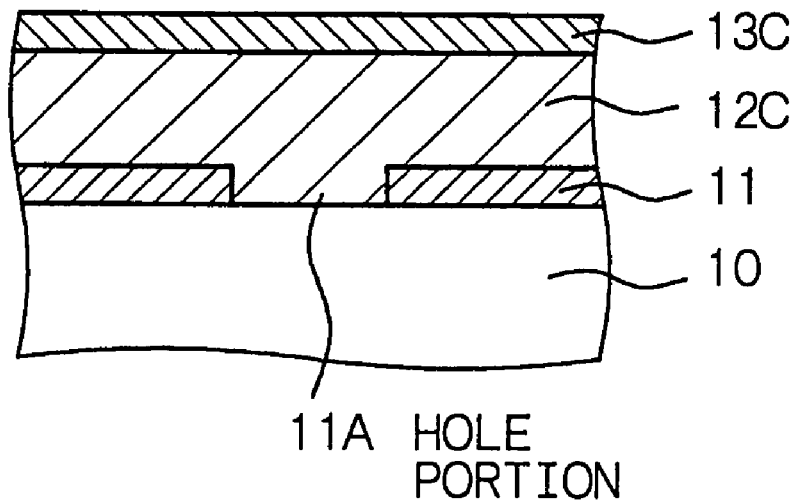
11A HOLE PORTION
Fig. 14B
[STEP-630]
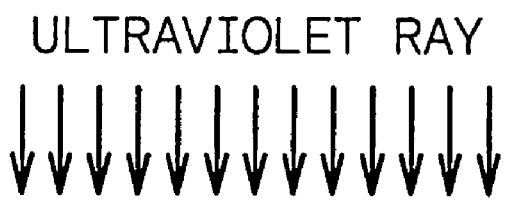
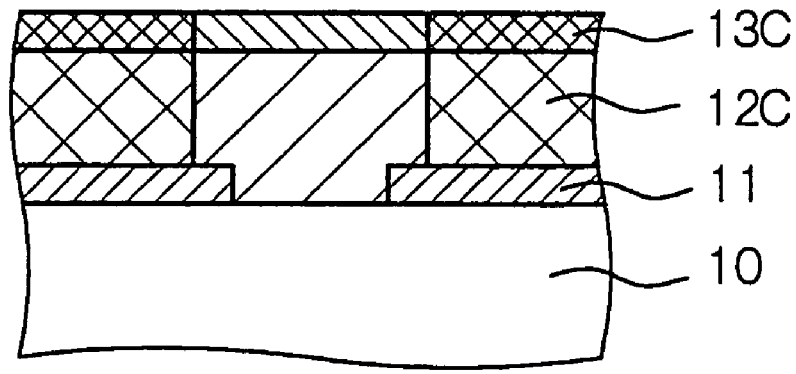

[STEP-630] CONTINUED

Fig. 16A
[STEP-700]
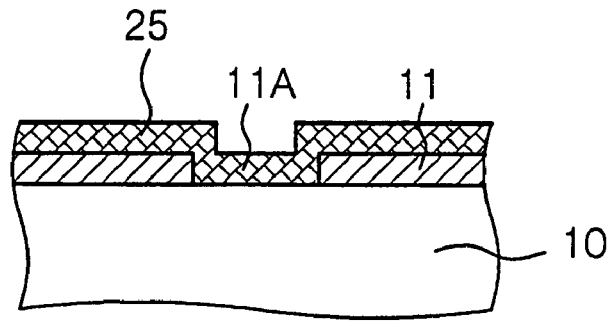
Fig. 16B
[STEP-720]
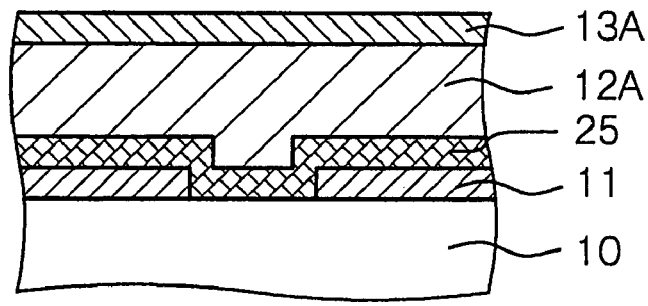
Fig. 16C
[STEP-730]
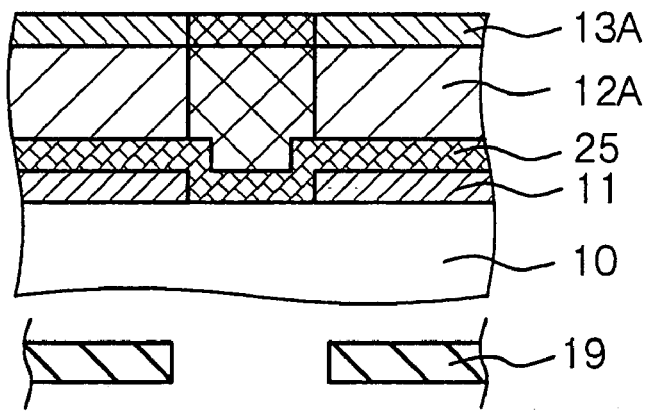
ULTRAVIOLET RAY

[STEP-730] CONTINUED

[STEP-740]

[STEP-750]

[STEP-760]

[STEP-760] CONTINUED

ULTRAVIOLET RAY

[STEP-760] CONTINUED

[STEP-770]

[STEP-830]

[STEP-840]

ULTRAVIOLET RAY

[STEP-840] CONTINUED

[STEP-850]

Fig. 22A
[STEP-920]
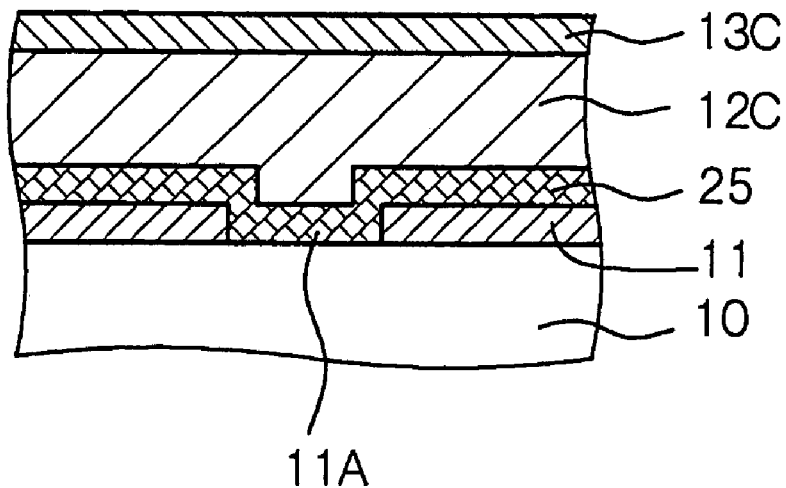
Fig. 22B
[STEP-930]
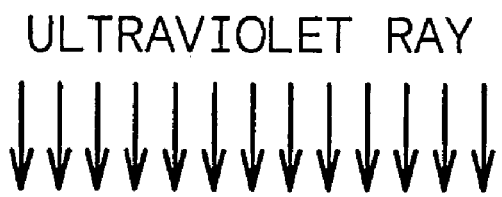
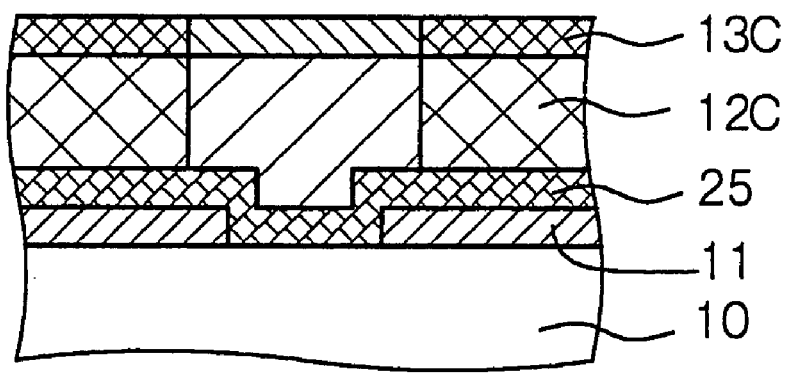

[STEP-930] CONTINUED

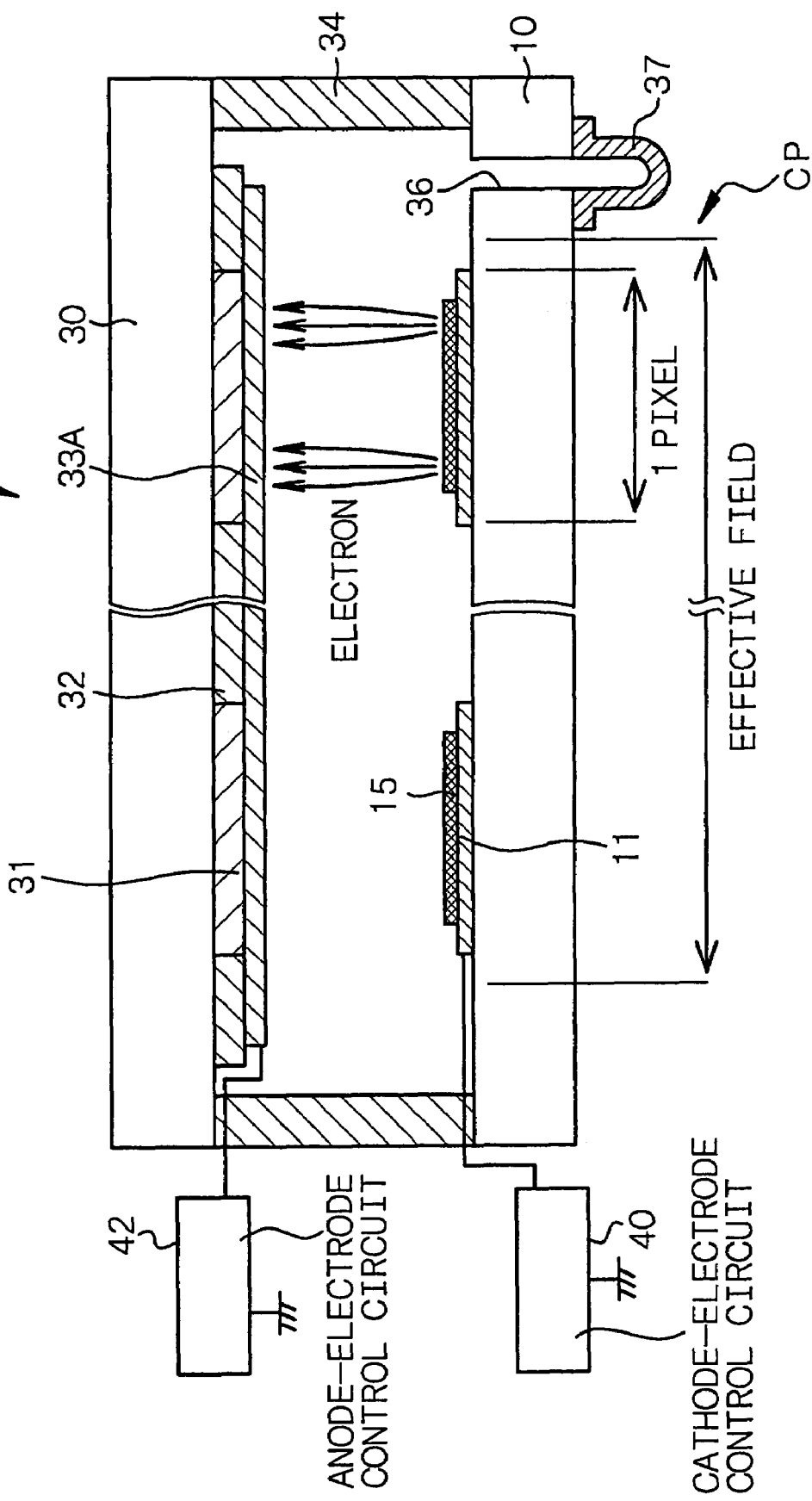

[STEP-1030]

[STEP-1040]

[STEP-1040] CONTINUED

[STEP-1050]

[STEP-1110]

[STEP-1110] CONTINUED

[STEP-1220]

[STEP-1230]

[STEP-1240]

ULTRAVIOLET RAY

[STEP-1240] CONTINUED

[STEP-1250]

[STEP-1310]

[STEP-1310] CONTINUED

[STEP-1420]

[STEP-1430]

[STEP-1430] CONTINUED

↑↑↑↑↑↑↑↑↑↑↑↑↑
ULTRAVIOLET RAY

[STEP-1430] CONTINUED

[STEP-1440]

[STEP-1510]

[STEP-1510] CONTINUED

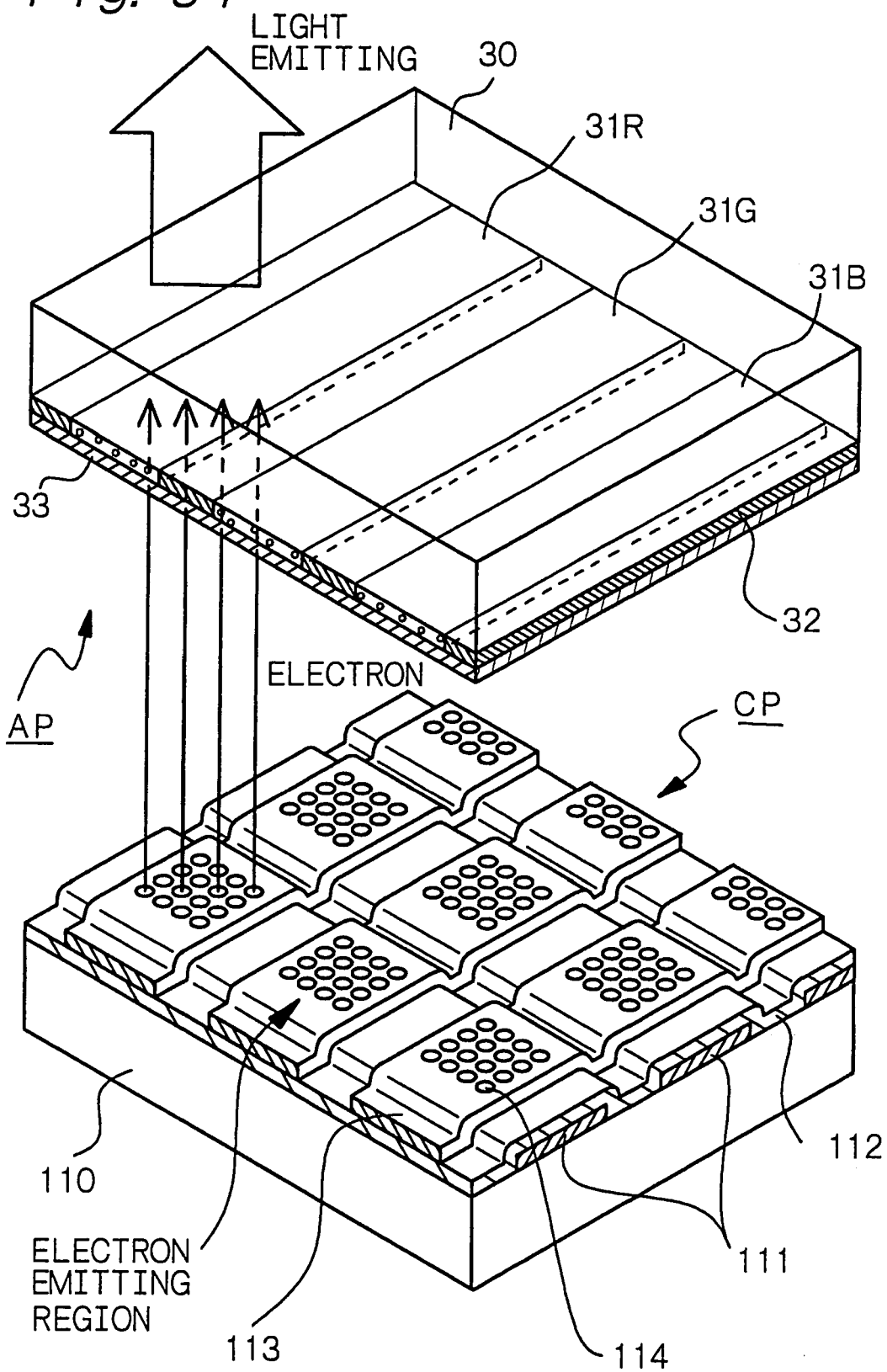

[STEP-30]

[STEP-40]

[STEP-50]

[STEP-60]

METHOD OF PATTERNING A THICK-FILM PASTE MATERIAL LAYER, METHOD OF MANUFACTURING COLD- CATHODE FIELD EMISSION DEVICE, AND METHOD OF MANUFACTURING A COLD-CATHODE FIELD EMISSION DISPLAY

TECHNICAL FIELD

The present invention relates to a method of patterning a thick-film-paste-material layer, a method of manufacturing a cold cathode field emission device and a method of manufacturing a cold cathode field emission display.

BACKGROUND ART

In the fields of displays for use in television receivers and information terminals, studies have been made for replacing conventionally mainstream cathode ray tubes (CRT) with flat-panel displays which are to comply with demands for a decrease in thickness, a decrease in weight, a larger screen and a high fineness. Such flat panel displays include a liquid crystal display (LCD), an electroluminescence display (ELD), a plasma display panel (PDP) and a cold cathode field emission display (FED). Of these, a liquid crystal display is widely used as a display for an information terminal. For applying the liquid crystal display to a floor-type television receiver, however, it still has problems to be solved concerning a higher brightness and an increase in size. In contrast, a cold cathode field emission display uses cold cathode field emission devices (to be sometimes referred to as "field emission device" hereinafter) capable of emitting electrons from a solid into a vacuum on the basis of a quantum tunnel effect without relying on thermal excitation, and it is of great interest from the viewpoints of a high brightness and a low power consumption.

FIGS. 33 and 34 shows a cold cathode field emission display to which the field emission devices are applied (to be sometimes referred to as "display" hereinafter). FIG. 33 is a schematic partial end view of the conventional display, and FIG. 34 is a schematic partial perspective view of the display when a cathode panel CP and an anode panel AP are disassembled.

The field emission device shown in FIG. 33 is a so-called Spindt-type field emission device having a conical electron emitting portion. Such a field emission device comprises a cathode electrode 111 formed on a supporting member 110, an insulating layer 112 formed on the supporting member 110 and the cathode electrode 111, a gate electrode 113 formed on the insulating layer 112, an opening portion 114 formed in the gate electrode 113 and the insulating layer 112 (a first opening portion 114A formed in the gate electrode 113 and a second opening portion 114B formed in the insulating layer 112), and a conical electron emitting portion 115A formed on the cathode electrode 111 positioned in the bottom portion of the second opening portion 114B. Generally, the cathode electrode 111 and the gate electrode 113 are formed in the form of a stripe each in directions in which the projection images of these two electrodes cross each other at right angles. Generally, a plurality of field emission devices are arranged in a region (corresponding to one pixel, and the region will be called an "overlapped region" or an "electron emitting region" hereinafter) where the projection images of the above two electrodes overlap. Further, generally, such electron emitting regions are arranged in the form of a two-dimensional matrix within an effective field (which works as an actual display portion) of a cathode panel CP.

An anode panel AP comprises a substrate 30, a phosphor layer 31 (31R, 31B and 31G) which is formed on the substrate 30 and has a predetermined pattern, and an anode electrode 33 formed thereon. One pixel is constituted of a group of the field emission devices formed in the overlapped region of the cathode electrode 111 and the gate electrode 113 on the cathode panel side and the phosphor layer 31 which is opposed to the above group of the field emission devices and is on the anode panel side. In the effective field, such pixels are arranged on the order of hundreds of thousands to several millions. On the substrate 30 between one phosphor layer 31 and another phosphor layer 31, a black matrix 32 is formed.

The anode panel AP and the cathode panel CP are arranged such that the electron emitting regions and the phosphor layers 31 are opposed to each other, and the anode panel AP and the cathode panel CP are bonded to each other in their circumferential portions through a frame 34, whereby the display is produced. In an ineffective field (ineffective field of the cathode panel CP in the example shown in the drawings) which surrounds the effective field and where a peripheral circuit for selecting pixels is formed, a through-hole 36 for vacuuming is provided, and a tip tube 37 is connected to the through-hole 36 and sealed after vacuuming. That is, a space surrounded by the anode panel AP, the cathode panel CP and the frame 34 is in a vacuum state.

A relatively negative voltage is applied to the cathode electrode 111 from an cathode-electrode control circuit 40, a relatively positive voltage is applied to the gate electrode 113 from a gate-electrode control circuit 41, and a positive voltage having a higher level than the voltage applied to the gate electrode 113 is applied to the anode electrode 33 from the anode-electrode control circuit 42. When such a display is used for displaying on its screen, a scanning signal is inputted to the cathode electrode 111 from the cathode-electrode control circuit 40, and a video signal is inputted to the gate electrode 113 from the gate-electrode control circuit 41. Due to an electric field generated when a voltage is applied between the cathode electrode 111 and the gate electrode 113, electrons are emitted from the electron emitting portion 115A on the basis of a quantum tunnel effect, and the electrons are attracted toward the anode electrode 33 and collide with the phosphor layer 31. As a result, the phosphor layer 31 is excited to emit light, and a desired image can be obtained. That is, the working of the display is controlled, in principle, by a voltage applied to the gate electrode 113 and a voltage applied to the electron emitting portion 115A through the cathode electrode 111.

The method of producing a Spindt-type field emission device will be explained below with reference to FIGS. 35A, 35B, 36A and 36B which are schematic end views of the supporting member 110 and the like constituting the cathode panel.

This method is in principle a method of forming the circular-cone-shaped electron emitting electrode 115A composed of a metal material by vertical vapor deposition. That is, vaporized particles perpendicularly enter the first opening portion 114A formed in the gate electrode 113. The amount of the vaporized particles which reach the bottom portion of the second opening portion 114B is gradually decreased by utilizing the shielding effect of an overhanging deposit formed around an opening edge portion of the first opening portion 114A, so that the electron emitting portion 115A as a circular-cone-shaped deposit is formed in a self-aligned manner. The method will be explained in which a peeling-off layer 116 is formed in advance on the insulating layer 112 and the gate electrode 113 for easing removal of an unnecessary overhanging deposit. In FIGS. 35A, 35B, 36A and 36B, only one electron emitting portion is illustrated.

[Step-10]

A conductive material layer composed, for example, of polysilicon for a cathode electrode is formed on a supporting member 110 composed, for example, of a glass substrate by a plasma-enhanced CVD method. Then, the conductive material layer for a cathode electrode is patterned by a lithographic method and a dry etching method, to form the cathode electrode 111 having a stripe form. Thereafter, an insulating layer 112 composed of $SiO_2$ is formed on the entire surface by a CVD method.

[Step-20]

Then, the conductive material layer (for example, TiN layer) for a gate electrode is formed on the insulating layer 112 by a sputtering method. Then, the conductive material layer for a gate electrode is patterned by a lithographic method and a dry etching method, to form the stripe-shaped gate electrode 113. The cathode electrode 111 in the form of a stripe extends in a direction rightward and leftward to the paper surface of the drawing and the gate electrode 113 in the form of a stripe extends in a direction perpendicular to the paper surface of the drawing.

[Step-30]

Then, a resist layer is formed again, a first opening portion 114A is formed in the gate electrode 113 by etching and the second opening portion 114B is formed in the insulating layer 112 by etching, so as to expose the cathode electrode 111 in the bottom portion of the second opening portion 114B, and then, the resist layer is removed, whereby a structure shown in FIG. 35A can be obtained.

[Step-40]

As shown in FIG. 35B, a peeling-off layer 116 is then formed on the gate electrode 113 and the insulating layer 11 by oblique vapor deposition of nickel (Ni) while the supporting member 110 is turned. In this case, the incidence angle of vaporized particles relative to a normal of the supporting member 110 is set at a sufficiently large angle (for example, an incidence angle of 65° to 85°), whereby the peeling-off layer 116 can be formed on the insulating layer 112 and the gate electrode 113 almost without depositing any nickel in the bottom portion of the second opening portion 114B. The peeling-off layer 116 extends from the opening edge portion of the first opening portion 114A like eaves, whereby the diameter of the first opening portion 114A is substantially decreased.

[Step-50]

Then, an electrically conductive material such as molybdenum (Mo) is deposited on the entire surface by vertical vapor deposition (incidence angle 3° to 10°). During the above vapor deposition, as shown in FIG. 36A, as the conductive material layer 117 having an overhanging form grows on the peeling-off layer 116, the substantial diameter of the first opening portion 114A is gradually decreased, the vaporized particles which contributes to the deposition in the bottom portion of the second opening portion 114B gradually comes to be limited to particles which pass the central region of the first opening portion 114A. As a result, a circular-cone-shaped deposit is formed on the bottom portion of the second opening portion 114B, and the circular-cone-shaped deposit constitutes the electron emitting electrode 115A.

[Step-60]

Then, as shown in FIG. 36B, the peeling-off layer 116 is peeled off from the insulating layer 112 and the gate electrode 113 by a lift-off method, and the conductive material layer 117 above the insulating layer 112 and the gate electrode 113 is selectively removed. In this manner, a cathode panel CP having a plurality of the Spindt-type field emission devices can be obtained.

In the above display constitution, it is effective to sharpen the top end portion of the electron emitting portion for attaining a large current of emitted electrons at a low driving voltage, and from this viewpoint, the electron emitting portion 115A of the above Spindt-type field emission device can be said to have excellent performances. And, the above manufacturing method of a Spindt-type field emission device has an advantage that a circular-cone-shaped deposit can be formed as an electron emitting portion 115A in a self-aligned manner with regard to the opening portions 114A and 114B. However, the formation of the conical electron emitting portion 115A requires advanced processing techniques, and with an increase in the size of the display and with an increase in the area of the effective field, it is beginning to be difficult to form the electron emitting portions 115A uniformly all over the effective field since the number of the electron emitting portions 115A totals up to tens of millions in some cases.

There has been therefore proposed a so-called flat-type field emission device which uses a flat electron emitting portion exposed in a bottom portion of an opening portion without using the conical electron emitting portion. The electron emitting portion of the flat-type field emission device is formed on a cathode electrode positioned in the bottom portion of the opening portion, and it is composed of a material having a lower work function than a material constituting the cathode electrode for achieving a high current of emitted electrons even if the electron emitting portion is flat. In recent years, it has been proposed to use various types of carbon materials such as a carbon-nanotube as the above material.

In the manufacture of the above flat-type field emission device, a structure shown in FIG. 35A is obtained, and then a thick-film-paste-material layer 122 made, for example, of negative-type photosensitive paste containing carbon-nanotubes is formed on the entire surface including the inside of the opening portion 114 (see FIG. 37A). Then, the thick-film-paste-material layer 122 is exposed to exposure light (see FIG. 37B), further, followed by development, removal of an unnecessary portion of the thick-film-paste-material layer 122 and then firing of the remaining thick-film-paste-material layer 122, whereby an electron emitting portion 115 can be obtained (see FIG. 37C). Reference numeral 119 indicates an exposure mask.

Meanwhile, before the thick-film-paste-material layer 122 is exposed, the exposure mask 119 is aligned in relation to a reference marker (not shown) that is provided beforehand, so that the exposure mask 119 and the opening portion 114 are not out of position.

However, the supporting member 110 undergoes deformation, for example, due to a thermal history of the supporting member 110 or stresses of various layers (cathode electrode 111, insulating layer 112, gate electrode 113, etc.) formed on the supporting member 110. As a result, when the thick-film-paste-material layer 122 is exposed, an alignment failure actually takes place between the exposure mask 119 and the opening portion 114 in many places. When such a phenomenon occurs, the distance from the opening end portion of the first opening portion 114A formed in the gate electrode 113 to the electron emitting portion 115 positioned in the bottom portion of the second opening portion 114B varies, and as a result, the electron emissions from the electron emitting portions 115 vary, which causes display non-uniformity. In the worst case, part of the thick-film-paste-material layer 122 is left on the side wall of the opening portion 114, so that a short circuit is formed between the gate electrode 113 and the cathode electrode 111 by such a thick-film-paste-material layer 122.

One means that is thinkable to overcome the above problem is a method in which a resist-material layer 120 for covering the side wall of the opening portion 114, the gate electrode 113 and the insulating layer 112 is formed (see FIG. 38A) after the structure shown in FIG. 35A is obtained, a negative-type thick-film-paste-material layer 122 containing carbon-nanotubes is formed on the entire surface including the inside of the opening portion 114 (see FIG. 38B). In the above method, however, the resist-material layer 120 is dissolved by the thick-film-paste-material layer 122, which actually results in a state shown in FIG. 37A instead of bringing about a state shown in FIG. 38B, so that it is no longer significant to provide the resist-material layer 120.

Another method may be thinkable, in which a mask layer made of a material insusceptible to the thick-film-paste-material layer 122 is formed in place of the resist-material layer 120. That is, a mask layer made of a material insusceptible to the thick-film-paste-material layer 122 is formed on the entire surface including the inside of the opening portion 114, a resist layer is formed on the mask layer, an opening portion is formed through the resist layer positioned above the bottom portion of the opening portion, the mask layer is etched with using the resist layer as an etching mask, and then resist layer is removed, thereby to remove the mask layer from the bottom portion of the opening portion. However, this method is complicated and requires an additional cost.

It is therefore an object of the present invention to provide a method of patterning a thick-film-paste-material layer with a resist material without any problem, a method of manufacturing a cold cathode field emission device in which an electron emitting portion made of a thick-film-paste-material can be formed with a resist material without any problem, and a method of manufacturing a cold cathode field emission display, to which the above method of manufacturing a cold cathode field emission device is applied.

DISCLOSURE OF THE INVENTION

A method of patterning a thick-film-paste-material layer according to a first aspect of the present invention for achieving the above object, comprises the steps of;

(A) forming a resist-material layer on a front surface (first surface) of a substratum and then patterning the resist-material layer, to obtain the resist-material layer in a state where part of the front surface (first surface) of the substratum is exposed, (B) modifying the surface of the resist-material layer, (C) forming a thick-film-paste-material layer on the entire surface, and (D) removing the resist-material layer, to remove the thick-film-paste-material layer on the resist-material layer and to retain the thick-film-paste-material layer on the front surface (first surface) of the substratum which front surface has been covered with no resist-material layer.

A method of patterning a thick-film-paste-material layer according to a second aspect of the present invention for achieving the above object, comprises the steps of;

(A) forming a resist-material layer on a front surface (first surface) of a substratum and then patterning the resist-material layer, to obtain the resist-material layer in a state where part of the front surface (first surface) of the substratum is exposed, (B) modifying the surface of the resist-material layer, (C) forming a photosensitive thick-film-paste-material layer on the entire surface, (D) exposing and developing the thick-film-paste-material layer, to selectively retain the thick-film-paste-material layer on the front surface (first surface) of the substratum which front surface has been covered with no resist-material layer, and (E) removing the resist-material layer.

In the method of patterning a thick-film-paste-material layer according to the second aspect of the present invention, preferably, ashing treatment is carried out between said steps (D) and (E) to remove the modified layer in the surface of the resist-material layer formed in said step (B), for reliably removing the resist-material layer in said step (E).

In the method of patterning a thick-film-paste-material layer according to the second aspect of the present invention, the exposure of the thick-film-paste-material layer in said step (D) can be carried out from the front-surface side (first-surface side) of the substratum.

Alternatively, in the method of patterning a thick-film-paste-material layer according to the second aspect of the present invention, the exposure of the thick-film-paste-material layer in said step (D) can be carried out from the reverse-surface side (second-surface side) of the substratum. In this case, it is desirable to employ a constitution in which the substratum is provided with a region for transmitting exposure light to which the thick-film-paste-material layer is to be exposed and a region that transmits no exposure light, and the region that transmits the exposure light corresponds to part of the front surface (first surface) which front surface has been covered with no resist-material layer.

In the method of patterning a thick-film-paste-material layer according to the first or second aspect of the present invention, the modification of the surface of the resist-material layer in said step (B) can be carried out by plasma treatment in an atmosphere containing a fluorine-containing gas. In this case, the fluorine-containing gas is preferably at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$. Alternatively, the modification of the surface of the resist-material layer in said step (B) can be carried out by ion implantation with fluorine ion or by ion implantation with silicon ion.

The method of manufacturing a cold cathode field emission device according to a first aspect of the present invention for achieving the above object, is a method of manufacturing a cold cathode field emission device for constituting a so-called three-electrode-type cold cathode field emission display, and comprises the steps of;

(A) forming a cathode electrode on a front surface of a supporting member, said cathode electrode extending in a first direction, (B) forming an insulating layer on the entire surface, (C) forming a gate electrode on the insulating layer, said gate electrode extending in a second direction different from the first direction, (D) forming an opening portion through the gate electrode and the insulating layer to expose the cathode electrode in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the front-surface side of the supporting member with exposure light to expose a portion of the thick-film-paste-material layer which portion is positioned in the bottom portion of the opening portion to the exposure light, and then developing the thick-film-paste-material layer, to form an electron emitting portion constituted of the thick-film-paste-material layer on the cathode electrode positioned in the bottom portion of the opening portion, and (I) removing the resist-material layer.

The method of manufacturing a cold cathode field emission display according to the present invention for achieving the above object, comprises arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions.

The method of manufacturing a cold cathode field emission display according to a first aspect of the present invention, comprises manufacturing a cold cathode field emission device by the steps (A) to (I) in the above method of manufacturing a cold cathode field emission device according to the first aspect of the present invention.

The method of manufacturing a cold cathode field emission device or the method of manufacturing a cold cathode field emission display according to a second aspect of the present invention, differs from the method of manufacturing a cold cathode field emission device or the method of manufacturing a cold cathode field emission display according to the first aspect of the present invention, in the structure of the cathode electrode, in that the thick-film-paste-material layer is photosensitive and in that the photosensitive thick-film-paste-material layer is exposed from the reverse-surface side (second-surface side) of the supporting member.

The method of manufacturing a cold cathode field emission device according to a second aspect of the present invention, is also a method of manufacturing a cold cathode field emission device for constituting a so-called three-electrode-type cold cathode field emission display, and comprises the steps of;

(A) forming a cathode electrode on a front surface (first surface) of a supporting member that transmits exposure light, said cathode electrode having a hole portion having a bottom portion where the supporting member is exposed, being made of a material that transmits no exposure light and extending in a first direction, (B) forming an insulating layer on the entire surface, (C) forming a gate electrode on the insulating layer, said gate electrode extending in a second direction different from the first direction, (D) forming an opening portion through the gate electrode and the insulating layer to expose the cathode electrode and the hole portion in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the reverse surface (second surface) of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer, said electron emitting portion spreading from the cathode electrode to the inside of the hole portion, and (I) removing the resist-material layer.

The method of manufacturing a cold cathode field emission display according to a second aspect of the present invention, comprises manufacturing a cold cathode field emission device by the steps (A) to (I) in the above method of manufacturing a cold cathode field emission device according to the second aspect of the present invention.

The method of manufacturing a cold cathode field emission device or the method of manufacturing a cold cathode field emission display according to a third aspect of the present invention, differs from the method of manufacturing a cold cathode field emission device or the method of manufacturing a cold cathode field emission display according to the second aspect of the present invention, in that a light-transmitting layer is formed and in that an electron emitting portion is formed on the light-transmitting layer.

The method of manufacturing a cold cathode field emission device according to a third aspect of the present invention for achieving the above object, is a method of manufacturing a cold cathode field emission device for constituting a so-called three-electrode-type cold cathode field emission display, and comprises the steps of;

(A) forming a cathode electrode on a front surface (first surface) of a supporting member that transmits exposure light, said cathode electrode having a hole portion having a bottom portion where the supporting member is exposed, being made of a material that transmits no exposure light and extending in a first direction, and forming, at least in the hole portion, a light-transmitting layer made of a conductive material or resistive material that transmits exposure light, (B) forming an insulating layer on the entire surface, (C) forming a gate electrode on the insulating layer, said gate electrode extending in a second direction different from the first direction, (D) forming an opening portion through the gate electrode and the insulating layer to expose the light-transmitting layer in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the reverse surface (second surface) of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer on the light-transmitting layer, and (I) removing the resist-material layer.

The method of manufacturing a cold cathode field emission display according to a third aspect of the present invention, comprises manufacturing a cold cathode field emission device by the steps (A) to (I) in the above method of manufacturing a cold cathode field emission device according to the third aspect of the present invention.

The method of manufacturing a cold cathode field emission device according to a fourth aspect of the present invention for achieving the above object, is a method of manufacturing a cold cathode field emission device for constituting a so-called two-electrode-type cold cathode field emission display, and comprises the steps of;

(A) forming a cathode electrode on a front surface (first surface) of a supporting member, said cathode electrode extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) carrying out the exposure of the thick-film-paste-material layer to exposure light on the front-surface side (first-surface side) and then developing the thick-film-paste-material layer, to form an electron emitting portion constituted of the thick-film-paste-material layer on the cathode electrode covered with no resist-material layer, and (F) removing the resist-material layer.

The method of manufacturing a cold cathode field emission device according to a fifth aspect of the present invention for achieving the above object, is a method of manufacturing a cold cathode field emission device for constituting a so-called three-electrode-type cold cathode field emission display, and comprises carrying out the above method of manufacturing a cold cathode field emission device according to the fourth aspect of the present invention, up to said step (F), and then carrying out the steps of;

(G) forming an insulating layer on the entire surface, (H) forming a gate electrode on the insulating layer, said gate electrode extending in a second direction different from the first direction, and (I) forming an opening portion through the gate electrode and the insulating layer to expose the electron emitting portion in the bottom portion of the opening portion.

The method of manufacturing a cold cathode field emission display according to a fourth aspect of the present invention, comprises manufacturing a cold cathode field emission device by the steps (A) to (F) in the above method of manufacturing a cold cathode field emission device according to the fourth aspect of the present invention. The method of manufacturing a cold cathode field emission display according to a fifth aspect of the present invention, comprises manufacturing a cold cathode field emission device by the steps (A) to (F) in the above method of manufacturing a cold cathode field emission device according to the fourth aspect of the present invention, and further by the steps (G) to (I) in the above method of manufacturing a cold cathode field emission device according to the fifth aspect of the present invention.

The method of manufacturing a cold cathode field emission device according to a sixth aspect of the present invention for achieving the above object, is a method of manufacturing a cold cathode field emission device for constituting a so-called two-electrode-type cold cathode field emission display, and comprises the steps of;

(A) forming a cathode electrode on a front surface (first surface) of a supporting member that transmits exposure light, said cathode electrode having a hole portion having a bottom portion where the supporting member is exposed, being made of a material that transmits no exposure light and extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) irradiating the reverse surface (second surface) of the supporting member with exposure light with using said hole portion as an exposure mask, to expose a portion of the thick-film-paste-material layer above the hole portion to the exposure light, and then developing the thick-film-paste-material layer, to form an electron emitting portion constituted of the thick-film-paste-material layer, the electron emitting portion spreading from the cathode electrode to the inside of the hole portion, and (F) removing the resist-material layer.

The method of manufacturing a cold cathode field emission device according to a seventh aspect of the present invention for achieving the above object, is a method of manufacturing a cold cathode field emission device for constituting a so-called three-electrode-type cold cathode field emission display, and comprises carrying out the above method of manufacturing a cold cathode field emission according to the sixth aspect of the present invention, up to said step (F) and then carrying out the steps of;

(G) forming an insulating layer on the entire surface, (H) forming a gate electrode on the insulating layer, said gate electrode extending in a second direction different from the first direction, and (I) forming an opening portion through the gate electrode and the insulating layer, to expose the electron emitting portion in the bottom portion of the opening portion.

The method of manufacturing a cold cathode field emission display according to a sixth aspect of the present invention, comprises manufacturing a cold cathode field emission device by the steps (A) to (F) in the above method of manufacturing a cold cathode field emission device according to the sixth aspect of the present invention. The method of manufacturing a cold cathode field emission display according to a seventh aspect of the present invention, comprises manufacturing a cold cathode field emission device by the steps (A) to (F) in the above method of manufacturing a cold cathode field emission device according to the sixth aspect of the present invention, and further by the steps (G) to (I) in the above method of manufacturing a cold cathode field emission device according to the seventh aspect of the present invention.

The method of manufacturing a cold cathode field emission device according to an eighth aspect of the present invention, is a method of manufacturing a cold cathode field emission device for constituting a so-called two-electrode-type cold cathode field emission display, and comprises the steps of;

(A) forming a cathode electrode on a front surface (first surface) of a supporting member that transmits exposure light, said cathode electrode having a hole portion having a bottom portion where the supporting member is exposed, being made of a material that transmits no exposure light and extending in a first direction, and then forming, at least in the hole portion, a light-transmitting layer made of a conductive material or resistive material that transmits exposure light, (B) forming a resist-material layer on the entire surface and then patterning the resist-material layer, to obtain the resist-material layer in a state where at least the light-transmitting layer in the hole portion is exposed, (C) modifying the surface of the resist-material layer, (D) forming a photosensitive thick-film-paste-material layer on the entire surface, (E) irradiating the reverse surface (second surface) of the supporting member with exposure light with using said hole portion as an exposure mask, to expose a portion of the thick-film-paste-material layer above the light-transmitting layer to the exposure light, and then developing the thick-film-paste-material layer, to form an electron emitting portion constituted of the thick-film-paste-material layer on the light-transmitting layer, and (F) removing the resist-material layer.

The method of manufacturing a cold cathode field emission device according to a ninth aspect of the present invention, is a method of manufacturing a cold cathode field emission device for constituting a so-called three-electrode-type cold cathode field emission display, and comprises carrying out the method of manufacturing a cold cathode field emission device according to the eighth aspect of the present invention, up to the step (F) and then carrying out the steps of;

(G) forming an insulating layer on the entire surface, (H) forming a gate electrode on the insulating layer, said gate electrode extending in a second direction different from the first direction, and (I) forming an opening portion through the gate electrode and the insulating layer to expose the electron emitting portion in the bottom portion of the opening portion.

The method of manufacturing a cold cathode field emission display according to an eighth aspect of the present invention, comprises manufacturing a cold cathode field emission device by the steps (A) to (F) in the above method of manufacturing a cold cathode field emission device according to the eighth aspect of the present invention. Further, the method of manufacturing a cold cathode field emission display according to a ninth aspect of the present invention, comprises manufacturing a cold cathode field emission device by the steps (A) to (F) in the above method of manufacturing a cold cathode field emission device according to the eighth aspect of the present invention and further by the steps (G) to (I) in the above method of manufacturing a cold cathode field emission device according to the ninth aspect of the present invention.

In the method of manufacturing a cold cathode field emission device or the method of manufacturing a cold cathode field emission display according to any one of the first to third aspects of the present invention, preferably, ashing treatment is carried out between said steps (H) and (I) thereby to remove the modified layer formed by modifying the surface of the resist-material layer in said step (F), from the viewpoint that the resist-material layer is reliably removed while reliably leaving the electron emitting portion constituted of the thick-film-paste-material layer on the cathode electrode, in the region extending from the cathode electrode to the hole portion or on the light-transmitting layer in said step (I). In the method of manufacturing a cold cathode field emission device or the method of manufacturing a cold cathode field emission display according to any one of the fourth to ninth aspects of the present invention, preferably, ashing treatment is carried out between said steps (E) and (F) thereby to remove the modified layer formed by modifying the surface of the resist-material layer in said step (C), from the viewpoint that the resist-material layer is reliably removed while reliably leaving the electron emitting portion constituted of the thick-film-paste-material layer on the cathode electrode, in the region extending from the cathode electrode to the hole portion or on the light-transmitting layer in said step (F).

In the method of manufacturing a cold cathode field emission device or the method of manufacturing a cold cathode field emission display according to any one of the first to third aspects of the present invention, preferably, the modification of the surface of the resist-material layer in said step (F) is carried out by plasma treatment in an atmosphere containing a fluorine-containing gas. In the method of manufacturing a cold cathode field emission device or the method of manufacturing a cold cathode field emission display according to any one of the fourth to ninth aspects of the present invention, preferably, the modification of the surface of the resist-material layer in said step (C) is carried out by plasma treatment in an atmosphere containing a fluorine-containing gas. In these cases, the fluorine-containing gas is preferably at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$. Alternatively, in the method of manufacturing a cold cathode field emission device or the method of manufacturing a cold cathode field emission display according to any one of the first to third aspects of the present invention, the modification of the surface of the resist-material layer in said step (F) may be carried out by ion implantation with fluorine ion or by ion implantation with silicon ion. In the method of manufacturing a cold cathode field emission device or the method of manufacturing a cold cathode field emission display according to any one of the fourth to ninth aspects of the present invention, the modification of the surface of the resist-material layer in said step (C) may be carried out by ion implantation with fluorine ion or by ion implantation with silicon ion.

In explanations of the method of manufacturing a cold cathode field emission device or the method of manufacturing a cold cathode field emission display according to any one of the first to ninth aspects of the present invention (these methods will be generally referred to as "manufacturing process of the present invention" hereinafter), the "step of forming a cathode electrode on the front surface (first surface) of the supporting member that transmits exposure light, said cathode electrode having a hole portion having a bottom portion where the supporting member is exposed, being made of a material that transmits no exposure light and extending in a first direction" will be sometimes abbreviated as "cathode-electrode-forming step" hereinafter.

Further, the "step of forming, at least in the hole portion, a light-transmitting layer made of a conductive material or resistive material that transmits exposure light" will be sometimes abbreviated as "light-transmitting-layer-forming step".

Further, the "step of photosensitive thick-film-paste-material layer at least in the opening portion" will be sometimes abbreviated as "step of forming a photosensitive thick-film-paste-material layer".

Further, the "step of irradiating the reverse surface (second surface) of the supporting member with exposure light with using said hole portion as an exposure mask, to expose a portion of the thick-film-paste-material layer above the hole portion to the exposure light, and then developing the thick-film-paste-material layer, to form an electron emitting portion constituted of the thick-film-paste-material layer, said electron emitting portion spreading from the cathode electrode to the inside of the hole portion" will be sometimes abbreviated as "step of forming an electron emitting portion by exposure on the reverse-surface side and development".

In the method of manufacturing a cold cathode field emission device or the method of manufacturing a cold cathode field emission display according to the second or third aspect of the present invention, there may be also employed a constitution in which;

in said step (B), an insulating layer made of a photosensitive material that transmits exposure light is formed, in said step (C), a gate electrode made of a photosensitive material is formed, and in said step (D), the reverse surface (second surface) of the supporting member is irradiated with exposure light with using said hole portion as an exposure mask, to expose a portion of the insulating layer and a portion of the gate electrode above the hole portion to the exposure light, and the insulating layer and the gate electrode are developed to remove the portion of the insulating layer and the portion of the gate electrode above the hole portion, whereby an opening portion having a greater diameter than the hole portion is formed through the insulating layer and the gate electrode above the hole portion, and the cathode electrode or the light-transmitting layer is exposed in the bottom portion of the opening portion.

The above constitution will be referred to as "manufacturing method-A of the present invention" for convenience.

The above "step in which an insulating layer made of a photosensitive material that transmits exposure light is formed" will be sometimes abbreviated as "step of forming an insulating layer made of an exposure-light-transmittable photosensitive material".

Further, the "step in which a gate electrode made of a photosensitive material is formed" will be sometimes abbreviated as "step of forming a gate electrode made of a photosensitive material".

Further, the above "step in which the reverse surface (second surface) of the supporting member is irradiated with exposure light with using said hole portion as an exposure mask, to expose a portion of the insulating layer and a portion of the gate electrode above the hole portion to the exposure light, and the insulating layer and the gate electrode are developed to remove the portion of the insulating layer and the portion of the gate electrode above the hole portion, whereby an opening portion having a greater diameter than the hole portion is formed through the insulating layer and the gate electrode above the hole portion, and the cathode electrode or the light-transmitting layer is exposed in the bottom portion of the opening portion" will be sometimes abbreviated as "step of forming an opening portion by exposure on the reverse-surface side".

In the method of manufacturing a cold cathode field emission device or the method of manufacturing a cold cathode field emission display according to the second or third aspect of the present invention, there may be also employed a constitution in which;

in said step (B), an insulating layer made of a non-photosensitive material that transmits exposure light is formed, in said step (C), a gate electrode made of a non-photosensitive material that transmits exposure light is formed, and in said step (D), an etching mask layer made of a resist material is formed on the gate electrode and the insulating layer, then, the reverse surface (second surface) of the supporting member is irradiated with exposure light with using said hole portion as an exposure mask, to expose the etching mask layer to the exposure light, then, the etching mask layer is developed to form an etching-mask-layer opening through a portion of the etching mask layer above the hole portion, then, the gate electrode and the insulating layer below the etching-mask-layer opening are etched with using the etching mask layer, and then etching mask layer is removed, whereby an opening portion having a larger diameter than the hole portion is formed through the insulating layer and the gate electrode above the hole portion, and the cathode electrode or the light-transmitting layer is exposed in the bottom portion of the opening portion.

The above constitution will be referred to as "manufacturing method-B of the present invention" for convenience.

The above "step in which an insulating layer made of a non-photosensitive material that transmits exposure light is formed" will be sometimes abbreviated as "step of forming an insulating layer made of a non-photosensitive material transmittable to exposure light".

Further, the above "step in which a gate electrode made of a non-photosensitive material that transmits exposure light is formed" will be sometimes abbreviated as "step of forming a gate electrode made of a non-photosensitive material".

Further, the above "step in which an etching mask layer made of a resist material is formed on the gate electrode and the insulating layer" will be sometimes abbreviated as "step of forming an etching mask layer made of a resist material on the gate electrode and the insulating layer".

Further, the above "step in which the reverse surface (second surface) of the supporting member is irradiated with exposure light with using said hole portion as an exposure mask, to expose the etching mask layer to the exposure light, and then, the etching mask layer is developed to form an etching-mask-layer opening through a portion of the etching mask layer above the hole portion" will be sometimes abbreviated as "step of forming an etching-mask-layer opening through an etching mask layer by exposure on the reverse-surface side".

In the method of manufacturing a cold cathode field emission device or the method of manufacturing a cold cathode field emission display according to the second or third aspect of the present invention, there may be also employed a constitution in which;

in said step (B), an insulating layer made of a photosensitive material is formed, in said step (C), a gate electrode made of a photosensitive material that transmits exposure light is formed, and in said step (D), the gate electrode and the insulating layer are irradiated with exposure light on the front-surface side (first-surface side) of the supporting member, and then the gate electrode and the insulating layer are developed, thereby to form an opening portion having a larger diameter than the hole portion through the gate electrode and the insulating layer above the hole portion and to expose the cathode electrode or the light-transmitting layer in the bottom portion of the opening portion.

The above constitution will be referred to as "manufacturing method-C of the present invention" for convenience.

The above "step in which an insulating layer made of a photosensitive material is formed" will be sometimes abbreviated as "step of forming an insulating layer made of a photosensitive material".

The above "step in which a gate electrode made of a photosensitive material that transmits exposure light" will be sometimes abbreviated as "step of forming a gate electrode made of a photosensitive material that transmits exposure light".

Further, the above "step in which the gate electrode and the insulating layer are irradiated with exposure light on the front-surface side (first-surface side) of the supporting member, and then the gate electrode and the insulating layer are developed, thereby to form an opening portion having a larger diameter than the hole portion through the gate electrode and the insulating layer above the hole portion and to expose the cathode electrode or the light-transmitting layer in the bottom portion of the opening portion" will be sometimes abbreviated as "step of forming an opening portion by exposure light on the front-surface side".

In the manufacturing method-A of the present invention, for forming the opening portion having a larger diameter than the hole portion through the insulating layer and the gate electrode above the hole portion in the "step of forming an opening portion by the exposure on the reverse-surface side", it is sufficient to employ a method of carrying out the exposure of the insulating layer and the gate electrode to exposure light to excess (i.e., method of carrying out over-exposure) and/or a method of carrying out the development of the insulating layer and the gate electrode to excess (i.e., method of carrying out over-development).

In the manufacturing method-B of the present invention, the gate electrode and the insulating layer below the etching-mask-layer opening are etched with using the etching mask layer, to form an opening portion having a larger diameter than the hole portion through the insulating layer and the gate electrode above the hole portion. The above opening portion can be formed by over-etching the insulating layer and the gate electrode. In the "step of forming an etching-mask-layer opening through an etching mask layer by exposure on the reverse-surface side" in the method of manufacturing a cold cathode field emission device or the method of manufacturing a cold cathode field emission display according to the manufacturing method-B of the present invention, there can be employed a method of carrying out the exposure of the insulating layer and the gate electrode to exposure light to excess (i.e., method of carrying out over-exposure) and/or a method of carrying out the development of the insulating layer and the gate electrode to excess (i.e., method of carrying out over-development).

In the manufacturing method-C of the present invention, for forming the opening portion having a larger diameter than the hole portion in the "step of forming an opening portion by exposure light on the front-surface side", it is sufficient to expose the etching mask layer to exposure light with using a proper exposure light shielding material (mask).

In the manufacturing method of the present invention, it is preferred to carry out a kind of activation treatment (cleaning treatment) of the surface of the electron emitting portion after the resist-material layer is removed, from the viewpoint of a further improvement in the efficiency of electron emission from the electron emitting portion. The above treatment includes plasma treatment in an atmosphere containing hydrogen gas, ammonia gas, helium gas, argon gas, neon gas, methane gas, ethylene gas, acetylene gas, nitrogen gas or the like.

In the manufacturing method of the present invention, the hole portion or the opening portion may have any plan form (form obtained by cutting the hole portion or the opening portion with an imaginary plane in parallel with the surface of the supporting member) such as a circle, an oval, a rectangle, a polygon, a roundish rectangle or a roundish polygon.

On the basis of the method of patterning a thick-film-paste-material layer according to the first or second aspect of the present invention, for example, various electrodes in a cold cathode field emission display (FED), a plasma display and an electroluminescence display can be formed.

In the method of patterning a thick-film-paste-material layer according to the first or second aspect of the present invention, examples of the substratum include an insulating substrate such as a glass substrate, an insulating layer formed on or above a substrate, an electrically conductive layer (for example, wiring layer) formed on or above a substrate, and a combination of an insulating layer and an electrically conductive layer (for example, wiring layer) formed on or above a substrate.

In the method of patterning a thick-film-paste-material layer according to the first aspect of the present invention, the thick-film-paste-material layer contains, for example, electrically conductive particles made of silver (Ag), copper (Cu), palladium (Pd), nickel (Ni), gold (Au), platinum (Pt), aluminum (Al) or chromium (Cr); electrically conductive particles made of an alloy containing any one of these metals; ruthenium oxide particles; pyrochlore-type ruthenium salt particles; or, molybdenum oxide particles.

In the method of patterning a thick-film-paste-material layer according to the second aspect of the present invention, when the exposure is carried out on the front-surface side of the substratum, the photosensitive thick-film-paste-material layer may be composed of a so-called negative-type resin (resin having properties that it undergoes polymerization or cross-linking under irradiation with exposure light to become insoluble or sparingly soluble in a developer solution and remains after development), or it may be composed of a so-called positive-type resin (resin having properties that it is decomposed under irradiation with exposure light to become soluble in a developer solution and is removed during development). When the exposure is carried out on the reverse-surface side of the substratum, it is required to form the photosensitive thick-film-paste-material layer from a so-called negative-type resin (resin having properties that it undergoes polymerization or cross-linking under irradiation with exposure light to become insoluble or sparingly soluble in a developer solution and remains after development). The thick-film-paste-material layer contains, for example, electrically conductive particles made of silver (Ag), copper (Cu), palladium (Pd), nickel (Ni), gold (Au), platinum (Pt), aluminum (Al) or chromium (Cr); electrically conductive particles made of an alloy containing any one of these metals; ruthenium oxide particles; pyrochlore-type ruthenium salt particles; or, molybdenum oxide particles.

In the manufacturing method of the present invention, the photosensitive thick-film-paste-material layer can be formed from a so-called negative-type resin (resin having properties that it undergoes polymerization or cross-linking under irradiation with exposure light to become insoluble or sparingly soluble in a developer solution and remains after development) and a material having the function of emitting electrons.

In the manufacturing method of the present invention, the material which has the function of emitting electrons and is included in the thick-film-paste-material layer, may include a carbon-nanotube structure. In this case, specifically, the carbon-nanotube structure includes a carbon-nanotube and a carbon-nanofiber. More specifically, the electron-emitting portion may be constituted of carbon-nanotubes, it may be constituted of carbon-nanofibers, or it may be constituted of a mixture of carbon-nanotubes with carbon-nanofibers. Macroscopically, the carbon-nanotube and carbon-nanofiber may have the form of a powder or a thin film. The carbon-nanotube structure constituted of the carbon-nanotube and carbon-nanofiber can be produced or formed by a known PVD method as an arc discharge method and a laser abrasion method; and any one of various CVD methods such as a plasma CVD method, a laser CVD method, a thermal CVD method, a gaseous phase synthetic method and a gaseous phase growth method.

Alternatively, in the manufacturing method of the present invention, preferably, the material which has the function of emitting electrons and is included in the thick-film-paste-material layer, is made of a material having a smaller work function $\Phi$ than a material for constituting a cathode electrode. The material can be selected on the basis of the work function of a material for constituting a cathode electrode, a potential difference between the gate electrode and the cathode electrode, a required current density of emitted electrons, and the like. Specifically, the work function is preferably equal to, or smaller than, 3 eV, more preferably, equal to, or smaller than, 2 eV. Examples of such a material include carbon ($\Phi<1$ eV), cesium ($\Phi=2.14$ eV), $LaB_6$ ($\Phi=2.66$-$2.76$ eV), BaO ($\Phi=1.6$-$2.7$ eV), SrO ($\Phi=1.25$-$1.6$ eV), $Y_2O_3$ ($\Phi=2.0$ eV), CaO ($\Phi=1.6$-$1.86$ eV), BaS ($\Phi=2.05$ eV), TiN ($\Phi=2.92$ eV) and ZrN ($\Phi=2.92$ eV).

Alternatively, in the manufacturing method of the present invention, preferably, the material which has the function of emitting electrons and is included in the thick-film-paste-material layer, can be selected from materials having a secondary electron gain 6 greater than the secondary electron gain 5 of the electrically conductive material for constituting a cathode electrode. That is, the above material can be properly selected from metals such as silver (Ag), aluminum (Al), gold (Au), cobalt (Co), copper (Cu), molybdenum (Mo), niobium (Nb), nickel (Ni), platinum (Pt), tantalum (Ta), tungsten (W) and zirconium (Zr); semiconductors such as silicon (Si) and germanium (Ge); inorganic simple substances such as carbon and diamond; and compounds such as aluminum oxide ($Al_2O_3$), barium oxide (BaO), beryllium oxide (BeO), calcium oxide (CaO), magnesium oxide (MgO), tin oxide ($SnO_2$), barium fluoride ($BaF_2$) and calcium fluoride ($CaF_2$). The material for constituting an electron-emitting portion is not necessarily required to have electric conductivity.

The supporting member includes a glass substrate, a glass substrate having an insulating film formed on its surface, a quartz substrate, a quartz substrate having an insulating film formed on its surface and a semiconductor substrate having an insulating film formed on its surface. From the viewpoint that the production cost is decreased, it is preferred to use a glass substrate or a glass substrate having an insulating film formed on its surface. Examples of the glass substrate include high-distortion glass, soda glass ($Na_2O \cdot CaO \cdot SiO_2$), borosilicate glass ($Na_2O \cdot B_2O_3 \cdot SiO_2$), forsterite ($2MgO \cdot SiO_2$) and lead glass ($Na_2O \cdot PbO \cdot SiO_2$). The substrate for constituting the anode panel can have the same constitution as that of the above supporting member.

The resist material for constituting the resist-material layer can be selected from known resist materials, and it may be a positive-type material (material that is decomposed under irradiation with exposure light to become soluble in a developer solution and is removed during development) or may be a negative-type material (material that undergoes polymerization or cross-linking under irradiation with exposure light to become insoluble or sparingly soluble in a developer solution and remains after development). In the method of manufacturing a cold cathode field emission device or the method of manufacturing a cold cathode field emission display according to the second or third aspect of the present invention, the resist-material layer covering the side wall of the opening portion, the gate electrode and the insulating layer is formed and the cathode electrode is exposed in the central portion of the bottom portion of the opening portion in the step (E). For obtaining the above structure, it is required to carry out the exposure and development of the resist-material layer, and the exposure of the resist-material layer can be carried out on the front-surface side (first-surface side) of the supporting member or can be carried out on the reverse-surface side (second-surface side) of the supporting member. In the former case, a positive-type or negative-type resist material can be used as a resist-material layer. In the latter case, a positive-type resist material can be used. In the latter case, further, the exposure of the resist-material layer can be carried out with using the hole portion as an exposure mask. That is, the resist-material layer covering the side wall of the opening portion, the gate electrode and the insulating layer can be formed in a self-alignment manner with regard to the hole portion. The resist-material layer can be removed with any chemical that can reliably remove the resist-material layer and which does not cause the thick-film-paste-material layer to alter, and for example, an organic solvent such as acetone may be used as a peel-off liquid.

The combination of the resist-material layer, the thick-film-paste-material layer and the peel-off liquid is generally required to be a combination of a resist-material layer that disappears under the influence of a solvent contained in a thick-film-paste-material layer after the thick-film-paste-material layer is dried so long as no modified layer is formed in the surface of the resist-material layer, and such a thick-film-paste-material layer, and further, a combination with a peel-off liquid that can reliably peel the resist-material layer and causes no adverse effect on the thick-film-paste-material layer.

In the method of patterning a thick-film-paste-material layer according to the second aspect of the present invention or the manufacturing method of the present invention, the light source for the exposure light for the exposure of the photosensitive thick-film-paste-material layer is preferably an ultraviolet ray light source, and specific examples thereof include a low-pressure mercury lamp, a high-pressure mercury lamp, a halogen lamp, an ArF excimer laser and a KrF excimer laser.

In the manufacturing method of the present invention, the material for constituting the cathode electrode includes various electrically conductive paste such as silver paste and copper paste; metals such as tungsten (W), niobium (Nb), tantalum (Ta), titanium (Ti), molybdenum (Mo), chromium (Cr), aluminum (Al), copper (Cu), gold (Au), silver (Ag), nickel (Ni), iron (Fe) and zirconium (Zr); and alloys or compounds containing these metal elements (for example, nitrides such as TiN and silicides such as $WSi_2$, $MoSi_2$, $TiSi_2$ and $TaSi_2$).

The photosensitive material for constituting the gate electrode includes silver paste, nickel paste and gold paste. Further, the non-photosensitive material for constituting the gate electrode, which material transmits exposure light, includes ITO, tin oxide, zinc oxide and titanium oxide. Further, the photosensitive material for constituting the gate electrode, which material transmits exposure light, includes silver paste, nickel paste and gold paste. The above silver paste, nickel paste and gold paste transmits exposure light at the stage of the exposure (i.e., before firing). The general material for constituting the gate electrode, which material is free of any limitation as a material, includes those materials described as materials for the above cathode electrode.

The cathode electrode and the gate electrode are preferably in the form of a stripe. From the viewpoint of structural simplification of the cold cathode field emission display, preferably, the projection image of the stripe-shaped cathode electrode extending in the first direction and the projection image of the stripe-shaped gate electrode extending in the second direction cross each other at right angles.

Examples of the methods of forming the cathode electrode and the gate electrode include vapor deposition methods such as an electron beam vapor deposition method and a hot filament vapor deposition method; a combination of a sputtering method, a CVD method or an ion plating method with an etching method; a screen printing method; a plating method; and a lift-off method. From the viewpoint of decreasing a manufacturing cost, it is the most preferred to employ a screen printing method. When a screen printing method or a plating method is employed, a cathode electrode or a gate electrode, for example, in the form of a stripe can be directly formed.

Examples of the conductive material for constituting the light-transmitting layer include indium-tin oxide (ITO) and tin oxide ($SnO_2$). The conductive material preferably has a resistance value of $1 \times 10^{-2}$ Ω or less. Further, examples of the resistive material for constituting the light-transmitting layer include amorphous silicon, silicon carbide (SiC), SiCN, SiN doped with phosphorus (P), SiN doped with arsenic (As), SiN doped with boron (B), ruthenium oxide ($RuO_2$), tantalum oxide and tantalum nitride. The resistance value of the resistive material is generally $1 \times 10^5$ to $1 \times 10^7$ Ω, preferably several MΩ. The method of forming the light-transmitting layer includes a sputtering method, a CVD method and a screen printing method. In view of decreasing a manufacturing cost, it is preferred to employ a screen printing method. It is sufficient that the light-transmitting layer should be formed at least in the hole portion, it may be formed such that it extends from the hole portion onto the surface of the cathode electrode in the vicinity of the hole portion, it may be formed on the entire cathode electrode, or it may be formed so as to extend up to the supporting member beyond the cathode electrode so long as no short circuit between the adjacent cathode electrodes is formed. In some embodiments of the light-transmitting layer formed, the light-transmitting layer and the cathode electrode are exposed in the bottom portion of the opening portion. When it is difficult to decrease the resistance in the conductive material constituting the light-transmitting layer, a bus line (bus electrode) may be formed from a material such as silver paste so that the bus line is in contact with a side of the light-transmitting layer.

The insulating layer made of a photosensitive material that transmits exposure light can be formed from a so-called positive-type resin (resin having properties that it is decomposed under irradiation with exposure light to become soluble in a developer solution and is removed during development) and a material that works as an insulating layer. The insulating layer made of a photosensitive material may be formed from a so-called positive-type resin and a material that works as an insulating layer, or it may be formed from a so-called negative-type resin (resin having properties that it undergoes polymerization or cross-linking under irradiation with exposure light to be come insoluble or sparingly soluble in a developer solution and remains after development) and a material that works as an insulating layer. The insulating layer made of a non-photosensitive material that transmits exposure light can be formed from a material that transmits exposure light and works as an insulating layer. The material that works as an insulating layer includes an $SiO_2$-containing material, glass paste, polyimide resin, SiN, SiON, $CF_x$ and $SiOF_x$. The general material that is free of any limitation as a material and constitutes a general insulating layer includes $SiO_2$, BPSG, PSG, BSG, AsSG, PbSG, SiN, SiON, SOG (spin on glass), $SiO_2$-containing materials such as a low-melting-point glass and glass paste, SiN and insulating resins such as polyimide, and these materials may be used solely or in combination as required. The method of forming the insulating layer can be selected from known processes such as a CVD method, an application method, a sputtering method and a screen printing method. It is preferred to employ a screen printing method from the viewpoint of decreasing a manufacturing cost.

After the step (D) in the method of patterning a thick-film-paste-material layer according to the first aspect of the present invention, after the step (E) in the method of patterning a thick-film-paste-material layer according to the second aspect of the present invention, or after the formation of the electron emitting portion on the cathode electrode, on the region extending from the cathode electrode to the hole portion or on the light-transmitting layer in the manufacturing method of the present invention, it is sometimes required to fire or cure the material for constituting the thick-film-paste-material layer although it depends upon the material for constituting the thick-film-paste-material layer. The upper limit of the temperature for the firing or curing can be determined to be a temperature at which the substratum, the field emission device or components for the cathode panel is not thermally damaged.

In the manufacturing method-B of the present invention, the resist material for constituting the etching mask layer can be selected from known resist materials. Since, however, the etching mask layer is exposed by a reverse-surface exposure method, the resist material is required to be a positive-type material (resist material that is decomposed under irradiation with exposure light to become soluble in a developer solution and is removed during development).

In the method of manufacturing a cold cathode field emission device or the method of manufacturing a cold cathode field emission display according to any one of the first to third aspects of the present invention, the photosensitive thick-film-paste-material layer is formed at least in the opening portion, and it may be formed in the opening portion, on the gate electrode and on the insulating layer. The thick-film-paste-material layer can be formed, for example, by a screen printing method or a spin coating method. Alternatively, the thick-film-paste-material layer may be formed in the opening portion and on the gate electrode, it may be formed on a region where the gate electrode and the cathode electrode overlap, or it may be formed on portions of the gate electrode and the insulating layer which portions correspond to a region above the cathode electrode. In these cases, the thick-film-paste-material layer can be formed, for example, by a screen printing method.

In the method of manufacturing a cold cathode field emission device or the method of manufacturing a cold cathode field emission display according to any one of the fourth to ninth aspects of the present invention, the photosensitive thick-film-paste-material layer is formed on the entire surface. The formation of the above thick-film-paste-material layer includes an embodiment in which the thick-film-paste-material layer is formed on an exposed portion of the cathode electrode and a portion of the resist-material layer which portion is positioned above the cathode electrode, and an embodiment in which the thick-film-pastematerial layer is formed on an exposed portion of the cathode electrode and a portion of the resist-material layer which portion is positioned above a portion of the cathode electrode which portion is in the vicinity of the exposed portion of the cathode electrode. These embodiments can be accomplished by forming the thick-film-paste-material layer by a screen printing method. When the photosensitive thick-film-paste-material layer is formed on the entire surface, the thick-film-paste-material layer can be formed, for example, by a screen printing method or a spin coating method. In the method of patterning a thick-film-paste-material layer according to the first or second aspect of the present invention, the thick-film-paste-material layer can be formed, for example, by a screen printing method or a spin coating method.

In the manufacturing method of the present invention, when the reverse surface (second surface) of the supporting member is irradiated with exposure light with using the hole portion as an exposure mask to expose a portion of the insulating layer and a portion of the gate electrode which portions are above the hole portion, or to expose the etching mask layer, preferably, an exposure light shielding material (mask) is provided on the reverse-surface side (second-surface side) of the supporting member so that a portion of the insulating layer and a portion of the gate electrode or a portion of the etching mask layer which portions or portion are/is not to be irradiated with exposure light.

The material for the anode electrode can be selected depending upon the constitution of the display. When the display is a transmission-type (the anode panel corresponds to a display portion) and when the anode electrode and the phosphor layer are stacked on the substrate, constituting the anode panel, in this order, not only the substrate but also the anode electrode itself are required to be transparent, and a transparent electrically conductive material such as ITO (indium-tin oxide) is used. When the display is a reflection-type (the cathode panel corresponds to a display portion), or when the display is a transmission-type but when the phosphor layer and the anode electrode are stacked on the substrate in this order, not only ITO can be used, but also the material can be selected from those materials can be selected from aluminum (Al) or chromium (Cr). When the anode electrode is constituted of aluminum (Al) or chromium (Cr), the specific thickness of the anode electrode is $3 \times 10^{-8}$ m (30 nm) to $1.5 \times 10^{-7}$ m (150 nm), preferably $5 \times 10^{-8}$ m (50 nm) to $1 \times 10^{-7}$ m (100 nm). The anode electrode can be formed by a vapor deposition method or a sputtering method.

Further, the anode panel is preferably provided with a plurality of separation walls for preventing the occurrence of a so-called optical crosstalk (color mixing) that is caused when electrons recoiling from the phosphor layer or secondary electrons emitted from the phosphor layer enter another phosphor layer, or for preventing the collision of electrons with other phosphor layer when electrons recoiling from the phosphor layer or secondary electrons emitted from the phosphor layer enter other phosphor layer over the separation wall.

The form of the separation walls includes the form of a lattice (grilles), that is, a form in which the separation wall surrounds the phosphor layer corresponding to one pixel and having a plan form of a nearly rectangle (or dot-shaped), and a stripe or band-like form that extends in parallel with opposite two sides of a rectangular or stripe-shaped phosphor layer. When the separation wall(s) has(have) the form of a lattice, the separation wall may have a form in which the separation wall continuously or discontinuously surrounds four sides of one phosphor layer. When the separation wall(s) has(have) the form of a stripe, the stripe may be continuous or discontinuous. The formed separation walls may be polished to flatten the top surface of each separation wall.

For improving the contrast of display images, preferably, a black matrix that absorbs light from the phosphor layer is formed between one phosphor layer and another adjacent phosphor layer and between the separation wall and the substrate. As a material for constituting the black matrix, it is preferred to select a material that absorbs at least 99% of light from the phosphor layer. The above material includes carbon, a thin metal film (made, for example, of chromium, nickel, aluminum, molybdenum and an alloy of these), a metal oxide (for example, chromium oxide), metal nitride (for example, chromium nitride), a heat-resistant organic resin, glass paste, and glass paste containing a black pigment or electrically conductive particles of silver or the like. Specific examples thereof include a photosensitive polyimide resin, chromium oxide, and a chromium oxide/chromium stacked film. Concerning the chromium oxide/chromium stacked film, the chromium film is to be in contact with the substrate.

When the cathode panel and the anode panel are bonded in their circumferential portions, the bonding may be carried out with an adhesive layer or with a frame made of an insulating rigid material such as glass or ceramic and an adhesive layer. When the frame and the adhesive layer are used in combination, the facing distance between the cathode panel and the anode panel can be adjusted to be longer by properly determining the height of the frame than that obtained when the adhesive layer alone is used. While a frit glass is generally used as a material for the adhesive layer, a so-called low-melting-point metal material having a melting point of approximately 120 to 400° C. may be used. The low-melting-point metal material includes In (indium; melting point 157° C.); an indium-gold low-melting-point alloy; tin (Sn)-containing high-temperature solders such as $Sn_{80}Ag_{20}$ (melting point 220 to 370° C.) and $Sn_{95}Cu_5$ (melting point 227 to 370° C.); lead (Pb)-containing high-temperature solders such as $Pb_{97.5}Ag_{2.5}$ (melting point 304° C.), $Pb_{94.5}Ag_{5.5}$ (melting point 304-365° C.) and $Pb_{97.5}Ag_{1.5}Sn_{1.0}$ (melting point 309° C.); zinc (Zn)-containing high-temperature solders such as $Zn_{95}Al_5$ (melting point 380° C.); tin-lead-containing standard solders such as $Sn_5Pb_{9.5}$ (melting point 300-314° C.) and $Sn_2Pb_{98}$ (melting point 316-322° C.); and brazing materials such as $Au_{88}Ga_{12}$ (melting point 381° C.) (all of the above parenthesized values show atomic %).

When three members of the substrate, the supporting member and the frame are bonded, these three members may be bonded at the same time, or one of the substrate and the supporting member may be bonded to the frame at a first stage, and then the other of the substrate and the supporting member may be bonded to the frame at a second stage. When bonding of the three members or bonding at the second stage is carried out in a high-vacuum atmosphere, a space surrounded by the substrate, the supporting member, the frame and the adhesive layer comes to be a vacuum space upon bonding. Otherwise, after the three members are bonded, the space surrounded by the substrate, the supporting member, the frame and the adhesive layer may be vacuumed to obtain a vacuum space. When the vacuuming is carried out after the bonding, the pressure in an atmosphere during the bonding may be any one of atmospheric pressure and reduced pressure, and the gas constituting the atmosphere may be ambient atmosphere or an inert gas containing nitrogen gas or a gas (for example, Ar gas) coming under the group O of the periodic table.

When the vacuuming is carried out after the bonding, the vacuuming can be carried out through a tip tube pre-connected to the substrate and/or the supporting member. Typically, the tip tube is made of a glass tube and is bonded to a circumference of a through-hole formed in an ineffective field of the substrate and/or the supporting member (i.e., a field other than the effective field which works as a display portion) with a frit glass or the above low-melting-point metal material. After the space reaches a predetermined vacuum degree, the tip tube is sealed by thermal fusion. It is preferred to heat and then temperature-decrease the cold cathode field emission display as a whole before the sealing, since residual gas can be released into the space, and the residual gas can be removed out of the space by vacuuming.

In the present invention, the surface of the resist-material layer is modified, and then the thick-film-paste-material layer is formed thereon, so that there can be reliably avoided the problem that the resist-material layer is dissolved by the thick-film-paste-material layer.

BRIEF DESCRIPTION OF DRAWINGS

FIG. 3 is a schematic partial end view of a three-electrode-type cold cathode field emission display having a cold cathode field emission device in Example 3.

FIG. 4C, are schematic partial end views of the supporting member, etc., for explaining the method of manufacturing a cold cathode field emission device in Example 3.

FIG. 5B, are schematic partial end views of the supporting member, etc., for explaining the method of manufacturing a cold cathode field emission device in Example 3.

FIGS. 7A to 7C are schematic partial end views of a supporting member, etc., for explaining a method of manufacturing a cold cathode field emission device in Example 4.

FIG. 7C, are schematic partial end views of the supporting member, etc., for explaining the method of manufacturing a cold cathode field emission device in Example 4.

FIG. 8B, are schematic partial end views of the supporting member, etc., for explaining the method of manufacturing a cold cathode field emission device in Example 4.

FIG. 9B, are schematic partial end views of the supporting member, etc., for explaining the method of manufacturing a cold cathode field emission device in Example 4.

FIG. 10B, are schematic partial end views of the supporting member, etc., for explaining the method of manufacturing a cold cathode field emission device in Example 4.

FIGS. 12A and 12B are schematic partial end views of a supporting member, etc., for explaining a method of manufacturing a cold cathode field emission device in Example 5.

FIG. 12B, are schematic partial end views of the supporting member, etc., for explaining the method of manufacturing a cold cathode field emission device in Example 5.

FIGS. 14A and 14B are schematic partial end views of a supporting member, etc., for explaining a method of manufacturing a cold cathode field emission device in Example 6.

FIG. 14B, is a schematic partial end view of the supporting member, etc., for explaining the method of manufacturing a cold cathode field emission device in Example 6.

FIGS. 16A to 16C are schematic partial end views of a supporting member, etc., for explaining a method of manufacturing a cold cathode field emission device in Example 7.

FIG. 16C, are schematic partial end views of the supporting member, etc., for explaining the method of manufacturing a cold cathode field emission device in Example 7.

FIG. 17C, are schematic partial end views of the supporting member, etc., for explaining the method of manufacturing a cold cathode field emission device in Example 7.

FIG. 18B, are schematic partial end views of the supporting member, etc., for explaining the method of manufacturing a cold cathode field emission device in Example 7.

FIG. 20B, are schematic partial end views of the supporting member, etc., for explaining the method of manufacturing a cold cathode field emission device in Example 8.

FIGS. 22A and 22B are schematic partial end views of a supporting member, etc., for explaining a method of manufacturing a cold cathode field emission device in Example 9.

FIG. 22B, are schematic partial end views of the supporting member, etc., for explaining the method of manufacturing a cold cathode field emission device in Example 9.

FIG. 24 is a schematic partial end view of a two-electrode-type cold cathode field emission display having a cold cathode field emission device of Example 10.

FIG. 25D, are schematic partial end views of the supporting member, etc., for explaining a method of manufacturing a cold cathode field emission device in Example 11.

FIG. 27C, are schematic partial end views of the supporting member, etc., for explaining the method of manufacturing a cold cathode field emission device in Example 12.

FIG. 28B, are schematic partial end views of the supporting member, etc., for explaining a method of manufacturing a cold cathode field emission device in Example 13.

FIG. 30B, are schematic partial end views of the supporting member, etc., for explaining the method of manufacturing a cold cathode field emission device in Example 14.

FIG. 31C, are schematic partial end views of the supporting member, etc., for explaining a method of manufacturing a cold cathode field emission device in Example 15.

FIG. 34 is a schematic partial perspective view of a cathode panel and an anode panel of a cold cathode field emission display when the cold cathode field emission display is exploded.

FIG. 35B, are schematic partial end views of the supporting member, etc., for explaining the method of manufacturing a Spindt-type cold cathode field emission device.

BEST MODE FOR CARRYING OUT THE INVENTION

The present invention will be explained on the basis of Examples and with reference to drawings.

EXAMPLE 1

Example 1 concerns the method of patterning a thick-film-paste-material layer according to the first aspect of the present invention. Specifically, an electrically conductive layer (more specifically, a wiring) is formed on a substratum made of a glass substrate. The method of patterning a thick-film-paste-material layer in Example 1 will be explained hereinafter with reference to FIGS. 1A to 1D.

[Step-100]

First, a resist-material layer 2 made of a positive-type resist material (THMR-iP5720HP, supplied by Tokyo Ouka Kogyo Kabushiki Kaisha) produced from a novolak resin and 2-heptanone is formed on the front surface of a substratum 1 made of a glass substrate by a known method. Then, the resist-material layer 2 is patterned by a lithography technique, to obtain the resist-material layer 2 in a state where part of the front surface of the substratum 1 is exposed (see FIG. 1A).

[Step-110]

Then, the surface of the resist-material layer 2 is modified to form a modified layer 3 in the surface of the resist-material layer 2. Specifically, the surface of the resist-material layer is modified by plasma treatment in a fluorine-containing gas atmosphere (see a condition in Table 1 below). Alternatively, the surface of the resist-material layer may be modified by ion implantation with fluorine ion shown in Table 2 below. Alternatively, the surface of the resist-material layer may be modified by ion implantation with silicon ion shown in Table 3 below.

TABLE 1

| | |
|---|---|
| Gas used | $CF_4$ = 300 sccm |
| Pressure | $1.3 \times 10^2$ Pa |
| RF power | 700 W |
| Treatment time period | 10 seconds |

TABLE 2

| | |
|---|---|
| Ion species | F |
| Acceleration energy | 20 keV |
| Dosage | $1 \times 10^{15}$ cm$^{-2}$ |

TABLE 3

| | |
|---|---|
| Ion species | Si |
| Acceleration energy | 25 keV |
| Dosage | $1 \times 10^{14}$ cm$^{-2}$ |

[Step-120]

Then, a thick-film-paste-material layer 4 is formed on the entire surface. Specifically, silver paste containing a solvent, a photopolymerization initiator, a polymerization initiator and a plasticizer is printed on the entire surface by a screen printing method (see FIG. 1C). Then, the thick-film-paste-material layer 4 is dried at 80° C. for 20 minutes to remove the solvent in the thick-film-paste-material layer 4.

[Step-130]

Figure 1A:
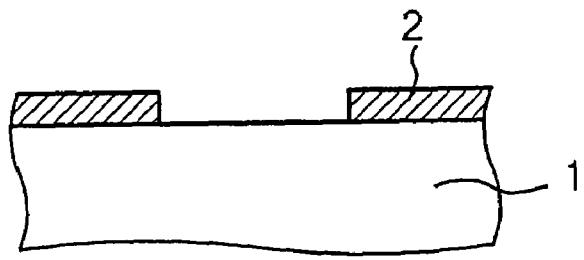
FIGS. 1A to 1D are schematic partial end views of a substratum, etc., for explaining a method of patterning a thick-film-paste-material layer in Example 1.
Figure 1B:
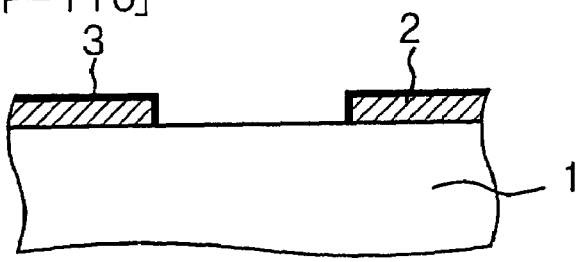
Figure 1C:
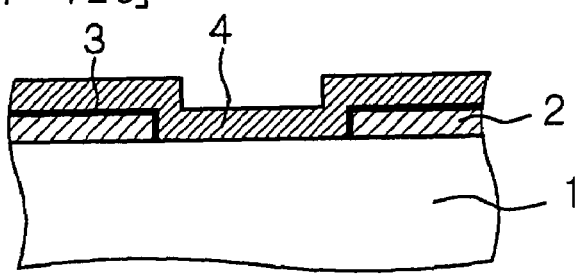
Figure 1D:
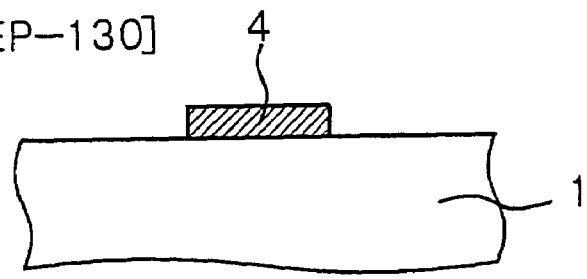

Then, the resist-material layer 2 is removed with acetone, to remove the thick-film-paste-material layer 4 on the resist-material layer 2 and leave the thick-film-paste-material layer 4 on that front surface of the substratum 1 which has not been covered with the resist-material layer 2 (see FIG. 1D).

[Step-140]

Then, the thick-film-paste-material layer 4 is fired at 500° C. for 20 minutes.

In the above manner, for example, a bus electrode and an address electrode in a plasma display (PDP), various electrodes in an electroluminescence display, and a cathode electrode and a gate electrode in a cold cathode field emission display (FED) can be formed.

When [Step-110] was omitted for comparison, the resist-material layer 2 disappeared upon completion of [Step-120], and it was impossible to pattern the thick-film-paste-material layer 4.

EXAMPLE 2

Example 2 concerns the method of patterning a thick-film-paste-material layer according to the second aspect of the present invention. Specifically, an electrically conductive layer (more specifically, a wiring) is formed on a substratum made of a glass substrate. The method of patterning a thick-film-paste-material layer in Example 2 will be explained below with reference to FIGS. 2A to 2D.

[Step-200]

In the same manner as in [Step-100] in Example 1, a resist-material layer 2 is formed on the front surface of a substratum 1 made of a glass substrate, and then the resist-material layer 2 is patterned to obtain the resist-material layer 2 in a state where part of the front surface of the substratum 1 is exposed.

[Step-210]

In the same manner as in [Step-110] in Example 1, then, the surface of the resist-material layer 2 is modified to form a modified layer 3.

[Step-220]

Then, a photosensitive thick-film-paste-material layer 4A is formed on the entire surface. Specifically, silver paste containing a solvent, a photopolymerization initiator, a polymerization initiator and plasticizer and containing an acrylic resin and an acryl monomer as a resin and silver particles as electrically conductive particles is printed on the entire surface by a screen printing method (see FIG. 2A). Then, the thick-film-paste-material layer 4A is dried at 80° C. for 20 minutes, to remove the solvent in the thick-film-paste-material layer 4A.

[Step-230]

Figure 2A:
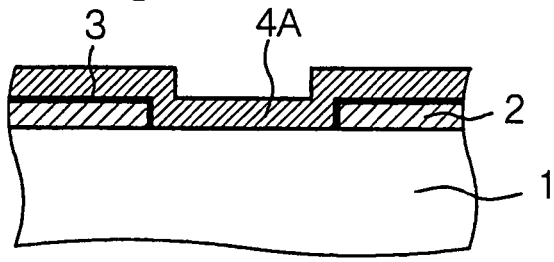
FIGS. 2A to 2D are schematic partial end views of a substratum, etc., for explaining a method of patterning a thick-film-paste-material layer in Example 2.
Figure 2B:
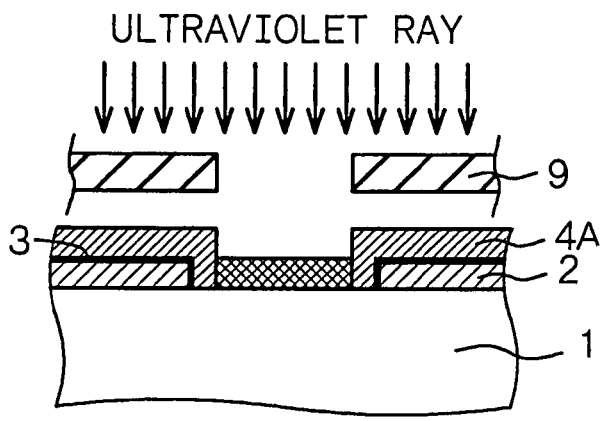
Figure 2C:
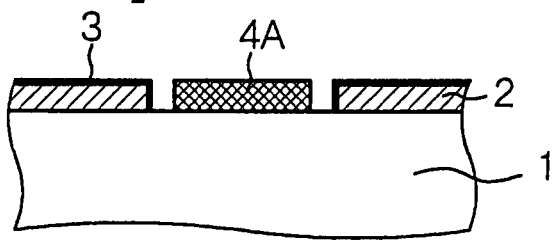

Then, the thick-film-paste-material layer 4A is irradiated with exposure light on the front-surface side (first-surface side) of the substratum (see FIG. 2B), followed by development and drying to remove an unexposed resist-material layer 2, thereby to selectively leave the thick-film-paste-material layer 4A on that front surface of the substratum 1 which is not covered with the resist-material layer 2 (see FIG. 2C). Reference numeral 9 represents an exposure light shielding material (mask). The condition for the above drying of the thick-film-paste-material layer 4A is 80° C. and 20 minutes, to remove the solvent in the thick-film-paste-material layer 4A.

[Step-240]

Figure 2D:
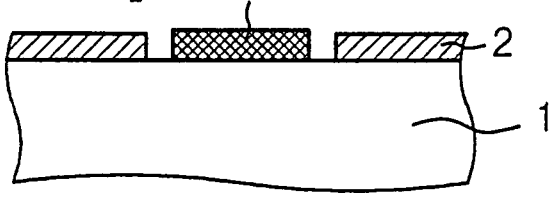

Then, ashing treatment shown in the following Table 4 is carried out to remove the modified layer 3 in the surface of the resist-material layer which modified layer is formed in [Step-210] (see FIG. 2D). While the above ashing treatment is carried out with a high-density plasma ashing apparatus, the ashing treatment may be carried out with an apparatus having a plasma mode or an RIE (reactive ion etching) apparatus.

TABLE 4

| Gas used | $O_2$ = 100 sccm |
| --- | --- |
| Pressure | 1.3 Pa |
| RF power (antenna) | 1 kW |
| Bias RF power | 50 W |
| Treatment time period | 10 seconds |
| Treatment stage temperature | 20° C. |

[Step-250]

Then, the resist-material layer 2 is removed with acetone, whereby a structure similar to the structure shown in FIG. 1D can be obtained. Since the modified layer 3 in the surface of the resist-material layer is removed in [Step-240], the resist-material layer 2 can be reliably removed.

[Step-260]

Then, the thick-film-paste-material layer 4A is fired in the same manner as in [Step-140] of Example 1.

In the above manner, for example, a bus electrode and an address electrode in a plasma display (PDP), various electrodes in an electroluminescence display, and a cathode electrode in a cold cathode field emission display (FED) can be formed.

When [Step-210] was omitted for comparison, the resist-material layer 2 disappeared upon completion of [Step-220], and it was impossible to pattern the thick-film-paste-material layer 4A. Further, when [Step-240] was omitted, the resist-material layer 2 remained as a residue during the peeling of the resist-material layer 2. When the thick-film-paste-material layer 4A was fired in [Step-260], the resist-material layer 2 was carbonized and remained. Further, when supersonic irradiation was employed in combination during the peeling of the resist-material layer 2 so that the resist-material layer 2 did not remain as a residue, the thick-film-paste-material layer 4A before the firing was peeled off from the substratum.

EXAMPLE 3

Example 3 concerns the method of manufacturing a cold cathode field emission device (to be abbreviated as "field emission device" hereinafter) and the method of manufacturing a cold cathode field emission display (to be abbreviated as "display" hereinafter) according to the first aspect of the present invention.

Figure 6A:
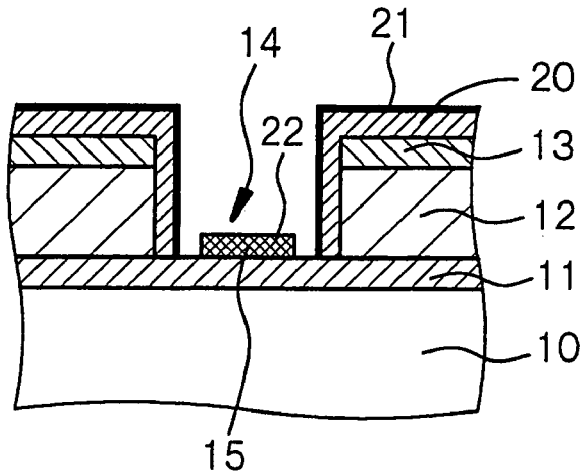
FIGS. 6A to 6C, following
Figure 6B:
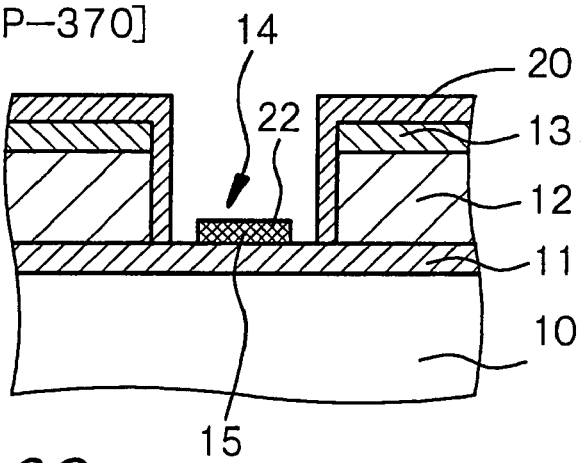
Figure 6C:
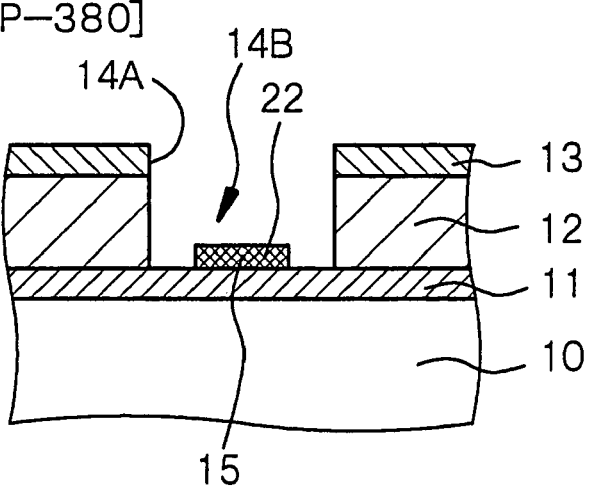

FIG. 3 shows a schematic partial end view of the display in Example 3, and FIG. 6C shows a schematic partial end view of the field emission device. A schematic partial perspective view obtained when a cathode panel CP and an anode panel AP are exploded is substantially as shown in FIG. 34.

The field emission device in Example 3 comprises;

(a) a stripe-shaped cathode electrode 11 being formed on a supporting member 10 and extending in a first direction, (b) an insulating layer 12 formed on the supporting member 10 and the cathode electrode 11, (c) a gate electrode 13 being formed on the insulating layer 12 and extending in a second direction different from the first direction, (d) an opening portion 14 formed through the gate electrode 13 and the insulating layer 12 (a first opening portion 14A formed through the gate electrode 13 and a second opening portion 14B formed through the insulating layer 12), and (e) an electron emitting portion 15, wherein electrons are emitted from the electron emitting portion 15 exposed in the bottom portion of the opening portion 14.

The projection image of the stripe-shaped cathode electrode 11 and the projection image of the stripe-shaped gate electrode 13 cross each other at right angles.

The display of Example 3 comprises the cathode panel CP and the anode panel AP and has a plurality of pixels. The cathode panel CP has an effective field where a large number of the electron emitting regions in each of which the field emission devices are formed are arranged in the form of a two-dimensional matrix. The anode panel AP comprises a substrate 30, a phosphor layer 31 (a red luminescence phosphor layer 31R, a green luminescence phosphor layer 31G and a blue luminescence phosphor layer 31B) formed on the substrate 30 and formed in a predetermined pattern, and an anode electrode 33 composed, for example, of one sheet-shaped aluminum thin film covering the entire surface of the effective field. A black matrix 32 is formed on the substrate 30 between one phosphor layer 31 and another phosphor layer 31. The black matrix 32 may be omitted. When it is intended to produce a monochrome display, the phosphor layer 31 is not required to be in a predetermined pattern. Further, an anode electrode composed of a transparent electrically conductive film of ITO or the like may be formed between the substrate 30 and the phosphor layer 31. Otherwise, the anode panel AP may be constituted of the anode electrode 33 composed of a transparent electrically conductive film provided on the substrate 30, the phosphor layer 31 and the black matrix 32 both formed on the anode electrode 32, and a light reflection electrically conductive film which is composed of aluminum, is formed on the phosphor layer 31 and the black matrix 32 and is electrically connected to the anode electrode 33.

The display has a constitution in which the substrate 30 on which the anode electrode 33 and the phosphor layer 31 (31R, 31G and 31B) are formed and the supporting member 10 on which the field emission devices are formed are arranged such that the phosphor layer 31 and the field emission device face each other, and the substrate 30 and the supporting member 10 are bonded to each other in their circumferential portions. Specifically, the cathode panel CP and the anode panel AP are bonded to each other through a frame 34 in their circumferential portions. Further, the cathode panel CP has a vacuuming through-hole 36 in its ineffective field, and a tip tube 37 which is to be sealed after vacuuming is connected to the through-hole 36. The frame 34 is made of ceramic or glass and has a height, for example, of 1.0 mm. In some cases, an adhesive layer alone may be used in place of the frame 34.

Each pixel is constituted of the cathode electrode 11, the electron emitting portion 15 formed thereon and the phosphor layer 31 arranged in the effective field of the anode panel AP so as to face the field emission device. In the effective field, such pixels are arranged on the order, for example, of hundreds of thousands to several millions.

A relatively negative voltage is applied to the cathode electrode 11 from a cathode-electrode control circuit 40, a relatively positive voltage is applied to the gate electrode 13 from a gate-electrode control circuit 41, and a higher positive voltage than the voltage to the gate electrode 13 is applied to the anode electrode 33 from an anode-electrode control circuit 42. When such a display is used for displaying, for example, a scanning signal is inputted to the cathode electrode 11 from the cathode-electrode control circuit 40, and a video signal is inputted to the gate electrode 13 from the gate-electrode control circuit 41. Alternatively, it may be employed the constitution in which the video signal is inputted to the cathode electrode 11 from the cathode-electrode control circuit 40, and the scanning signal is inputted to the gate electrode 13 from the gate-electrode control circuit 41. Electrons are emitted from the electron emitting portion 15 on the basis of a quantum tunnel effect due to an electric filed generated when a voltage is applied between the cathode electrode 11 and the gate electrode 13, and the electrons are attracted toward the anode electrode 33 and collide with the phosphor layer 31. As a result, the phosphor layer 31 is excited to emit light, and a desired image can be obtained.

The method of manufacturing a field emission device and the method of manufacturing a display in Example 3 will be explained with reference to FIGS. 4A to 4C, 5A, 5B and 6A to 6C hereinafter. In drawings for explaining the method of manufacturing a field emission device, there is shown only one electron emitting portion or a component thereof in an overlap region of the cathode electrode 11 and the gate electrode 13 or on the cathode electrode, for simplification of the drawings. Actually, however, one or a plurality of electron emitting portions is/are formed in the overlap region of the cathode electrode 11 and the gate electrode 13 or on the cathode electrode.

[Step-300]

First, a stripe-shaped cathode electrode 11 made of an approximately 0.2 μm thick chromium (Cr) layer is formed on a supporting member 10 made, for example, of a glass substrate, for example, by a sputtering method and an etching technique. The cathode electrode 11 extends in a first direction (direction perpendicular to the paper surface of the drawing). The cathode electrode 11 may be formed by the method explained in Example 1 or Example 2.

[Step-310]

Then, an insulating layer 12 is formed on the entire surface, specifically, on the supporting member 10 and the cathode electrode 11. Specifically, the insulating layer 12 having a thickness of approximately 1 μm is formed on the entire surface, for example, by a CVD method using TEOS (tetraethoxysilane) as a source gas.

[Step-320]

Then, the stripe-shaped gate electrode 13 is formed on the insulating layer 12. The gate electrode 13 extends in a second direction (leftward and rightward on the paper surface of the drawings) different from the first direction. Then, a resist layer is formed on the insulating layer 12 and the stripe-shaped gate electrode 13, and then the first opening portion 14A is formed through the gate electrode 13. Further, the second opening portion 14B communicating with the first opening portion 14A formed through the gate electrode 13 is formed through the insulating layer 12, and then the resist layer is removed (see FIG. 4A). The cathode electrode 11 is exposed in the bottom portion of the second opening portion 14B. In the following explanations, the first opening portion 14A and the second opening portion 14B will be sometimes expressed as "opening portion 14".

[Step-330]

Figure 4A:
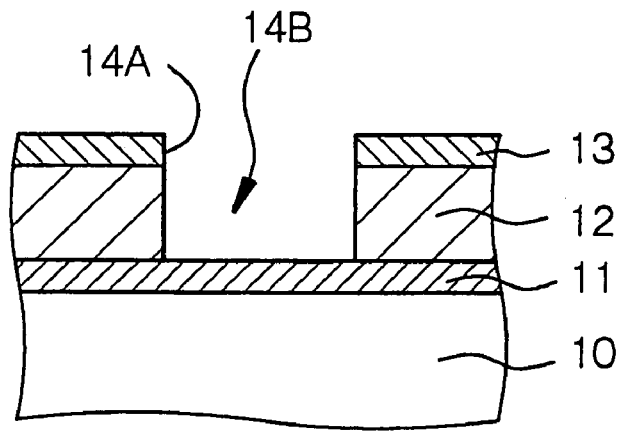
FIGS. 4A to 4C are schematic partial end views of a supporting member, etc., for explaining a method of manufacturing a cold cathode field emission device in Example 3.
Figure 4B:
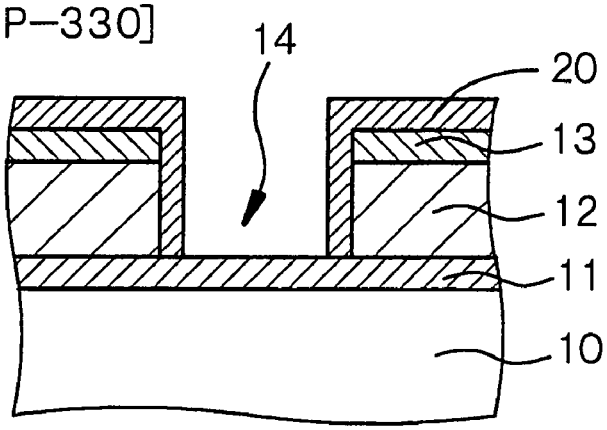

A resist-material layer 20 covering the side wall of the opening portion 14, the gate electrode 13 and the insulating layer 12 is then formed (see FIG. 4B). Specifically, in the same manner as in Example 1, the resist-material layer 20 made of a positive-type resist material (THMR-iP5720HP, supplied by Tokyo Ouka Kogyo Kabushiki Kaisha) produced from a novolak resin and 2-heptanone is formed on the entire surface including the inside of the opening portion 14 by a spin coating method, and then, the resist-material layer 20 is patterned by a lithography technique, to expose the central portion of the cathode electrode 11 positioned in the bottom portion of the second opening portion 14B.

[Step-340]

Figure 4C:
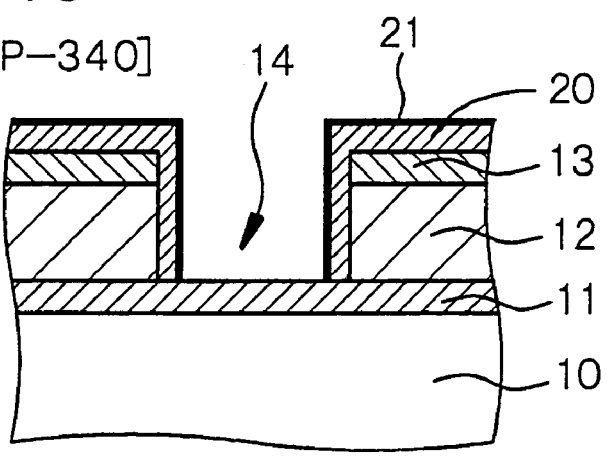

Then, the surface of the resist-material layer 20 is modified in the same manner as in [Step-110] of Example 1, to form a modified layer 21 (see FIG. 4C).

[Step-350]

Figure 5A:
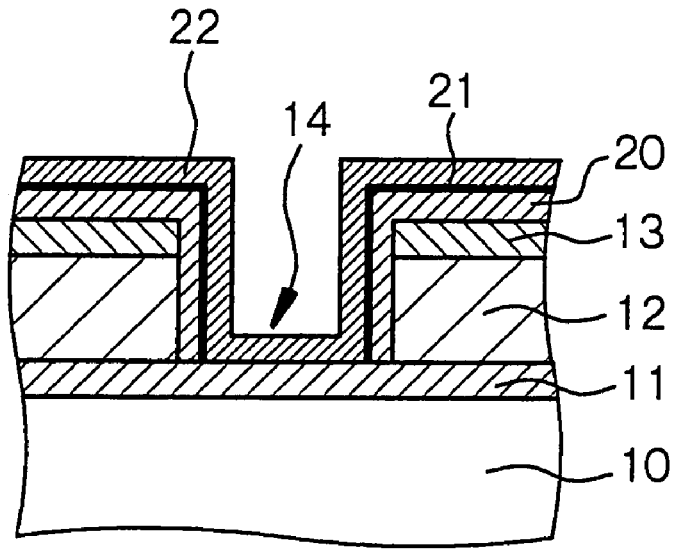
FIGS. 5A and 5B, following

Then, a photosensitive thick-film-paste-material layer 22 is formed at least in the opening portion 14 (see FIG. 5A). That is, the "step of forming a photosensitive thick-film-paste-material layer" is carried out. Specifically, the photosensitive thick-film-paste-material layer 22 is printed on the entire surface including the inside of the opening portion 14 by a screen printing method. The photosensitive thick-film-paste-material layer 22 that is used in this case is composed of a so-called negative-type resin (a resin having a property that it undergoes polymerization or crosslinking under irradiation with exposure light to become insoluble or sparingly soluble in a developer solution and remains after development, and, for example, consisting of an acryl monomer), an acrylic resin and a material having an electron emission function. The material having an electron emission function is a carbon-nanotube structure, and more specifically, the carbon-nanotube is produced by an arc discharge method and has an average diameter of 30 nm and an average length of 1 µm. The above thick-film-paste-material layer 22 will be used in Examples to be described hereinafter.

[Step-360]

Figure 5B:
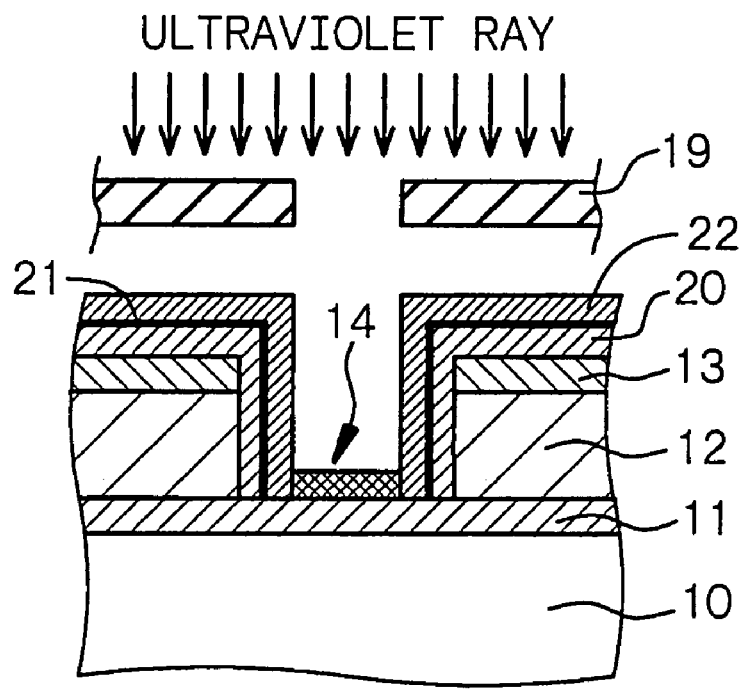

Then, the thick-film-paste-material layer 22 is irradiated with exposure light from the front-surface side of the supporting member 10 to expose that portion of the thick-film-paste-material layer 22 which portion is positioned in the bottom portion of the opening portion 14 (see FIG. 5B). The thick-film-paste-material layer 22 is then developed, to remove an unexposed thick-film-paste-material layer 22, and then the thick-film-paste-material layer 22 is dried at 80° C. for 20 minutes to remove the solvent in the thick-film-paste-material layer 22. In the above manner, there can be obtained an electron emitting portion 15 composed of the thick-film-paste-material layer 22 on the cathode electrode 11 positioned in the bottom portion of the opening portion 14 (see FIG. 6A). Reference numeral 19 indicates an exposure light shielding material (mask).

[Step-370]

Then, the ashing treatment is carried out in the same manner as in [Step-240] of Example 2, and the modified layer 21 in the surface of the resist-material layer, which modified layer 21 is formed in [Step-340], is removed (see FIG. 6B).

[Step-380]

Then, the resist-material layer 20 is removed with acetone (see FIG. 6C). Since the modified layer 21 in the surface of the resist-material layer has been removed in [Step-370], the resist-material layer 20 can be reliably removed. Then, the thick-film-paste-material layer 22 is fired at 500° C. for 20 minutes.

[Step-390]

Then, the display is assembled. Specifically, the anode panel AP and the cathode panel CP are arranged such that the phosphor layer 31 and the field emission device face each other, and the anode panel AP and the cathode panel CP (more specifically, the substrate 30 and the supporting member 10) are bonded to each other in their circumferential portions through the frame 34. In the bonding, a frit glass is applied to bonding portions of the frame 34 and the anode panel AP and bonding portions of the frame 34 and the cathode panel CP. Then, the anode panel AP, the cathode panel CP and the frame 34 are attached. The frit glass is pre-calcined or pre-sintered to be dried, and then fully calcined or sintered at approximately 450° C. for 10 to 30 minutes. Then, a space surrounded by the anode panel AP, the cathode panel CP, the frame 34 and the frit glass is vacuumed through a through-hole 36 and a tip tube 37, and when the space comes to have a pressure of approximately $10^{-4}$ Pa, the tip tube is sealed by thermal fusion. In the above manner, the space surrounded by the anode panel AP, the cathode panel CP and the frame 34 can be vacuumed. Then, wiring to external circuits is carried out to complete the display.

When [Step-340] was omitted for comparison, the resist-material layer 20 disappeared upon completion of [Step-360], and it was impossible to form any desired electron emitting portion 15. Further, when [Step-370] was omitted, the resist-material layer 20 remained as a residue during the peeling of the resist-material layer 20. When the thick-film-paste-material layer 22 was fired in [Step-380], the resist-material layer 20 was carbonized and remained. Further, when supersonic irradiation was employed in combination during the peeling of the resist-material layer 20 so that the resist-material layer 20 did not remain as a residue, the thick-film-paste-material layer 22 before the firing was peeled off from the cathode electrode 11.

In the method of manufacturing a field emission device, some or all of the carbon-nanotubes may change in their surface state (for example, oxygen atoms or oxygen molecules are adsorbed to their surfaces), and the carbon-nanotubes are deactivated with respect of electric field emission in some cases. In this case, after the [Step-380], it is preferred to subject the electron-emitting portion 15 to a plasma treatment in a hydrogen gas atmosphere. By the plasma treatment, the electron-emitting portion 15 is activated, and the efficiency of emission of electrons from the electron-emitting portion 15 is further improved. Table 5 shows an example of a plasma treatment condition. The plasma treatment can be applied to the various Examples which will be explained hereinafter.

TABLE 5

| | |
|---|---|
| Gas to be used | $H_2$ = 100 sccm |
| Source power | 1000 W |
| Power to be applied to supporting member | 50 V |
| Reaction pressure | 0.1 Pa |
| Supporting member temperature | 300° C. |

EXAMPLE 4

Example 4 concerns the method of manufacturing a field emission device and the method of manufacturing a display according to the second aspect of the present invention, and also concerns the manufacturing method-A of the present invention. Further, Example 4 concerns a variant of the method of patterning a thick-film-paste-material layer according to the second aspect of the present invention. The field emission devices in Example 4 and Examples 5 and 6 to be described later are similar in constitution and structure, so that detailed explanations thereof will be omitted. Further, the displays in Example 4 and Examples 5 to 9 to be described later are similar in constitution and structure to the field emission device and the display in Example 3, so that detailed explanations thereof will be omitted. In Example 4, a hole portion 11A reaching a supporting member 10 is formed in that portion of a cathode electrode 11 which portion is positioned in the bottom portion of an opening portion 14. An electron emitting portion 15 spreads from that portion of the cathode electrode 11 which portion is positioned in the bottom portion of the opening portion 14 to the inside of the hole portion 11A.

The method of manufacturing a field emission device and the method of manufacturing a display in Example 4 will be explained below with reference to FIGS. 7A to 7C, 8A, 8B, 9A, 9B, 10A, 10B, 11A and 11B.

[Step-400]

First, a cathode electrode 11 is formed on the front surface (first surface) of a supporting member 10 that transmits exposure light. The cathode electrode 11 has a hole portion 11A in the bottom portion of which the supporting member is exposed, is composed of a material that transmits no exposure light and extends in a first direction (direction perpendicular to the paper surface of the drawings). That is, the "cathode-electrode-forming step" is carried out. Specifically, for example, photosensitive silver paste is printed on the front surface (first surface) of the supporting member 10 made of a glass substrate transmittable to exposure light (ultraviolet ray for exposure), such as a white sheet glass (B-270, supplied by SCHOTT), a blue sheet glass (soda lime glass) or an alkali-free glass (OA2, supplied by Nippon Denki Glass Kabushiki Kaisha). Then, the photosensitive silver paste is irradiated with exposure light through a photomask, followed by development and firing. In the above manner, there can be obtained the stripe-shaped cathode electrode 11 having the hole portion 11A in the bottom portion of which the supporting member is exposed (see FIG. 7A). There may be formed the cathode electrode 11 having the hole portion 11A in the bottom portion of which the supporting member is exposed, being composed of a material that transmits no exposure light and extending in a first direction (direction perpendicular to the paper surface of the drawings), in the same manner as in [Step-300] of Example 3.

[Step-410]

Then, an insulating layer 12A made of a photosensitive material transmittable to exposure light is formed on the entire surface. That is, the "step of forming an insulating layer made of an exposure-light-transmittable photosensitive material" is carried out. Specifically, positive-type photosensitive glass paste is formed on the entire surface (specifically, on the cathode electrode 11 and the supporting member 10 including the inside of the hole portion 11A) by a screen printing method and dried.

[Step-420]

Then, a gate electrode 13 is formed on the insulating layer 12A. The gate electrode 13 is made of a photosensitive material and extends in a second direction (leftward and rightward on the paper surface of the drawings) different from the first direction (see FIG. 7B). That is, the "step of forming a gate electrode made of a photosensitive material" is carried out. Specifically, for example, positive-type photosensitive silver paste is printed on the insulating layer 12A by a screen printing method and dried, whereby the stripe-shaped gate electrode 13A can be obtained.

[Step-430]

Then, the reverse surface (second surface) of the supporting member 10 is irradiated with exposure light (specifically, ultraviolet ray) with using the hole portion 11A as an exposure mask, to expose those portions of the insulating layer 12A and the gate electrode 13A which are above the hole portion 11A to the exposure light (FIG. 7C). Then, the insulating layer 12A and the gate electrode 13A are developed to remove those portions of the insulating layer 12A and the gate electrode 13A which portions are above the hole portion 11A, whereby an opening portion 14 having a larger diameter than the hole portion 11A is formed through the insulating layer 12A and the gate electrode 13A above the hole portion 11A, and the cathode electrode 11 and the hole portion 11A are exposed in the bottom portion of the opening portion 14 (see FIG. 8A). That is, the "step of forming an opening portion by exposure on the reverse-surface side" is carried out. Then, the materials constituting the insulating layer 12A and the gate electrode 13 are fired. The opening portion 14 is formed in a self-alignment manner with regard to the hole portion 11A.

When the reverse surface (second surface) of the supporting member 10 is irradiated with exposure light with using the hole portion 11A as an exposure mask in [Step-430], preferably, an exposure light shielding material (mask 19) is arranged on the reverse-surface side (second-surface side) of the supporting member 10 so that those portions of the insulating layer 12A and the gate electrode 13A, which portions are not to be exposed to the exposure light, are not exposed to the exposure light.

For forming the opening portion 14 having a larger diameter than the hole portion 11A through the insulating layer 12A and the gate electrode 13A above the hole portion 11A in [Step-430], there can be employed a method in which the insulating layer 12A and the gate electrode 13A are exposed to exposure light to excess (i.e., a method of carrying out over-exposure) and/or a method in which the insulating layer 12A and the gate electrode 13A are developed to excess (i.e., a method of carrying out over-development).

[Step-440]

Figure 8A:
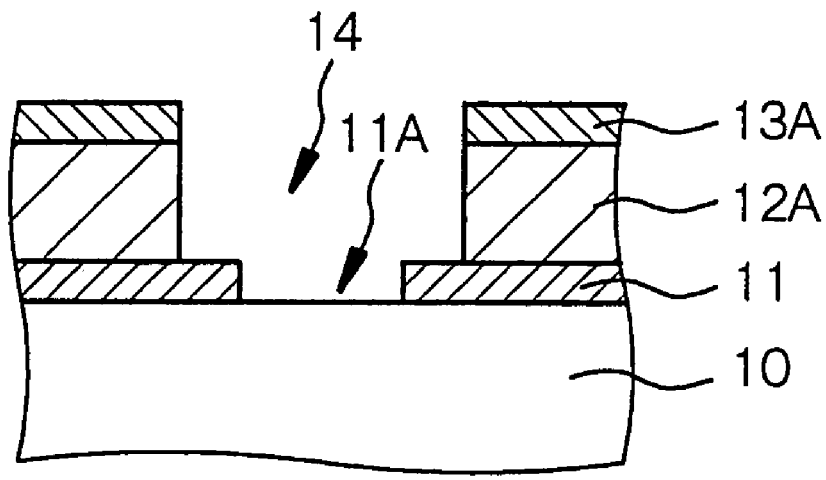
FIGS. 8A and 8B, following
Figure 8B:
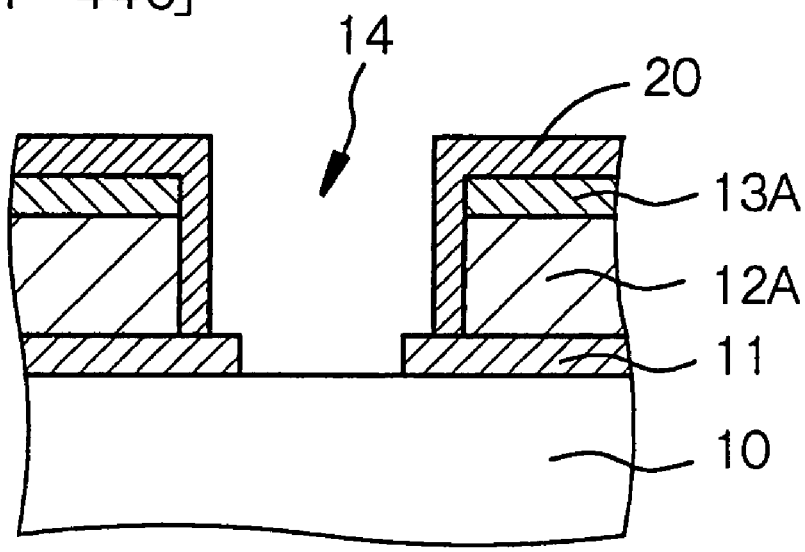

Then, a resist-material layer 20 covering the side wall of the opening portion 14, the gate electrode 13 and the insulating layer 12 is formed (see FIG. 8B). Specifically, in the same manner as in Example 1, the resist-material layer 20 made of a positive-type resist material (THMR-iP5720HP, supplied by Tokyo Ouka Kogyo Kabushiki Kaisha) produced from a novolak resin and 2-heptanone is formed on the entire surface including the inside of the opening portion 14 by a spin coating method, and then, the resist-material layer 20 is exposed and developed by a lithography technique, to expose the central portion of the cathode electrode 11 positioned in the bottom portion of the second opening portion 14B. The exposure of the resist-material layer 20 may be carried out on the front-surface side (first-surface side) of the supporting member 10 with using a mask, or may be carried out on the reverse-surface side (second-surface side) with using the hole portion 11A as an exposure mask. In the latter case, the resist-material layer 20 can be patterned in a self-alignment manner with regard to the hole portion 11A.

[Step-450]

Figure 9A:
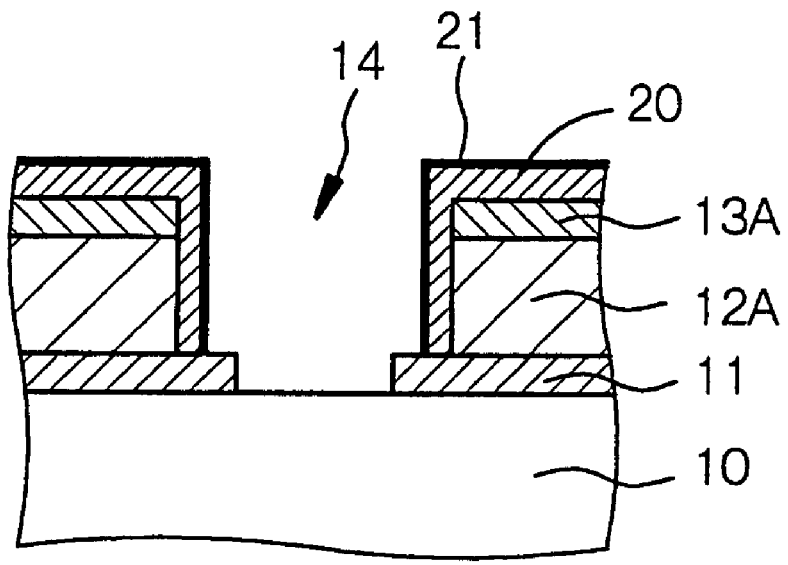
FIGS. 9A and 9B, following

Then, in the same manner as in [Step-111] of Example 1, the surface of the resist-material layer 20 is modified to form a modified layer 21 (see FIG. 9A).

[Step-460]

Figure 9B:
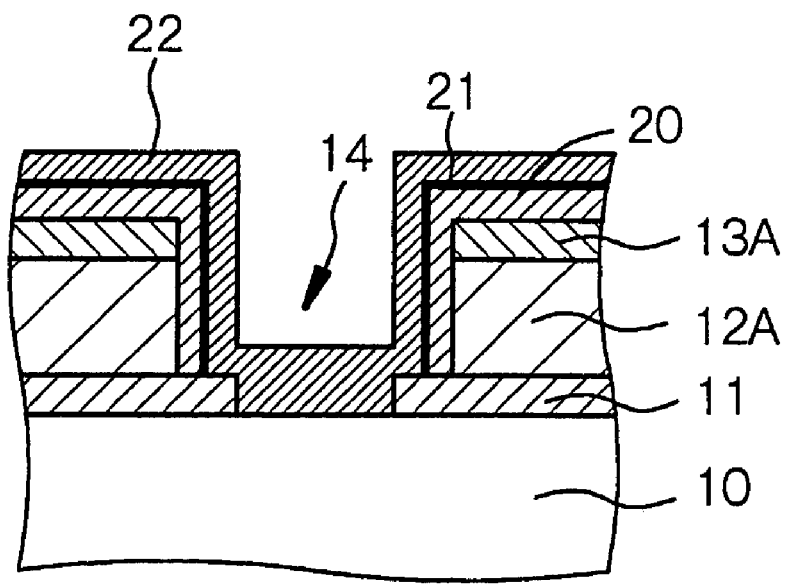

Then, a photosensitive thick-film-paste-material layer 22 is formed at least in the opening portion 14 (specifically, the entire surface including the inside of the opening portion 14) in the same manner as in [Step-350] of Example 3 (see FIG. 9B). That is, the "step of forming a photosensitive thick-film-paste-material layer" is carried out.

[Step-470]

Figure 10A:
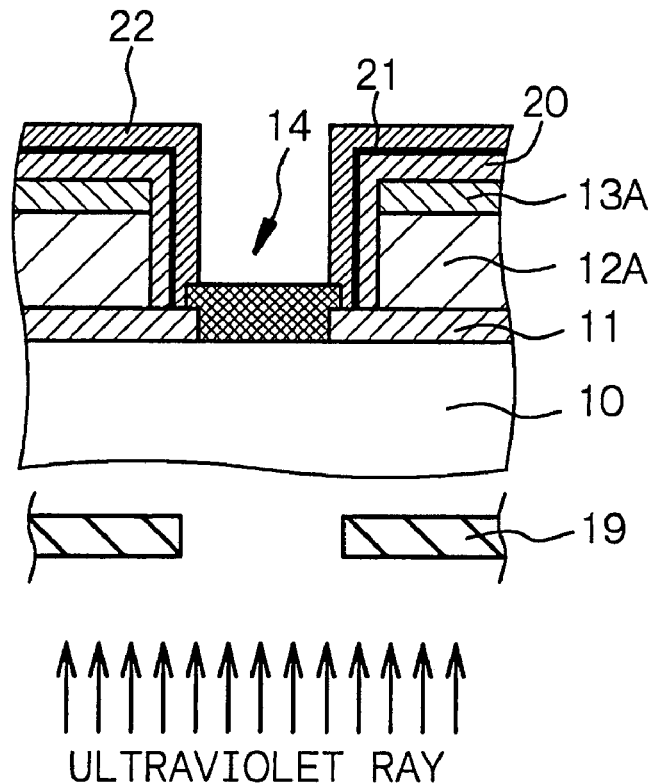
FIGS. 10A and 10B, following
Figure 10B:
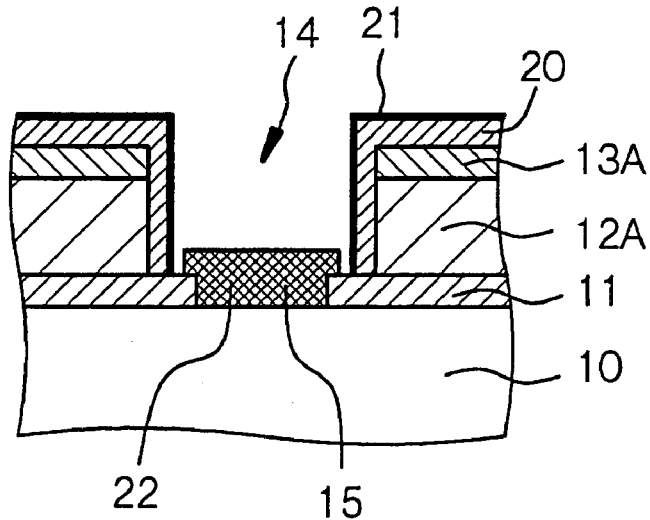

The reverse surface (second surface) of the supporting member 10 is irradiated with exposure light (specifically, ultraviolet ray) with using the hole portion 11A as an exposure mask to expose a portion of the thick-film-paste-material layer 22 above the hole portion 11A to the exposure light (see FIG. 10A). When the reverse surface (second surface) of the supporting member 10 is irradiated with exposure light with using the hole portion 11A as an exposure mask, preferably, an exposure light shielding material (mask 19) is arranged on the reverse-surface side (second-surface side) of the supporting member 10 so that a portion of the thick-film-paste-material layer 22, which portion is not to be exposed to exposure light, is not exposed to the exposure light. Then, the thick-film-paste-material layer 22 is developed to remove an unexposed thick-film-paste-material layer 22, and then the thick-film-paste-material layer 22 is dried at 80° C. for 20 minutes to remove the solvent in the thick-film-paste-material layer 22. In this manner, that portion of the thick-film-paste-material layer 22 which portion is above the hole portion 11A is left, whereby an electron emitting portion 15 constituted of the thick-film-paste-material layer 22 is formed, which spreads from the cathode electrode 11 to the inside of the hole portion 11A (see FIG. 10B). That is, the "step of forming an electron emitting portion by exposure on the reverse-surface side and development" is carried out. The electron emitting portion 15 is formed in a self-alignment manner with regard to the hole portion 11A. That is, the electron emitting portion 15 can be obtained by a reverse-surface exposure method, and the electron emitting portion 15 can be formed in the bottom portion of the opening portion 14 formed through the gate electrode 13A and the insulating layer 12A in a self-alignment manner with regard to the opening portion 14.

When the supporting member 10 and the cathode electrode 11 are regarded as a substratum, the region where the hole portion 11A is formed corresponds to a portion that transmits exposure light used for exposing the thick-film-paste-material layer, and the region where the cathode electrode 11 is formed corresponds to a region that transmits no exposure light. The hole portion 11A that is a region transmittable to the exposure light corresponds to that part of the substratum which is not covered with the resist-material layer 20. In [Step-470], the thick-film-paste-material layer 22 is irradiated with exposure light on the reverse-surface side of the substratum, that is, on the reverse-surface side (second-surface side) of the supporting member 10. In the above manner, the method of patterning a thick-film-paste-material layer according to the second aspect of the present invention, can be accomplished.

[Step-480]

Figure 11A:
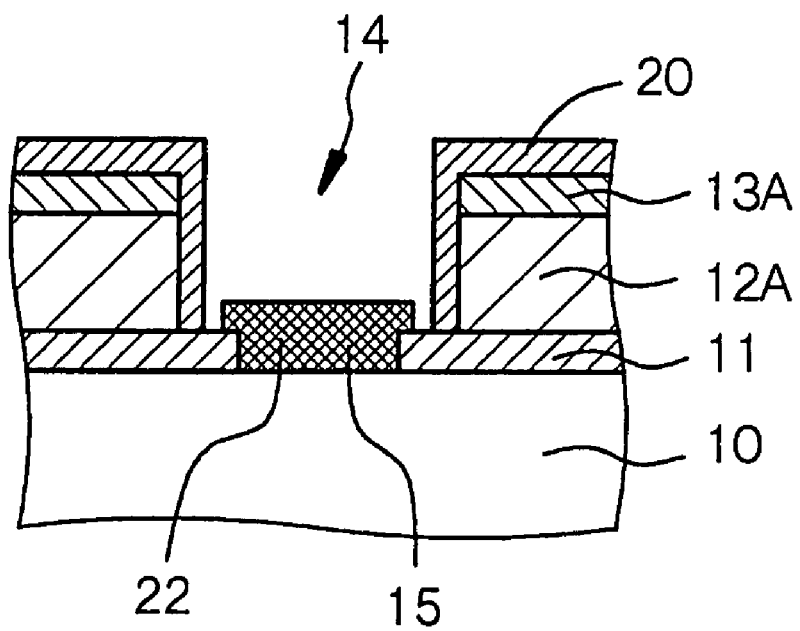
FIGS. 11A and 11B, following

Then, the modified layer 21 in the surface of the resist-material layer, which modified layer 21 is formed in [Step-450], is removed by carrying out the ashing treatment in the same manner as in [Step-240] of Example 2 (see FIG. 11A).

Figure 11B:
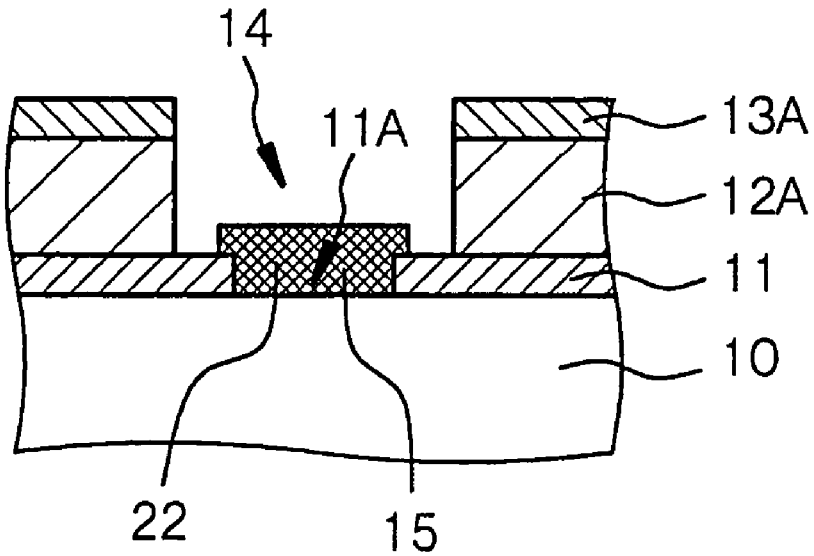

Then, the resist-material layer 20 is removed with acetone (see FIG. 11B). Since the modified layer 21 in the surface of the resist-material layer has been removed in [Step-470], the resist-material layer 20 can be reliably removed. Then, the thick-film-paste-material layer 22 is fired in the same manner as in [Step-380] of Example 3.

[Step-490]

Then, the display is assembled in the same manner as in [Step-390] of Example 3.

In Example 4, the electron emitting portion 15 is formed in a self-alignment manner with regard to the hole portion 11A. That is, the electron emitting portion 15 can be obtained by a reverse-surface exposure method, and the electron emitting portion 15 can be formed in the bottom portion of the opening portion 14 formed through the gate electrode 13A and the insulating layer 12A in a self-alignment manner with regard to the opening portion 14.

When [Step-450] was omitted for comparison, the resist-material layer 20 disappeared upon completion of [Step-470], and it was impossible to form any desired electron emitting portion 15. When the ashing treatment in [Step-480] was omitted, the resist-material layer 20 remained as a residue when the resist-material layer 20 was peeled off, and when the thick-film-paste-material layer 22 was fired in [Step-480], the resist-material layer 20 was carbonized and remained. On the other hand, when supersonic irradiation was employed in combination during the peeling of the resist-material layer 20 so that the resist-material layer 20 did not remain as a residue, the thick-film-paste-material layer 22 before the firing was peeled off from the cathode electrode 11 and the supporting member 10.

EXAMPLE 5

Example 5 is a variant of Example 4 and concerns the manufacturing method-B of the present invention.

The method of manufacturing a field emission device and the method of manufacturing a display in Example 5 will be explained below with reference to FIGS. 12A, 12B, 13A and 13B.

[Step-500]

The "cathode-electrode-forming step" is carried out in the same manner as in [Step-400] of Example 4.

[Step-510]

Then, an insulating layer 12B made of a non-photosensitive material transmittable to exposure light is formed on the entire surface. That is, the "step of forming an insulating layer made of a non-photosensitive material transmittable to exposure light" is carried out. The insulating layer 12B can be formed, for example, from $SiO_2$-containing material, and can be formed, for example, by a screen printing method.

[Step-520]

Then, formed on the insulating layer 12B is a gate electrode 13B that is composed of a non-photosensitive material transmittable to exposure light and which extends in a second direction different from the first direction. That is, the "step of forming a gate electrode made of a non-photosensitive material" is carried out. Specifically, for example, an electrically conductive layer made of ITO is formed on the entire surface by a sputtering method, and then the electrically conductive layer is patterned, whereby the gate electrode 13 in the form of a stripe can be obtained.

[Step-530]

Then, an etching mask layer 23 made of a positive-type resist material is formed on the gate electrode 13A and the insulating layer 12A (see FIG. 12A). That is, the "step of forming an etching mask layer made of a resist material on the gate electrode and the insulating layer" is carried out.

[Step-540]

Figure 13A:
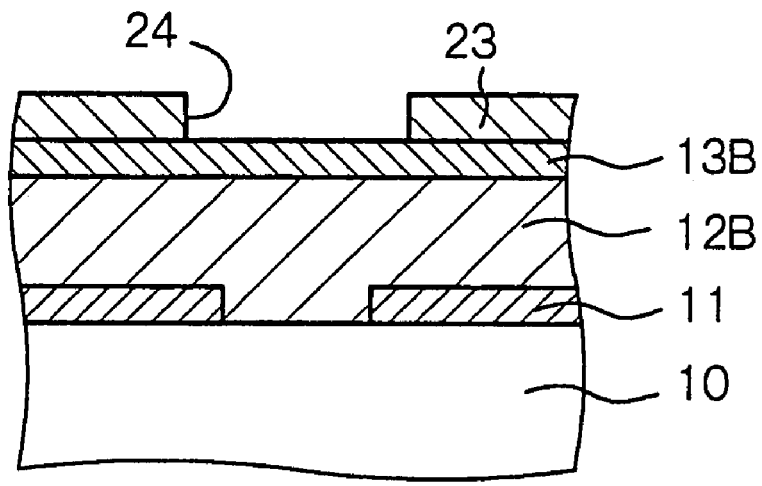
FIGS. 13A and 13B, following

Then, the reverse surface (second surface) of the supporting member 10 is irradiated with exposure light with using the hole portion 11A as an exposure mask to expose the etching mask layer 23 to the exposure light (see FIG. 12B), and the etching mask layer 23 is developed, thereby to form an etching-mask-layer opening 24 trough that portion of the etching mask layer 23 which portion is above the hole portion 11A (see FIG. 13A). That is, the "step of forming an etching-mask-layer opening through an etching mask layer by exposure on the reverse-surface side" is carried out. When the reverse surface (second surface) of the supporting member 10 is irradiated with exposure light with using the hole portion 11A as an exposure mask, preferably, an exposure light shielding material (mask 19) is arranged on the reverse-surface side (second-surface side) of the supporting member 10 so that a portion of the etching mask layer 23, which portion is not to be exposed to exposure light, is not exposed to the exposure light.

[Step-550]

Figure 13B:
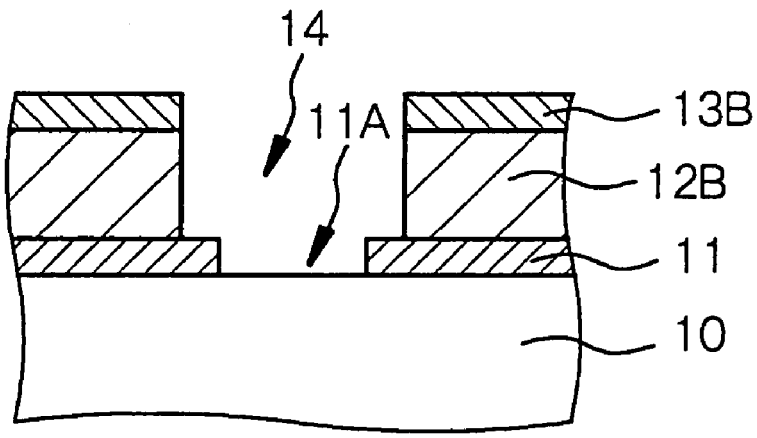

Then, the gate electrode 13B and the insulating layer 12B below the etching-mask-layer opening 24 are etched with using the etching mask layer 23, and then, the etching mask layer 23 is removed, whereby there is formed an opening portion 14 having a larger diameter than the hole portion 11A through the insulating layer 12B and the gate electrode 13B above the hole portion 11A, and the cathode electrode 11 and the hole portion 11A are exposed in the bottom portion of the opening portion 14 (see FIG. 13B). The above opening portion 14 can be accomplished by over-etching the insulating layer 12B and the gate electrode 13B. Alternatively, there can be employed a method of carrying out the exposure of the etching mask layer 23 to excess (i.e., a method of carrying out over-exposure) and/or a method of carrying out the development of the etching mask layer 23 to excess (i.e., a method of carrying out over-development) in [Step-540].

[Step-560]

Then, [Step-440] to [Step-480] of Example 4 are carried out, whereby a field emission device can be obtained. Further, the display is then assembled in the same manner as in [Step-390] of Example 3.

EXAMPLE 6

Example 6 is also a variant of Example 4 and concerns the manufacturing method-C of the present invention.

The method of manufacturing a field emission device and the method of manufacturing a display in Example 6 will be explained below with reference to FIGS. 14A, 14B and 15.

[Step-600]

First, the "cathode-electrode-forming step" is carried out in the same manner as in [Step-400] of Example 4. The cathode electrode 11 extends in a first direction (a direction perpendicular to the paper surface of the drawings).

[Step-610]

Then, an insulating layer 12C made of a photosensitive material is formed on the entire surface. That is, the "step of forming an insulating layer made of a photosensitive material" is carried out. Specifically, for example, negative-type photosensitive glass paste is printed on the entire surface (specifically, on the cathode electrode 11 and the supporting member 10 including the inside of the hole portion 11A) by a screen printing method and dried.

[Step-620]

Then, a gate electrode 13C is formed on the insulating layer 12C. The gate electrode 13C is made of a photosensitive material transmittable to exposure light and extends in a second direction different from the first direction (see FIG. 14A). That is, the "step of forming a gate electrode made of a photosensitive material that transmits exposure light" is carried out. Specifically, for example, negative-type photosensitive silver paste is printed on the insulating layer 12C by a screen printing method and dried, whereby the gate electrode 13C in the form of a stripe can be obtained. The gate electrode 13C in the form of a stripe extends in a second direction (leftward and rightward on the paper surface of the drawings) different from the first direction. The silver paste transmits exposure light at the stage of exposure.

[Step-630]

Figure 15:
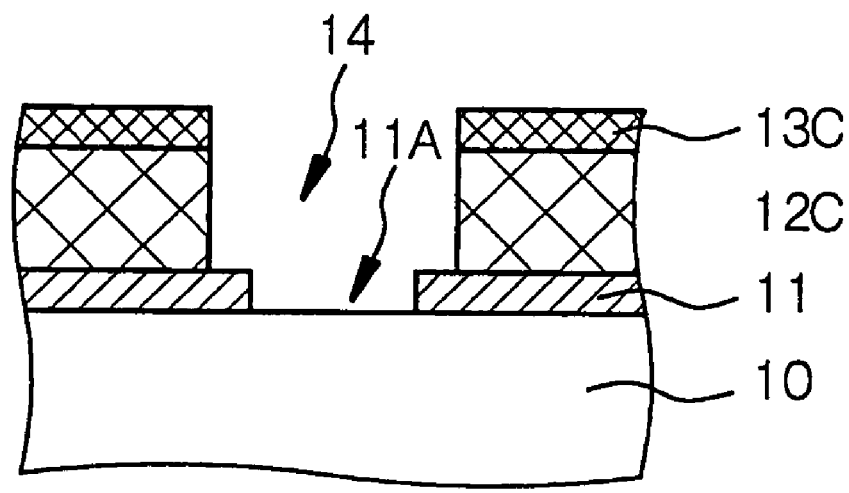
FIG. 15, following

Then, the gate electrode 13C and the insulating layer 12C are exposed to exposure light (specifically, ultraviolet ray) on the front-surface side (first-surface side) of the supporting member 10 (see FIG. 14B), and then the gate electrode 13C and the insulating layer 12C are developed, whereby there is formed an opening portion 14 having a larger diameter than the hole portion 11A through the gate electrode 13C and the insulating layer 12C above the hole portion 11A, to expose the cathode electrode 11 and the hole portion 11A in the bottom portion of the opening portion 14 (see FIG. 15). That is, the "step of forming an opening portion by exposure light on the front-surface side" is carried out. When the gate electrode 13C and the insulating layer 12C are exposed to exposure light, an exposure light shielding material (mask 19) having an exposure light shielding portion larger than the hole portion 11A is arranged on the front-surface side (first-surface side) of the supporting member 10.

[Step-640]

Then, [Step-440] to [Step-480] of Example 4 are carried out, whereby a field emission device can be obtained. Further, the display is then assembled in the same manner as in [Step-390] of Example 3.

The materials for constituting the insulating layer and the gate electrode may be positive-type materials. In this case, in [Step-630], those portions of the insulating layer and the gate electrode which portions are exposed to exposure light can be portions where the opening portion is to be formed.

EXAMPLE 7

Example 7 concerns the field emission device and the method of manufacturing a display according to the third aspect of the present invention and the manufacturing method-A of the present invention. Further, Example 7 concerns a variant of the method of patterning a thick-film-paste-material layer according to the second aspect of the present invention. The field emission devices explained in Example 7 and Examples 8 and 9 to be described later are similar in constitution and structure, so that detailed explanations thereof will be omitted. In Example 7, a hole portion 11A reaching a supporting member 10 is formed through that portion of a cathode electrode 11 which portion is positioned in the bottom portion of an opening portion 14, and formed at least in the hole portion 11A is a light-transmitting layer 25 made of a conductive material or resistive material which transmits exposure light.

The field emission device in Example 7 comprises;

(a) a cathode electrode 11 being formed on a supporting member 10 and extending in a first direction, (b) an insulating layer 12A formed on the supporting member 10 and the cathode electrode 11, (c) a gate electrode 13A being formed on the insulating layer 12A and extending in a second direction different from the first direction, (d) an opening portion 14 formed through the gate electrode 13A and the insulating layer 12A (a first opening portion 14A formed through the gate electrode 13A and a second opening portion 14B formed through the insulating layer 12A), and (e) an electron emitting portion 15, wherein electrons are emitted from the electron emitting portion 15 exposed in the bottom portion of the opening portion 14.

The hole portion 11A reaching the supporting member 10 is formed through that portion of the cathode electrode 11 which portion is positioned in the bottom portion of the opening portion 14, a light-transmitting layer 25 is formed at least in the hole portion 11A, and the electron emitting portion 15 is formed on the light-transmitting layer 25 positioned in the bottom portion of the opening portion 14. The projection image of the cathode electrode 11 in the form of a stripe and the projection image of the gate electrode 13A in the form of a stripe cross each other at right angles.

The method of manufacturing a field emission device and the method of manufacturing a display in Example 7 will be explained below with reference to FIGS. 16A to 16C, 17A to 17C, 18A, 18B, 19A and 19B.

[Step-700]

First, a cathode electrode 11 is formed on the front surface (first surface) of a supporting member 10 transmittable to exposure light in the same manner as in [Step-400] of Example 4. The cathode electrode has a hole portion 11A in the bottom portion of which the supporting member is exposed, is made of a material that transmits no exposure light and extends in a first direction (direction perpendicular to the paper surface of the drawings). That is, the "cathode-electrode-forming step" is carried out. Then, a light-transmitting layer 25 made of a conductive material or resistive material which transmits exposure light is formed at least in the hole portion 11A (see FIG. 16A). That is, the "light-transmitting-layer-forming step" is carried out. Specifically, for example, a light-transmitting layer 25 made of amorphous silicon (resistive material) is formed on the entire surface by a CVD method, and the light-transmitting layer 25 is patterned by lithography and etching techniques to form the light-transmitting layer 25 on the entire surface of the cathode electrode 11. Alternatively, a light-transmitting layer made of ITO (conductive material) is formed on the entire surface by a sputtering method, and the light-transmitting layer 25 is patterned by lithography and etching techniques to form the light-transmitting layer 25 on the entire surface of the cathode electrode 11.

[Step-710]

Then, an insulating layer 12A made of a photosensitive material transmittable to exposure light is formed on the entire surface in the same manner as in [Step-410] of Example 4. That is, the "step of forming an insulating layer made of an exposure-light-transmittable photosensitive material" is carried out.

[Step-720]

Then, a gate electrode 13A is formed on the insulating layer 12A in the same manner as in [Step-420] of Example 4 (see FIG. 16B). The gate electrode 13A is made of a photosensitive material and extends in a second direction (leftward and rightward on the paper surface of the drawings) different from the first direction. That is, the "step of forming a gate electrode made of a photosensitive material" is carried out.

[Step-730]

The reverse surface (second surface) of the supporting member 10 is irradiated with exposure light (specifically, ultraviolet ray) with using the hole portion 11A as an exposure mask, to expose those portions of the insulating layer 12A and the gate electrode 13A which portions are above the hole portion 11A to the exposure light (see FIG. 16C). Then, the insulating layer 12A and the gate electrode 13A are developed to remove those portions of the insulating layer 12A and the gate electrode 13A which portions are above the hole portion 11A, whereby an opening portion 14 is formed through the insulating layer 12A and the gate electrode 13A above the hole portion 11A, and the light-transmitting layer 25 is exposed in the bottom portion of the opening portion 14 (see FIG. 17A). That is, the "step of forming an opening portion by exposure on the reverse-surface side" is carried out. Then, the materials constituting the insulating layer 12A and the gate electrode 13A are fired. The opening portion 14 is formed in a self-alignment manner with regard to the hole portion 11A.

When the reverse surface (second surface) of the supporting member 10 is irradiated with exposure light with using the hole portion 11A as an exposure mask in [Step-730], preferably, an exposure light shielding material (mask 19) is arranged on the reverse-surface side (second-surface side) of the supporting member 10 so that a portion of the insulating layer 12, which portion is not to be exposed to the exposure light, is not exposed to the exposure light.

In [Step-730], preferably, the opening portion 14 having a larger diameter than the hole portion 11A is formed through the insulating layer 12A and the gate electrode 13A above the hole portion 11A. For the above purpose, there can be employed a method of carrying out the exposure of the insulating layer 12A and the gate electrode 13A to excess (i.e., a method of carrying out over-exposure) and/or a method of carrying out the development of the insulating layer 12A and the gate electrode 13A to excess (i.e., a method of carrying out over-development).

[Step-740]

Figure 17A:
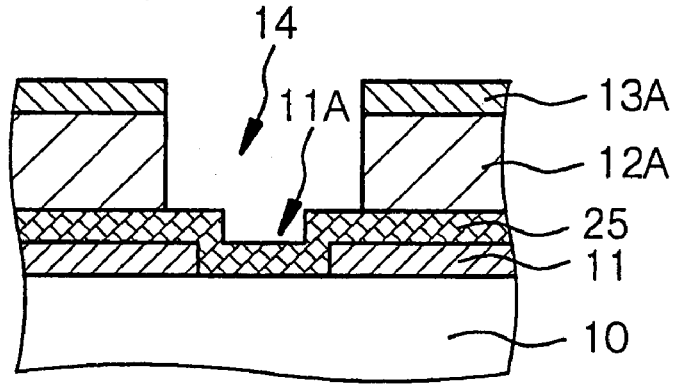
FIGS. 17A to 17C, following
Figure 17B:
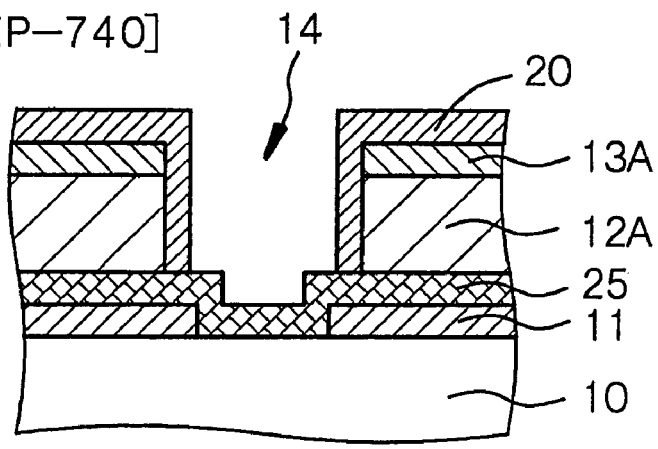

Then, a resist-material layer 20 covering the side wall of the opening portion 14, the gate electrode 13A and the insulating layer 12A is formed in the same manner as in [Step-440] of Example 4 (see FIG. 17B).

[Step-750]

Figure 17C:
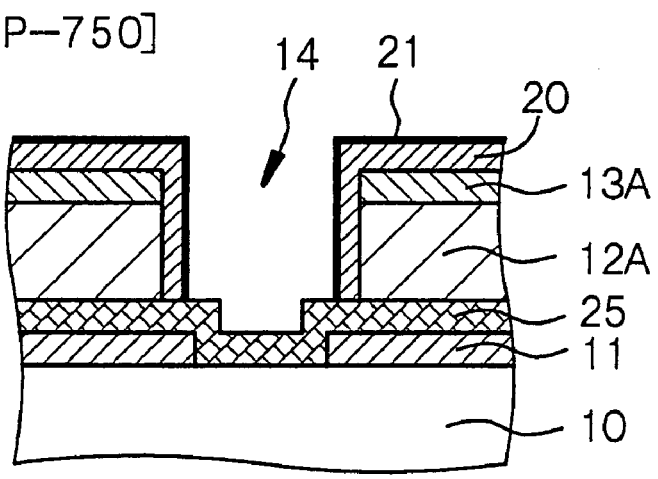

Then, the surface of the resist-material layer 20 is modified in the same manner as in [Step-110] of Example 1, to form a modified layer 21 (see FIG. 17C).

[Step-760]

Figure 18A:
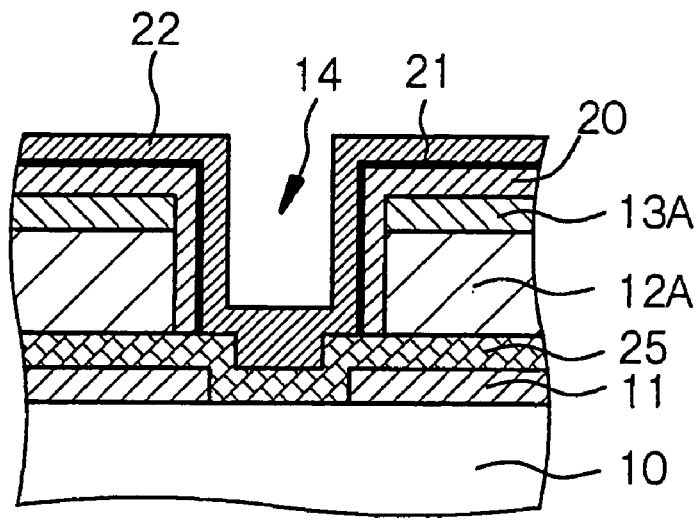
FIGS. 18A and 18B, following

Then, a photosensitive thick-film-paste-material layer 22 is formed at least in the opening portion 14 (specifically, on the entire surface including the inside of the opening portion 14) in the same manner as in [Step-350] of Example 3 (see FIG. 18A). That is, the "step of forming a photosensitive thick-film-paste-material layer" is carried out.

Figure 18B:
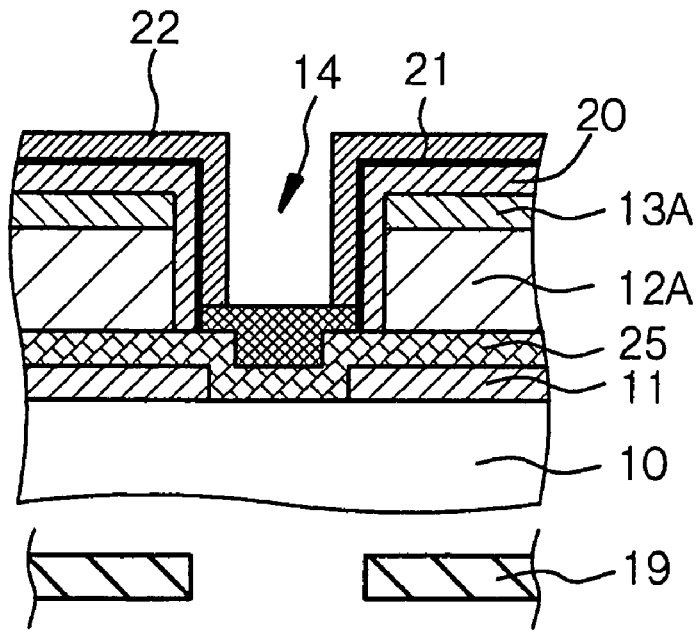
Figure 19A:
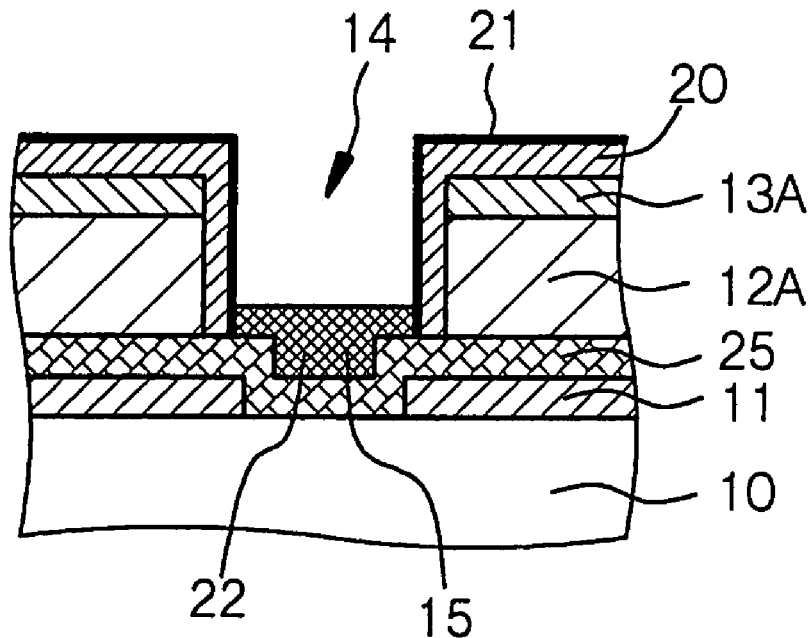
FIGS. 19A and 19B, following
Figure 19B:
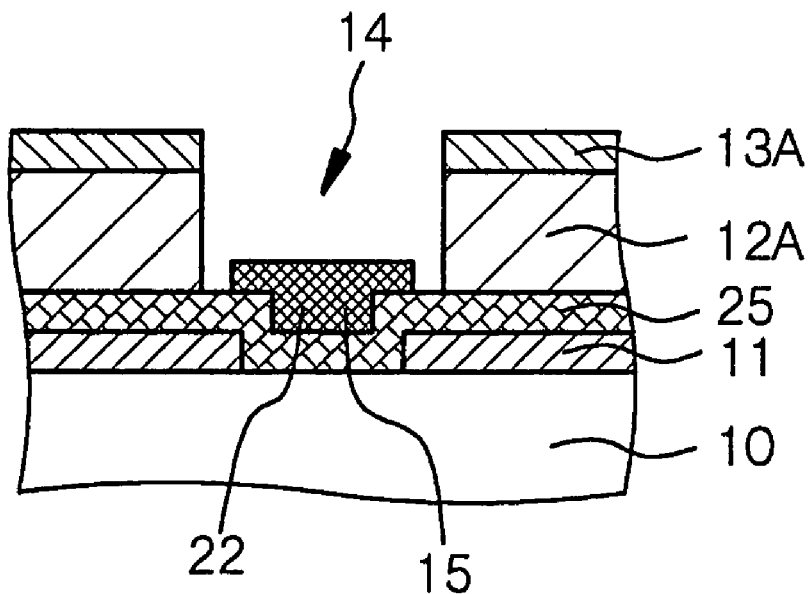

Then, the reverse surface (second surface) of the supporting member 10 is irradiated with exposure light (specifically, ultraviolet ray) with using the hole portion 11A as an exposure mask, to expose that portion of the thick-film-paste-material layer 22 which portion is above the hole portion 11A to the exposure light (see FIG. 18B). When the reverse surface (second surface) of the supporting member 10 is irradiated with exposure light with using the hole portion 11A as an exposure mask, preferably, an exposure light shielding material (mask 19) is arranged on the reverse-surface side (second-surface side) of the supporting member 10 so that a portion of the thick-film-paste-material layer 22, which portion is not to be exposed to the exposure light, is not exposed to the exposure light. Then, the thick-film-paste-material layer 22 is developed to remove an unexposed thick-film-paste-material layer 22, then, the thick-film-paste-material layer 22 is dried at 80° C. for 20 minutes, to remove the solvent in the thick-film-paste-material layer 22. In the above manner, that portion of the thick-film-paste-material layer 22 which portion is above the hole portion 11A is left, and an electron emitting portion 15 constituted of the thick-film-paste-material layer 22 is formed on the light-transmitting layer 25 (see FIG. 19A). That is, the "step of forming an electron emitting portion by exposure on the reverse-surface side and development" is carried out. The electron emitting portion 15 is formed in a self-alignment manner with regard to the hole portion 11A. That is, the electron emitting portion 15 can be obtained by a reverse-surface exposure method, and the electron emitting portion 15 can be formed in the bottom portion of the opening portion 14 formed through the gate electrode 13A and the insulating layer 12A in a self-alignment manner with regard to the opening portion 14.

When the supporting member 10, the cathode electrode 11 and the light-transmitting layer 25 are regarded as a substratum, a region provided with the hole portion 11A corresponds to a region that transmits exposure light for exposing the thick-film-paste-material layer, and a region provided with the cathode electrode 11 corresponds to a region that transmits no exposure light. Further, the light-transmitting layer 25 above the hole portion 11A as a region that transmits exposure light corresponds to that part of the substratum which is not covered with the resist-material layer 20. And, in [Step-760], the thick-film-paste-material layer 22 is irradiated with exposure light on the reverse-surface side of the substratum, that is, on the reverse-surface side (second-surface side) of the supporting member 10. In the above manner, the method of patterning a thick-film-paste-material layer according to the second aspect of the present invention, can be accomplished.

[Step-770]

Then, the ashing treatment is carried out in the same manner as in [Step-240] of Example 2, to remove the modified layer 21 in the surface of the resist-material layer, which modified layer 21 has been formed in [Step-750]. Then, the resist-material layer 20 is removed with acetone. Since the modified layer 21 in the surface of the resist-material layer is removed by the ashing treatment, the resist-material layer 20 can be reliably removed. Then, the thick-film-paste-material layer 22 is fired in the same manner as in [Step-380] of Example 3.

[Step-780]

Then, the display is assembled in the same manner as in [Step-390] of Example 3.

When [Step-750] was omitted for comparison, the resist-material layer 20 disappeared upon completion of [Step-760], and it was impossible to form any desired electron emitting portion 15. When the ashing treatment in [Step-770] was omitted, the resist-material layer 20 remained as a residue when the resist-material layer 20 was peeled off, and when the thick-film-paste-material layer 22 was fired, the resist-material layer 20 was carbonized and remained. On the other hand, when supersonic irradiation was employed in combination during the peeling of the resist-material layer 20 so that the resist-material layer 20 did not remain as a residue, the thick-film-paste-material layer 22 before the firing was peeled off from the light-transmitting layer 25.

EXAMPLE 8

Example 8 is a variant of Example 7 and concerns the manufacturing method-B of the present invention.

The method of manufacturing a field emission device and the method of manufacturing a display in Example 8 will be explained below with reference to FIGS. 20A, 20B, 21A and 21B.

[Step-800]

The "cathode-electrode-forming step" and the "light-transmitting-layer-forming step" are carried out in the same manner as in [Step-700].

[Step-810]

An insulating layer 12B made of a non-photosensitive material transmittable to exposure light is formed on the entire surface in the same manner as in [Step-510] of Example 5. That is, the "step of forming an insulating layer made of a non-photosensitive material transmittable to exposure light" is carried out.

[Step-820]

Then, a gate electrode 13B is formed on the insulating layer in the same manner as in [Step-520] of Example 5. The gate electrode 13B is made of a non-photosensitive material transmittable to exposure light and extends in a second direction different from the first direction. That is, the "step of forming a gate electrode made of a non-photosensitive material" is carried out.

[Step-830]

Figure 20A:
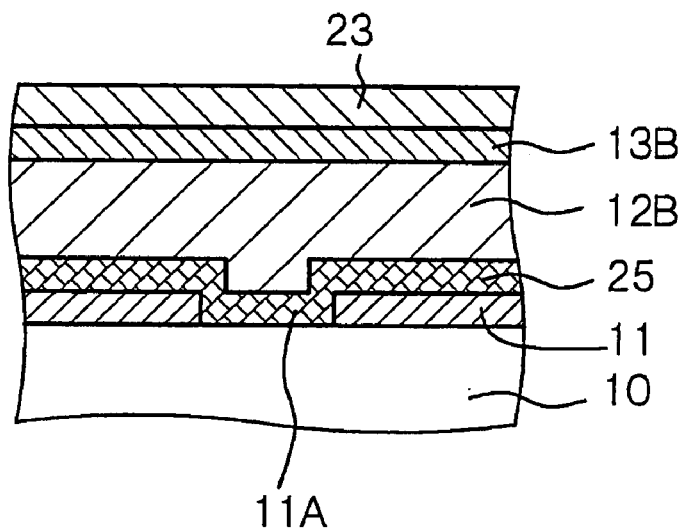
FIGS. 20A and 20B are schematic partial end views of a supporting member, etc., for explaining a method of manufacturing a cold cathode field emission device in Example 8.
Figure 20B:
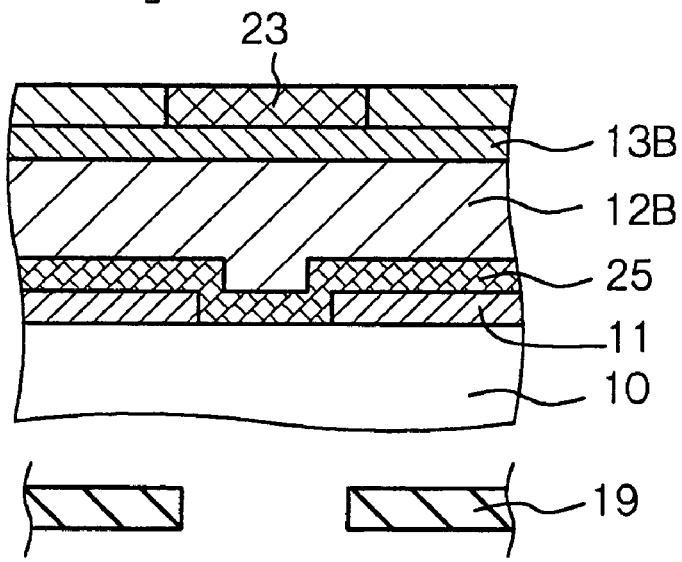

Then, an etching mask layer 23 made of a positive-type resist material is formed on the gate electrode 13B and the insulating layer 12B in the same manner as in [Step-530] of Example 5 (see FIG. 20A). That is, the "step of forming an etching mask layer made of a resist material on the gate electrode and the insulating layer" is carried out.

[Step-840]

Figure 21A:
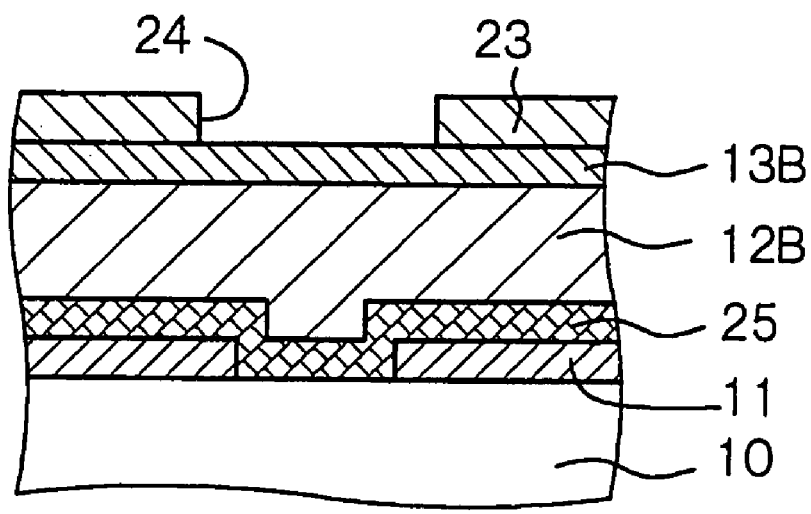
FIGS. 21A and 21B, following

Then, the reverse surface (second surface) of the supporting member 10 is irradiated with exposure light with using the hole portion 11A as an exposure mask, to expose the etching mask layer 23 to the exposure light in the same manner as in [Step-540] of Example 5 (see FIG. 20B), and then, the etching mask layer 23 is developed, thereby to form an etching-mask-layer opening 24 through that portion of the etching mask layer which portion is above the hole portion 11A (see FIG. 21A). That is, the "step of forming an etching-mask-layer opening through an etching mask layer by exposure on the reverse-surface side" is carried out. When the reverse surface (second surface) of the supporting member 10 is irradiated with exposure light with using the hole portion 11A as an exposure mask, preferably, an exposure light shielding material (mask 19) is arranged on the reverse-surface side (second-surface side) of the supporting member 10 so that a portion of the etching mask layer 23, which portion is not to be exposed to the exposure light, is not exposed to the exposure light.

[Step-850]

Figure 21B:
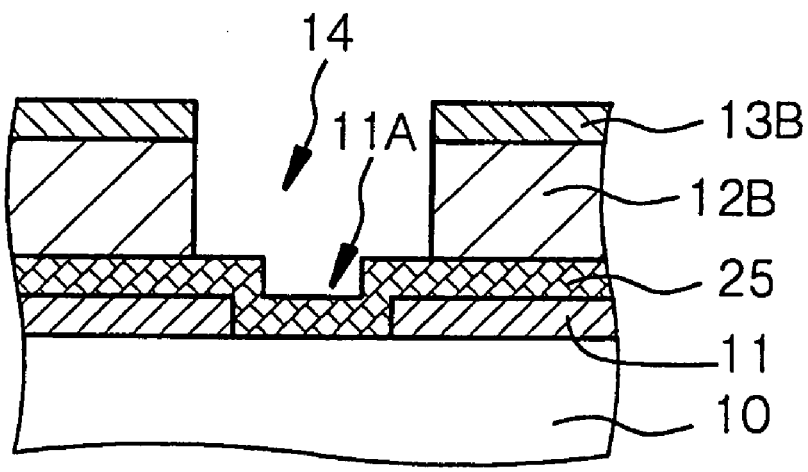

Then, the gate electrode 13B and the insulating layer 12B below the etching-mask-layer opening 24 are etched with using the etching mask layer 23 in the same manner as in [Step-550] of Example 5, and then the etching mask layer 23 is removed, whereby an opening portion 14 is formed through the insulating layer 12B and the gate electrode 13B above the hole portion 11A, and the light-transmitting layer 25 is exposed in the bottom portion of the opening portion 14 (see FIG. 21B). Preferably, the opening portion 14 has a larger diameter than the hole portion 11A, and such an opening portion 14 can be attained by over-etching the insulating layer 12B and the gate electrode 13. Alternatively, in [Step-840], there can be employed a method of carrying out the exposure of the etching mask layer 23 to excess (i.e., a method of carrying out over-exposure) and/or a method of carrying out the development of the etching mask layer 23 to excess (i.e., a method of carrying out over-development). The opening portion 14 is formed in a self-alignment manner with regard to the hole portion 11A.

[Step-860]

Then, [Step-740] to [Step-770] of Example 7 are carried out to complete a field emission device, and further the display is then assembled in the same manner as in [Step-390] of Example 3.

EXAMPLE 9

Example 9 is also a variant of Example 7 and concerns the manufacturing method-C of the present invention.

The method of manufacturing a field emission device and the method of manufacturing a display in Example 9 will be explained below with reference to FIGS. 22A, 22B and 23.

[Step-900]

The "cathode-electrode-forming step" and the "light-transmitting-layer-forming step" are carried out in the same manner as in [Step-700] of Example 7. The cathode electrode 11 extends in a first direction (direction perpendicular to the paper surface of the drawings).

[Step-910]

Then, an insulating layer 12C made of a photosensitive material is formed on the entire surface in the same manner as in [Step-610] of Example 6. That is, the "step of forming an insulating layer made of a photosensitive material" is carried out.

[Step-920]

Then, a gate electrode 13C is formed on the insulating layer 12C in the same manner as in [Step-620] of Example 6. The gate electrode 13C is made of a photosensitive material transmittable to exposure light and extends in a second direction (leftward and rightward on the paper surface of the drawings) different from the first direction (see FIG. 22A). That is, the "step of forming a gate electrode made of a photosensitive material that transmits exposure light" is carried out.

[Step-930]

Figure 23:
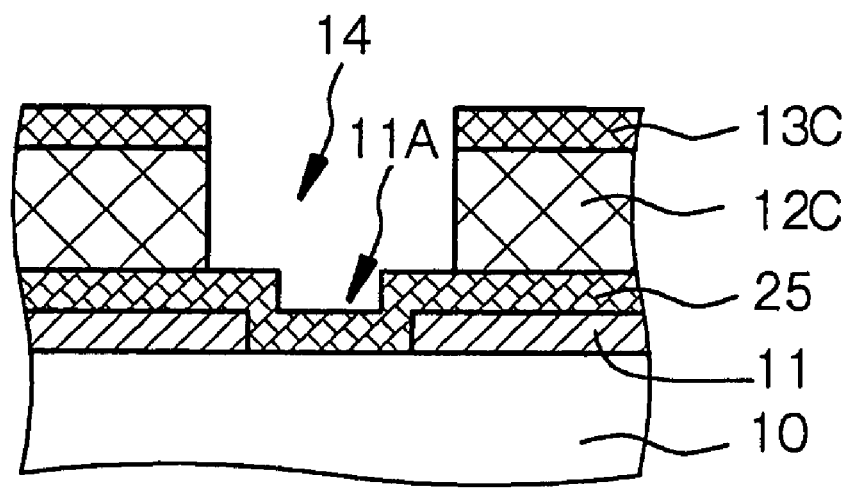
FIG. 23, following

Then, the gate electrode 13C and the insulating layer 12C are irradiated with exposure light (specifically, ultraviolet light) on the front-surface side (first-surface side) of the supporting member 10 (see FIG. 22B), and then the gate electrode 13C and the insulating layer 12C are developed, thereby to form an opening portion 14 through the gate electrode 13C and the insulating layer 12C above the hole portion 11A and to expose a light-transmitting layer 25 in the bottom portion of the opening portion 14 (see FIG. 23). That is, the "step of forming an opening portion by exposure light on the front-surface side" is carried out. In the exposure of the gate electrode 13C and the insulating layer 12C, an exposure light shielding material (mask 19) having a larger exposure light shielding portion than the hole portion 11A is arranged on the front surface (first surface) of the supporting member 10.

[Step-940]

Then, [Step-740] to [Step-770] of Example 7 are carried out to complete a field emission device, and further the display is then assembled in the same manner as in [Step-390] of Example 3.

The materials for constituting the insulating layer and the gate electrode may be positive-type materials. In this case, in [Step-930], those portions of the insulating layer and the gate electrode which portions are exposed to exposure light can be portions where the opening portion is to be formed.

EXAMPLE 10

Example 10 concerns the method of manufacturing a field emission device and the method of manufacturing a display according to the fourth aspect of the present invention. The displays in Examples 12 and 14 to be explained later are substantially the same as the field emission device and the display in Example 10 in constitution and structure, so that detailed explanations of the displays in Examples 12 and 14 will be omitted.

The display in Example 10 is a so-called two-electrode-type display constituted of a cathode electrode and an anode electrode, and FIG. 24 shows a schematic partial cross-sectional view thereof. The field emission device in the above display comprises a cathode electrode 11 formed on a supporting member 10 and an electron emitting portion 15 formed on the cathode electrode 11. Unlike the display shown in FIG. 3, an anode electrode 33A constituting an anode panel AP is in the form of a stripe. The projection image of the cathode panel 11 in the form of a stripe and the projection image of the anode electrode 33A in the form of a stripe cross each other at right angles. Specifically, the cathode electrode 11 extends in the direction perpendicular to the paper surface of the drawings, and the anode electrode 33A extends leftward and rightward on the paper surface of the drawings. In a cathode panel CP in the display, a great number of electron emitting regions constituted of a plurality of the above field emission devices each are formed in the form of a two-dimensional matrix in an effective field.

In the above display, electrons are emitted from the electron emitting portion 15 on the basis of a quantum effect due to an electric field formed by the anode electrode 33A, and the electrons are drawn to the anode electrode 33A to collide with a phosphor layer 31. That is, the display is driven by a so-called simple matrix method in which electrons are emitted from the electron emitting portion 15 positioned in a region where the projection image of the anode electrode 33A and the projection image of the cathode electrode 11 overlap (anode electrode/cathode electrode overlap region). Specifically, a relatively negative voltage is applied to the cathode electrode 11 from a cathode-electrode control circuit 40, and a relatively positive voltage is applied to the anode electrode 33A from an anode-electrode control circuit 42. As a result, electrons are emitted into the vacuum space selectively from the electron emitting portion 15 positioned in the anode electrode/cathode electrode overlap region of a column-selected cathode electrode and a row-selected anode electrode (or a row-selected cathode electrode and a column-selected anode electrode), and the electrons are drawn toward the anode electrode 33A and collide with the phosphor layer 31 constituting the anode panel AP, to excite and cause the phosphor layer 31 to emit light.

The method of manufacturing a field emission device and the method of manufacturing a display in Example 10 will be explained below with reference to FIGS. 25A to 25D.

First, a cathode electrode 11 extending in a first direction (leftward and rightward on the paper surface of the drawings) is formed on a supporting member 10 in the same manner as in [Step-300] of Example 3.

[Step-1010]

Then, a resist-material layer 20 is formed on the entire surface, and the resist-material layer 20 is patterned to obtain the resist-material layer 20 in a state where part of the cathode electrode 11 is exposed. Specifically, in the same manner as in Example 1, the resist-material layer 20 made of a positive-type resist material (THMR-iP5720HP, supplied by Tokyo Ouka Kogyo Kabushiki Kaisha) produced from a novolak resin and 2-heptanone is formed on the entire surface by a spin coating method, and then, the resist-material layer 20 is patterned by a lithography technique, to expose part (region where an electron emitting portion 15 is to be formed) of the cathode electrode 11.

[Step-1020]

Then, the surface of the resist-material layer 20 is modified in the same manner as in [Step-111] of Example 1, to form a modified layer 21.

[Step-1030]

Figure 25A:
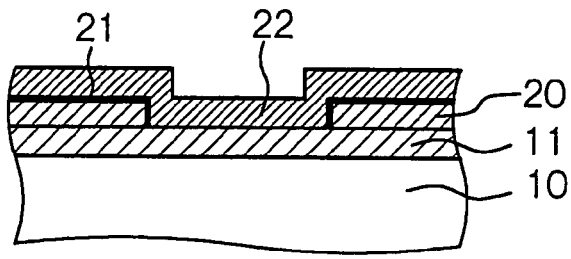
FIGS. 25A to 25D are schematic partial end views of a supporting member, etc., for explaining a method of manufacturing a cold cathode field emission device in Example 10.
Figure 25B:
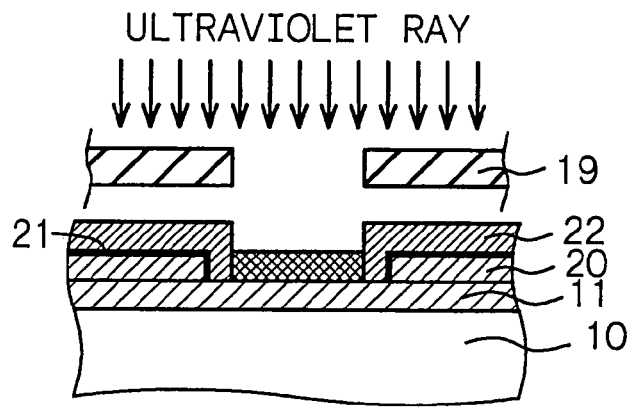
Figure 25C:
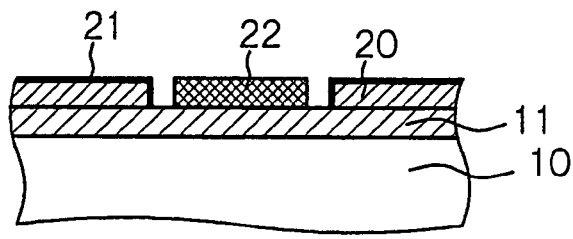

Then, a photosensitive thick-film-paste-material layer 22 is formed in the same manner as in [Step-350] of Example 3 (see FIG. 25A). Specifically, the photosensitive thick-film-paste-material layer 22 is formed on the entire surface by a screen printing method.

[Step-1040]

Then, the thick-film-paste-material layer 22 is irradiated with exposure light on the front-surface side (first-surface side) of the supporting member 10 (see FIG. 25B), and then the thick-film-paste-material layer 22 is developed to remove an unexposed thick-film-paste-material layer 22. Then, the thick-film-paste-material layer 22 is dried at 80° C. for 20 minutes, to remove the solvent in the thick-film-paste-material layer 22. In the above manner, the thick-film-paste-material layer 22 is left as an electron emitting portion 15 on the cathode electrode 11 that is not covered with the resist-material layer 20 (see FIG. 25C). Reference numeral 19 indicates an exposure light shielding material (mask).

[Step-1050]

Figure 25D:
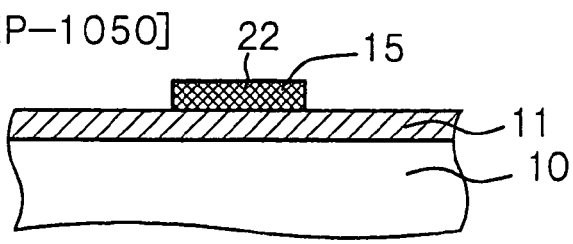

Then, the ashing treatment is carried out in the same manner as in [Step-240] of Example 2, to remove the modified layer 21 in the surface of the resist-material layer which modified layer 21 has been formed in [Step-1020], and then the resist-material layer 20 is removed with acetone (see FIG. 25D). Since the modified layer 21 in the surface of the resist-material layer is removed by the ashing treatment, the resist-material layer 20 can be reliably removed. Then, the thick-film-paste-material layer 22 is fired in the same manner as in [Step-380] of Example 3.

[Step-1060]

Then, the display is assembled in the same manner as in [Step-390] of Example 3.

When [Step-1020] was omitted for comparison, the resist-material layer 20 disappeared upon completion of [Step-1040], and it was impossible to form any desired electron emitting portion 15. When the ashing treatment in [Step-1050] was omitted, the resist-material layer 20 remained as a residue when the resist-material layer 20 was peeled off, and when the thick-film-paste-material layer 22 was fired in [Step-1050], the resist-material layer 20 was carbonized and remained. On the other hand, when supersonic irradiation was employed in combination during the peeling of the resist-material layer 20 so that the resist-material layer 20 did not remain as a residue, the thick-film-paste-material layer 22 before the firing was peeled off from the cathode electrode 11.

EXAMPLE 11

Example 11 is concerns the method of manufacturing a field emission device and the method of manufacturing a display according to the fifth aspect of the present invention. The field emission device and display in Example 11 are substantially similar to the field emission device and display explained in Example 3 in constitution and structure, so that detailed explanations thereof will be omitted.

Figure 26A:
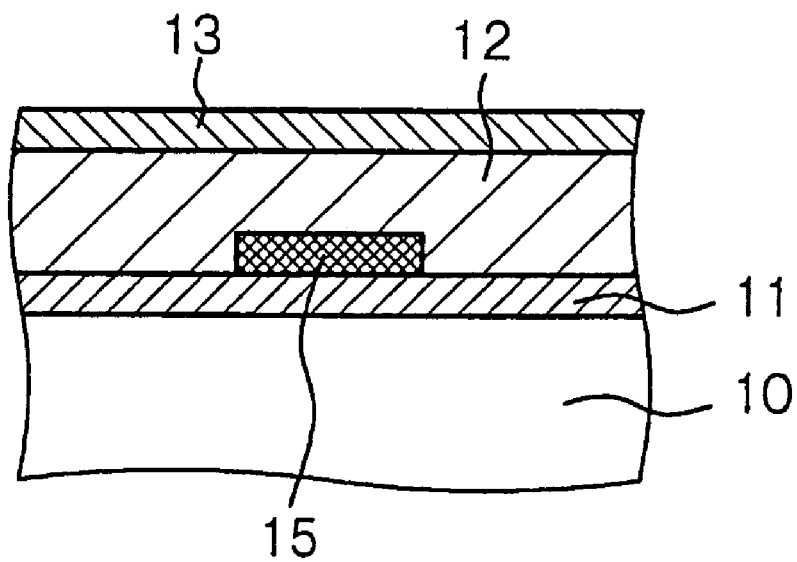
FIGS. 26A and 26B, following
Figure 26B:
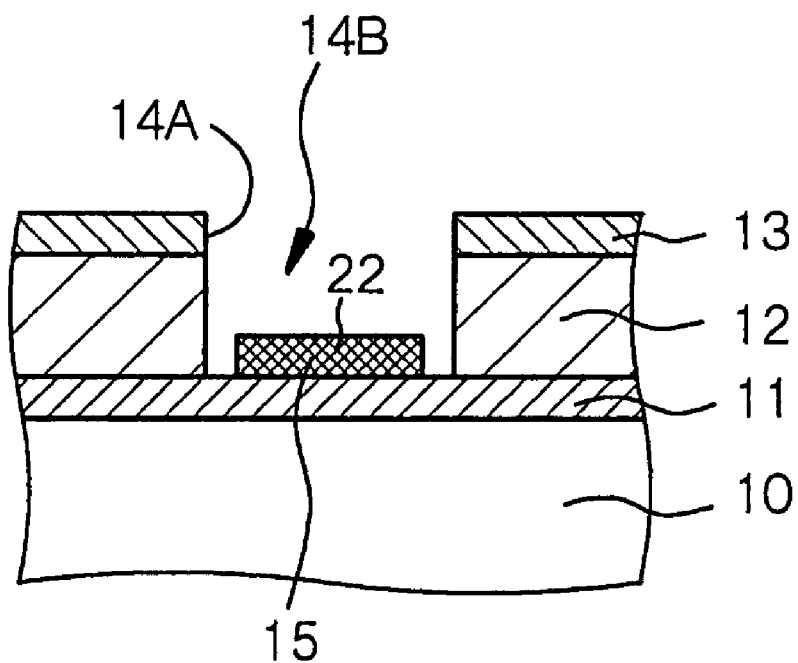

The method of manufacturing a field emission device and the method of manufacturing a display in Example 11 will be explained below with reference to FIGS. 26A and 26B.

[Step-1100]

First, [Step-1000] to [Step-1050] are carried out in the same manner as in Example 10.

[Step-1110]

Then, an insulating layer 12 is formed on the entire surface in the same manner as in [Step-310] of Example 3. Then, a gate electrode 13 extending in a second direction different from the first direction is formed on the insulating layer 12 in the same manner as in [Step-320] of Example 3 (see FIG. 26A). Then, an opening portion is formed through the gate electrode 13 and the insulating layer 12 (that is, a first opening portion 14A is formed through the gate electrode and a second opening portion 14B is formed through the insulating layer 12), and an electron emitting portion 15 is exposed in the bottom portion of the opening portion (see FIG. 26B).

[Step-1120]

Then, the display is assembled in the same manner as in [Step-390] of Example 3.

EXAMPLE 12

Example 12 concerns the method of manufacturing a field emission device and the method of manufacturing a display according to the sixth aspect of the present invention. In Example 12, a hole portion 11A reaching a supporting member 10 is formed in that portion of the cathode electrode 11 which portion is positioned in the bottom portion of the opening portion 14. An electron emitting portion 15 is formed so as to spread from that portion of the cathode electrode 11 which portion is positioned in the bottom portion of the opening portion 14 to the inside of the hole portion 11A.

The method of manufacturing a field emission device and the method of manufacturing a display in Example 12 will be explained below with reference to FIGS. 27A to 27C, 28A and 28B.

[Step-1200]

First, the "cathode-electrode-forming step" is carried out in the same manner as in [Step-400] of Example 4.

[Step-1210]

Then, a resist-material layer 20 is formed on the entire surface in the same manner as in [Step-1010] of Example 10, and then the resist-material layer 20 is patterned, thereby to obtain the resist-material layer 20 in a state where part of the cathode electrode 11 is exposed. The hole portion 11A is not covered with the resist-material layer 20.

[Step-1220]

Then, the surface of the resist-material layer 20 is modified in the same manner as in [Step-111] of Example 1 to form a modified layer 21.

[Step-1230]

Figure 27A:
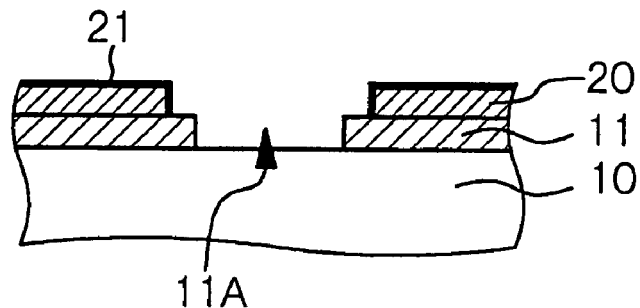
FIGS. 27A to 27C are schematic partial end views of a supporting member, etc., for explaining a method of manufacturing a cold cathode field emission device in Example 12.
Figure 27B:
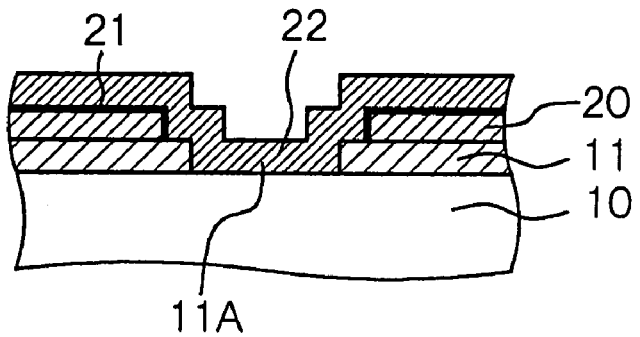

Then, a photosensitive thick-film-paste-material layer 22 is formed in the same manner as in [Step-350] of Example 3 (see FIG. 27B). Specifically, the photosensitive thick-film-paste-material layer 22 is printed on the entire surface by a screen printing method.

[Step-1240]

Figure 27C:
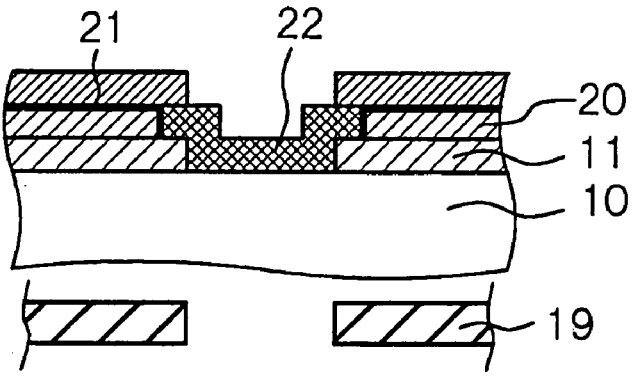

Then, the reverse surface (second surface) of the supporting member 10 is irradiated with exposure light (specifically, ultraviolet ray) with using the hole portion 11A as an exposure mask in the same manner as in [Step-470] of Example 4, to expose that portion of the thick-film-paste-material layer 22 which portion is above the hole portion 11A to the exposure light (see FIG. 27C). When the reverse surface (second surface) of the supporting member 10 is irradiated with exposure light with using the hole portion 11A as an exposure mask, preferably, an exposure light shielding material (mask 19) is arranged on the reverse-surface side (second-surface side) of the supporting member 10 so that a portion of the thick-film-paste-material layer 22, which portion is not to be exposed to the exposure light, is not exposed to the exposure light. Then, the thick-film-paste-material layer 22 is developed to remove an unexposed thick-film-paste-material layer 22, and the thick-filmpaste-material layer 22 is dried at 80° C. for 20 minutes to remove the solvent in the thick-film-paste-material layer 22. In this manner, that portion of the thick-film-paste-material layer 22 which portion is above the hole portion 11A is left, thereby to form an electron emitting portion 15 that spreads from the cathode electrode 11 to the inside of the hole portion 11A and is constituted of the thick-film-paste-material layer 22 (see FIG. 28A). Since the electron emitting portion 15 can be obtained by a reverse-surface exposure method, the electron emitting portion 15 can be formed in a self-alignment manner with regard to the hole portion 11A.

[Step-1250]

Figure 28A:
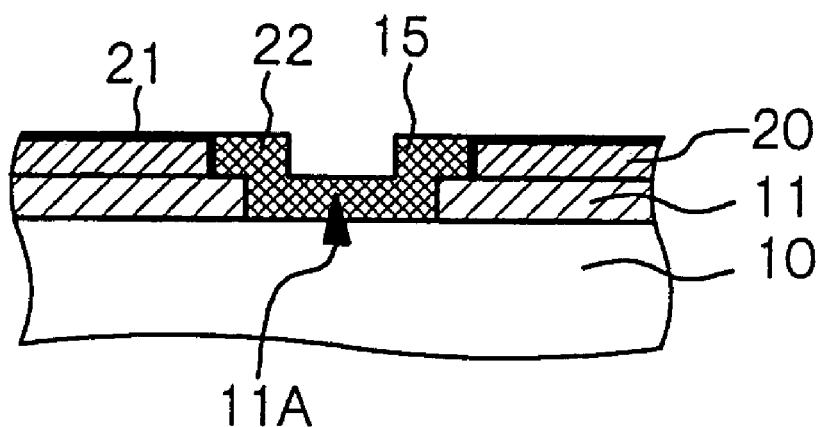
FIGS. 28A and 28B, following
Figure 28B:
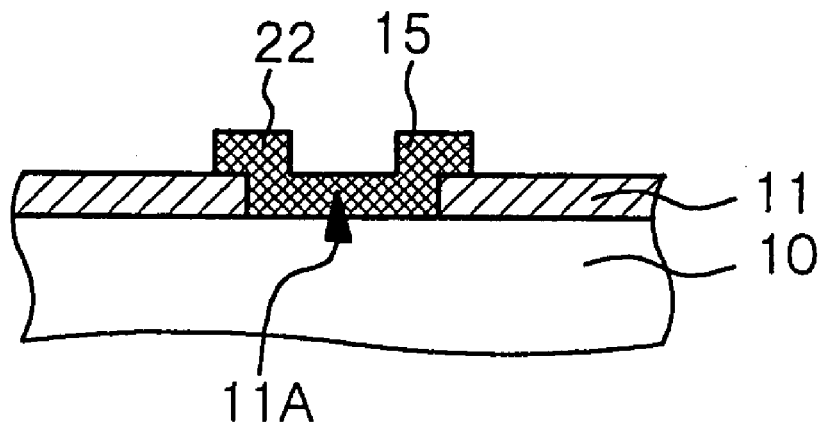

Then, the ashing treatment is carried out in the same manner as in [Step-240] of Example 2, to remove the modified layer 21 in the surface of the resist-material layer which modified layer 21 has been formed in [Step-1220], and the resist-material layer 20 is removed with acetone (see FIG. 28B). Since the modified layer 21 in the surface of the resist-material layer is removed by the ashing treatment, the resist-material layer 20 can be reliably removed. Then, the thick-film-paste-material layer 22 is fired in the same manner as in [Step-380] of Example 3.

[Step-1260]

Then, the display is assembled in the same manner as in [Step-390] of Example 3.

When [Step-1220] was omitted for comparison, the resist-material layer 20 disappeared upon completion of [Step-1240], and it was impossible to form any desired electron emitting portion 15. When the ashing treatment in [Step-1250] was omitted, the resist-material layer 20 remained as a residue when the resist-material layer 20 was peeled off, and when the thick-film-paste-material layer 22 was fired in [Step-1250], the resist-material layer 20 was carbonized and remained. On the other hand, when supersonic irradiation was employed in combination during the peeling of the resist-material layer 20 so that the resist-material layer 20 did not remain as a residue, the thick-film-paste-material layer 22 before the firing was peeled off from the cathode electrode 11 and the supporting member 10.

EXAMPLE 13

Example 13 concerns the method of manufacturing a field emission device and the method of manufacturing a display according to the seventh aspect of the present invention. The field emission device and display in Example 13 are substantially similar to the field emission device and display explained in Example 4 in constitution and structure, so that detailed explanations thereof will be omitted.

Figure 29A:
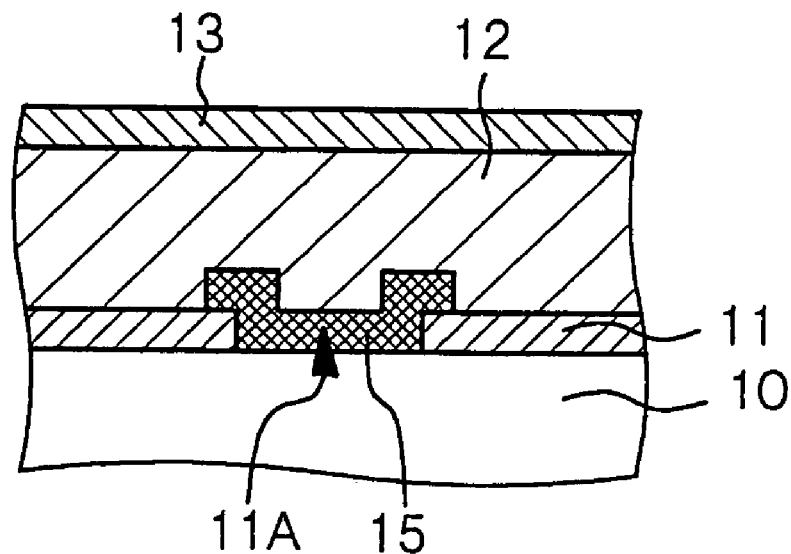
FIGS. 29A and 29B, following
Figure 29B:
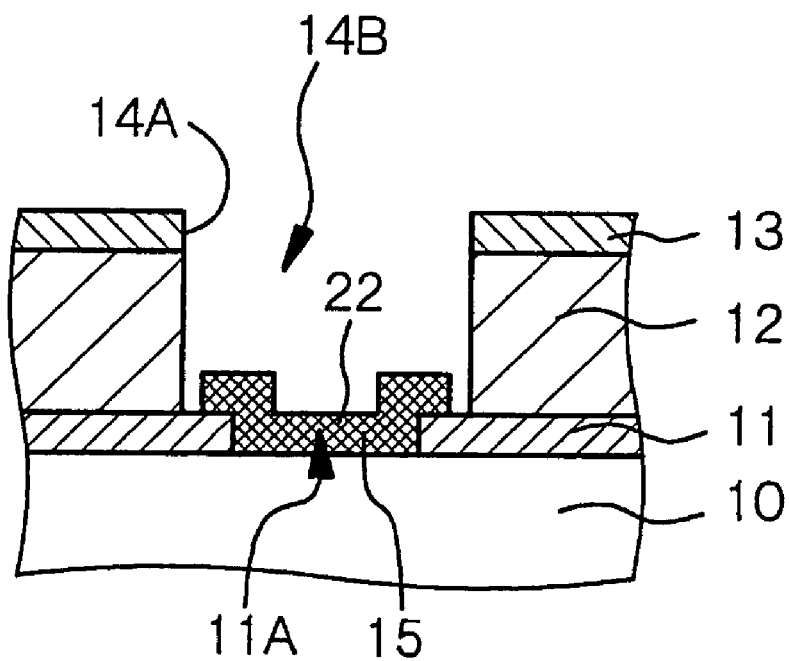

The method of manufacturing a field emission device and the method of manufacturing a display in Example 13 will be explained below with reference to FIGS. 29A and 29B.

[Step-1300]

First, [Step-1200] to [Step-1250] of Example 12 are carried out.

[Step-1310]

Then, an insulating layer 12 is formed on the entire surface in the same manner as in [Step-310] of Example 3. Then, a gate electrode 13 extending in a second direction different from the first direction is formed on the insulating layer 12 in the same manner as in [Step-320] of Example 3 (see FIG. 29A). Then, an opening portion is formed through the gate electrode 13 and the insulating layer 12 (that is, a first opening portion 14A is formed through the gate electrode and further, a second opening portion 14B is formed through the insulating layer 12), and an electron emitting portion 15 is exposed in the bottom portion of the opening portion (see FIG. 29B).

[Step-1320]

Then, the display is assembled in the same manner as in [Step-390] of Example 3.

EXAMPLE 14

Example 14 concerns the method of manufacturing a field emission device and the method of manufacturing a display according to the eighth aspect of the present invention. In Example 14, a hole portion 11A reaching a supporting member 10 is formed through that portion of a cathode electrode 11 which portion is positioned in the bottom portion of an opening portion 14, and formed at least in the hole portion 11A is a light-transmitting layer 25 being made of a conductive material or resistive material which transmits exposure light. An electron emitting portion 15 is formed on the light-transmitting layer 25 positioned in the bottom portion of the opening portion 14.

The method of manufacturing a field emission device and the method of manufacturing a display in Example 14 will be explained below with reference to FIGS. 30A, 30B and 31A to 31C.

[Step-1400]

First, the "cathode-electrode-forming step" and the "light-transmitting-layer-forming step" are carried out in the same manner as in [Step-700] of Example 7.

[Step-1410]

Then, a resist-material layer 20 is formed on the entire surface in the same manner as in [Step-1010] of Example 10, and then the resist-material layer 20 is patterned, thereby to obtain the resist-material layer 20 in which part of the light-transmitting layer 25 is exposed. The light-transmitting layer 25 above the hole portion 11A is not covered with the resist-material layer 20.

[Step-1420]

Figure 30A:
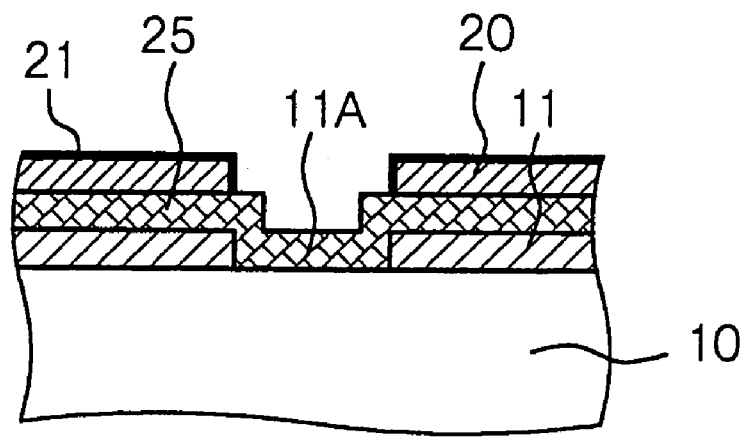
FIGS. 30A and 30B are schematic partial end views of a supporting member, etc., for explaining a method of manufacturing a cold cathode field emission device in Example 14.
Figure 30B:
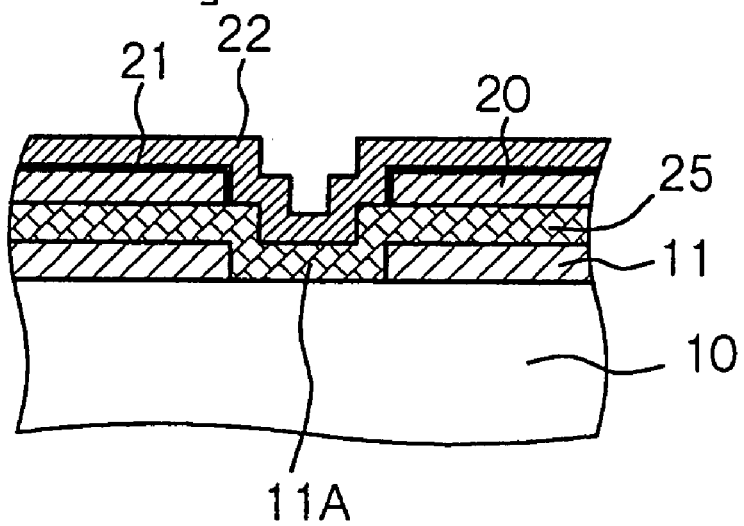

Then, the surface of the resist-material layer 20 is modified in the same manner as in [Step-110] of Example 1, to form a modified layer 21 (see FIG. 30A).

[Step-1430]

Then, a photosensitive thick-film-paste-material layer 22 is formed in the same manner as in [Step-350] of Example 3. Specifically, the photosensitive thick-film-paste-material layer 22 is printed on the entire surface by a screen printing method (see FIG. 30B). Then, the reverse surface (second surface) of the supporting member 10 is irradiated with exposure light (specifically, ultraviolet ray) with using the hole portion 11A as an exposure mask, to expose that portion of the thick-film-paste-material layer 22 which portion is above the hole portion 11A (see FIG. 31A). When the reverse surface (second surface) of the supporting member 10 is irradiated with exposure light with using the hole portion 11A as an exposure mask, preferably, an exposure light shielding material (mask 19) is arranged on the reverse surface (second surface) of the supporting member 10 so that a portion of the thick-film-paste-material layer 22, which portion is not to be exposed to the exposure light, is not exposed to the exposure light. Then, the thick-film-paste-material layer 22 is developed to remove an unexposed thick-film-paste-material layer 22, and then the thick-film-paste-material layer 22 is dried at 80° C. for 20 minutes to remove the solvent in the thick-film-paste-material layer 22. In the above manner, that portion of the thick-film-paste-material layer 22 which portion is above the hole portion 11A is left, and the electron emitting portion 15 constituted of the thick-film-paste-material layer 22 is formed on the light-transmitting layer 25 (see FIG. 31B). Since the electron emitting portion 15 can be obtained by a reverse-surface exposure method, the electron emitting portion 15 can be formed in a self-alignment manner with regard to the hole portion 11A.

[Step-1440]

Figure 31A:
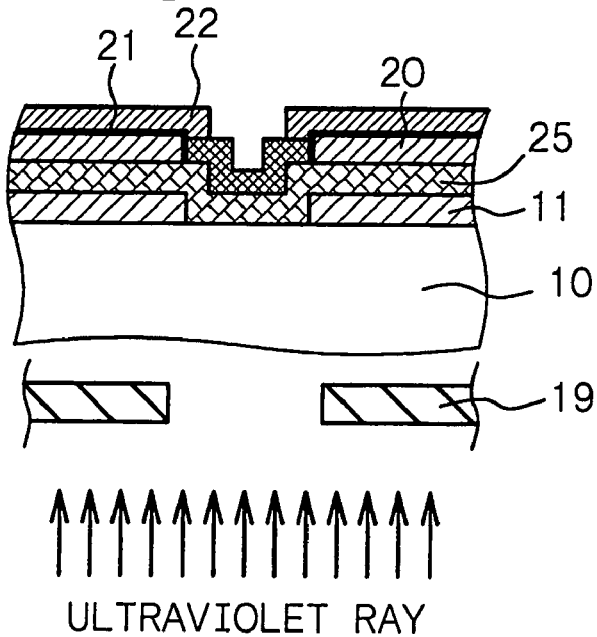
FIGS. 31A to 31C, following
Figure 31B:
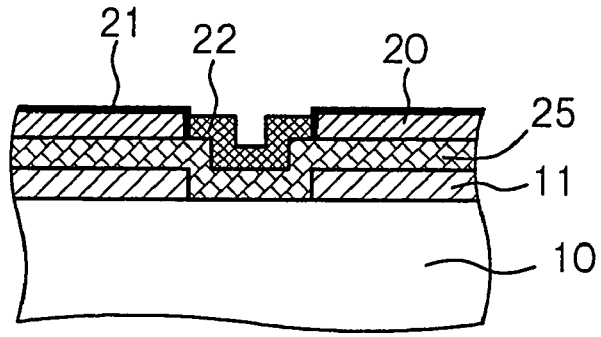
Figure 31C:
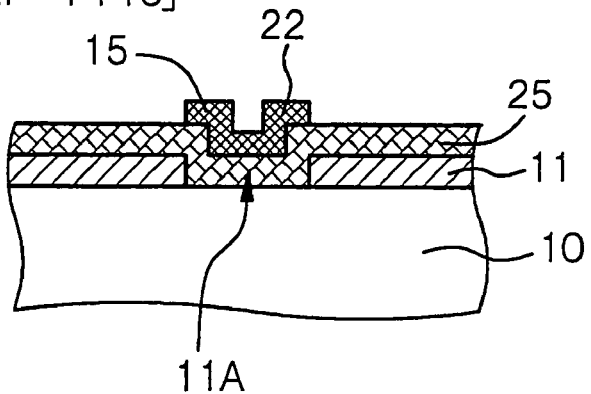

Then, the ashing treatment is carried out in the same manner as in [Step-240] of Example 2 to remove the modified layer in the surface of the resist-material layer, which modified layer 21 has been formed in [Step-1420], and then the resist-material layer 20 is removed with acetone (see FIG. 31C). Since the modified layer 21 in the surface of the resist-material layer is removed by the ashing treatment, the resist-material layer 20 can be reliably removed. Then, the thick-film-paste-material layer 22 is fired in the same manner as in [Step-380] of Example 3.

[Step-1450]

Then, the display is assembled in the same manner as in [Step-390] of Example 3.

When [Step-1420] was omitted for comparison, the resist-material layer 20 disappeared upon completion of [Step-1430], and it was impossible to form any desired electron emitting portion 15. When the ashing treatment in [Step-1440] was omitted, the resist-material layer 20 remained as a residue when the resist-material layer 20 was peeled off, and when the thick-film-paste-material layer 22 was fired in [Step-1440], the resist-material layer 20 was carbonized and remained.

On the other hand, when supersonic irradiation was employed in combination during the peeling of the resist-material layer 20 so that the resist-material layer 20 did not remain as a residue, the thick-film-paste-material layer 22 before the firing was peeled off from the light-transmitting layer 25.

EXAMPLE 15

Example 15 concerns the method of manufacturing a field emission device and the method of manufacturing a display according to the ninth aspect of the present invention. The field emission device and the display in Example 15 are substantially similar to the field emission device and the display explained in Example 7 in constitution and structure, so that detailed explanations thereof will be omitted.

Figure 32A:
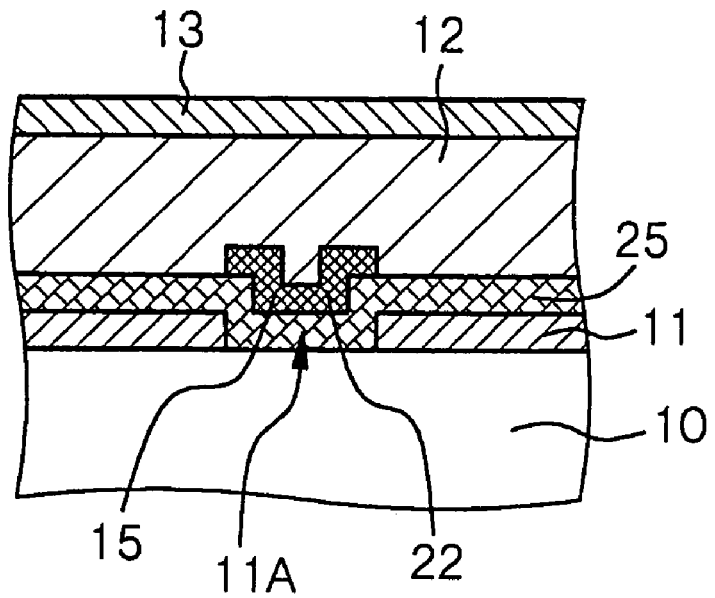
FIGS. 32A and 32B, following
Figure 32B:
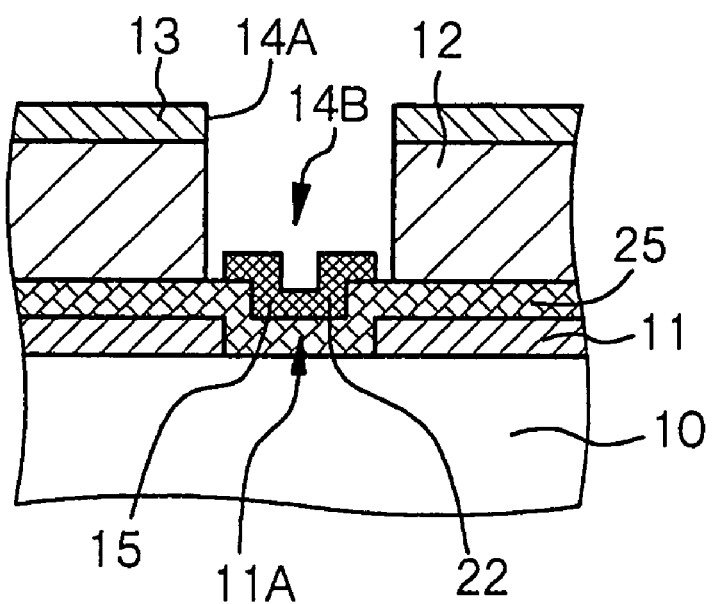
Figure 33:
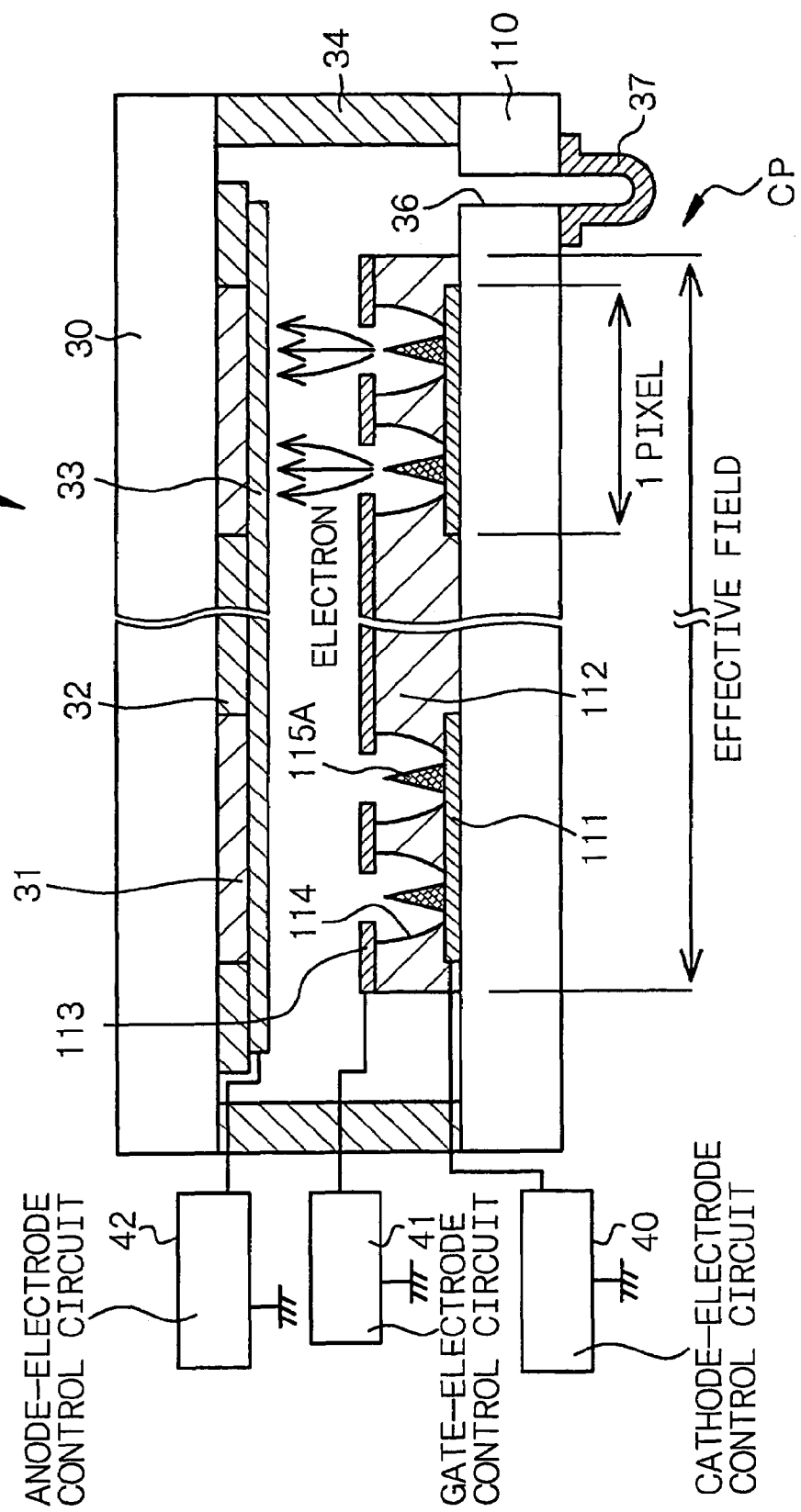
FIG. 33 is a schematic partial end view of a conventional cold cathode field emission display having a Spindt-type cold cathode field emission device.
Figure 35A:
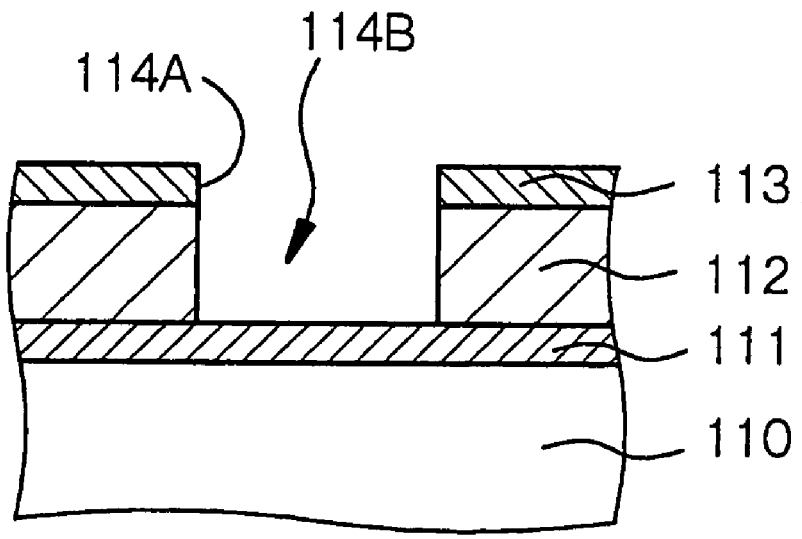
FIGS. 35A and 35B are schematic partial end views of a supporting member, etc., for explaining a method of manufacturing a Spindt-type cold cathode field emission device.
Figure 35B:
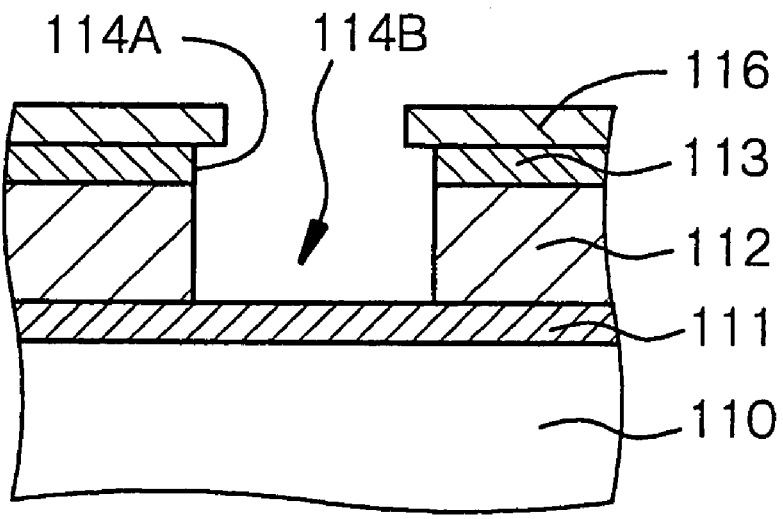
Figure 36A:
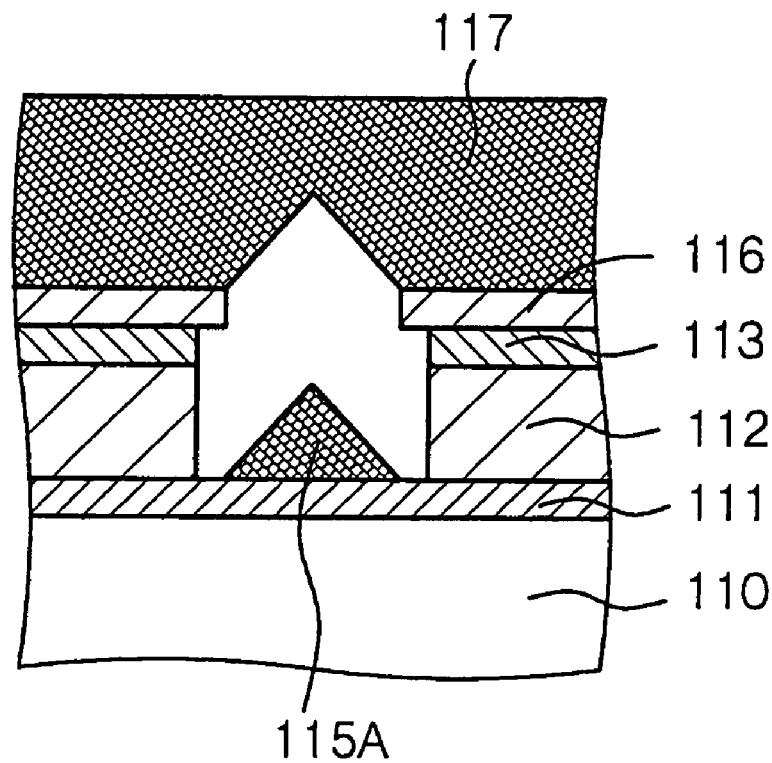
FIGS. 36A and 36B, following
Figure 36B:
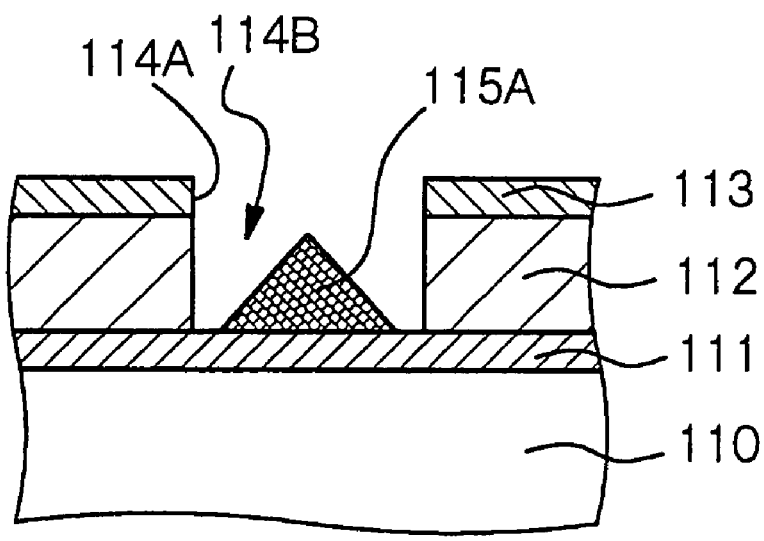
Figure 37A:
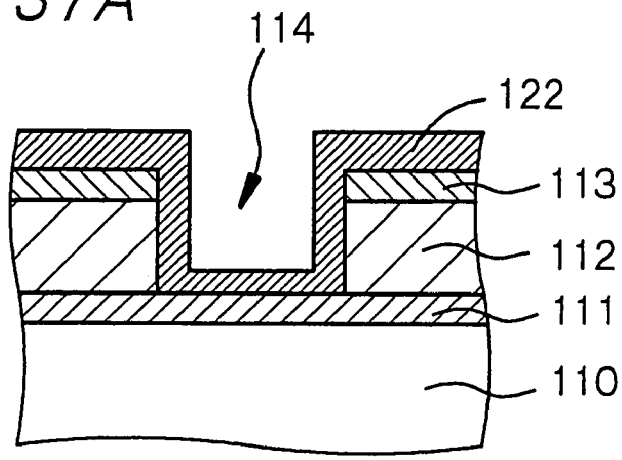
FIGS. 37A to 37C are schematic partial end views of a supporting member, etc., for explaining a conventional method of manufacturing a flat-type cold cathode field emission device.
Figure 37B:
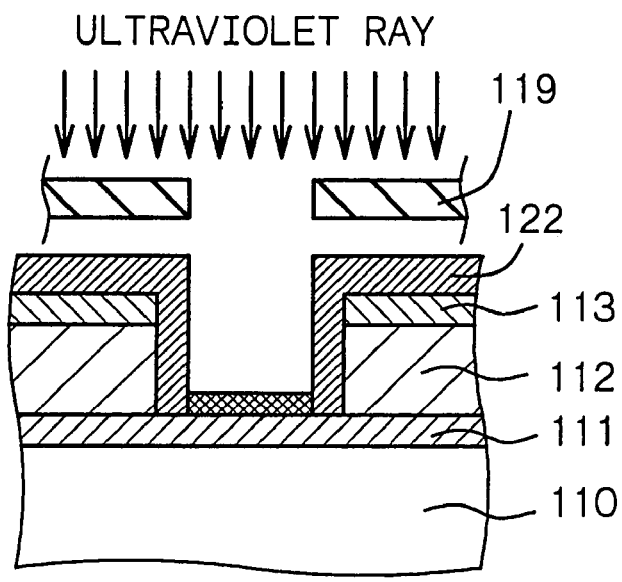
Figure 37C:
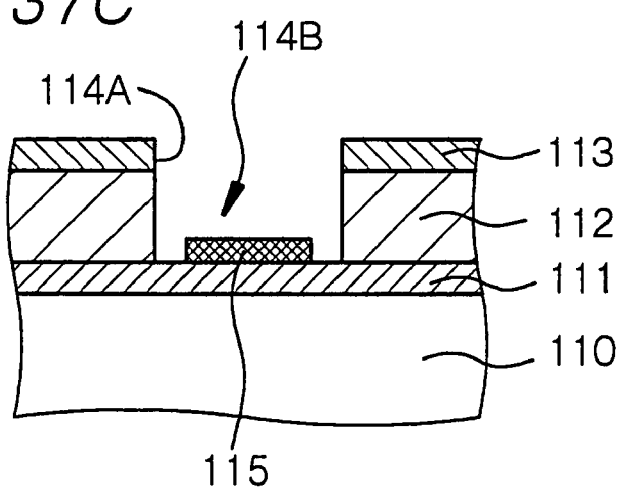
Figure 38A:
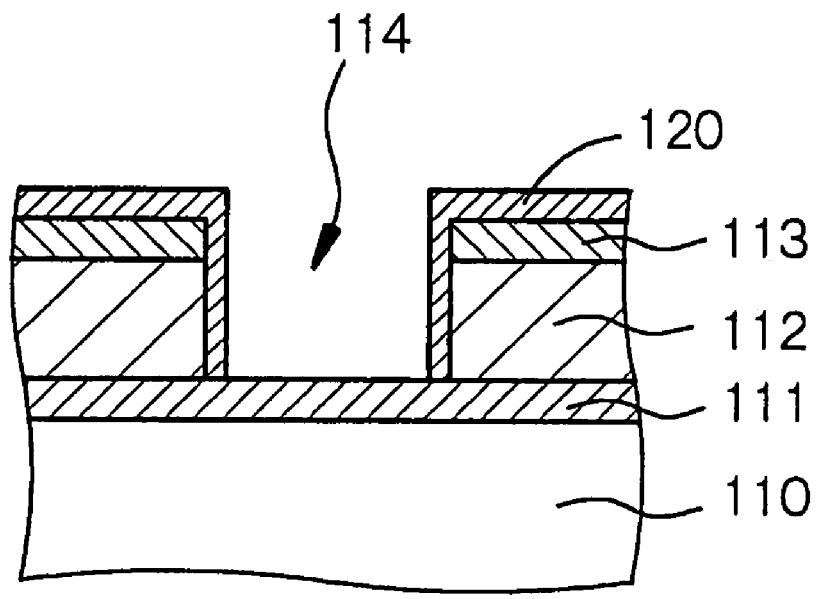
FIGS. 38A and 38B are schematic partial end views of a supporting member, etc., for explaining a variant of the conventional method of manufacturing a flat-type cold cathode field emission device.
Figure 38B:
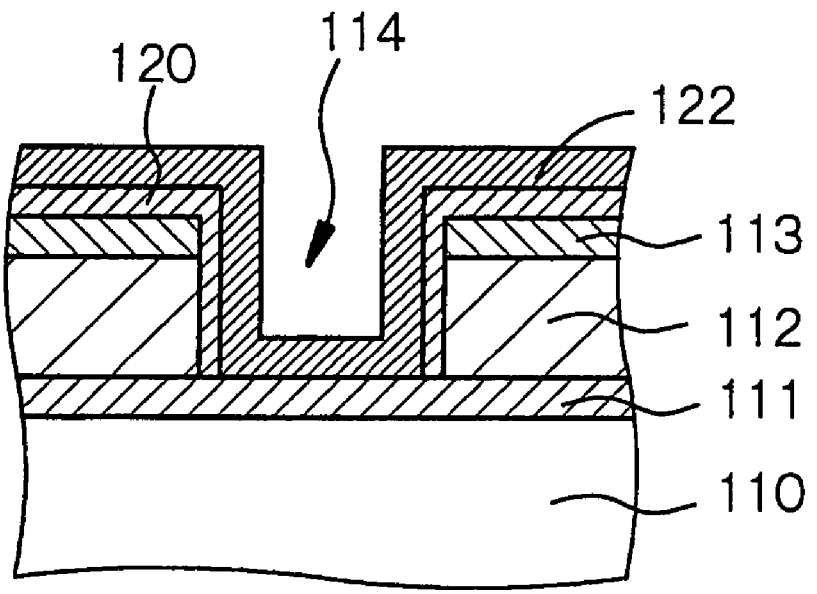

The method of manufacturing a field emission device and the method of manufacturing a display in Example 15 will be explained below with reference to FIGS. 32A and 32B.

[Step-1500]

[Step-1400] to [Step-1440] of Example 14 are carried out.

[Step-1510]

Then, an insulating layer 12 is formed on the entire surface in the same manner as in [Step-310] of Example 3. Then, a gate electrode 13 extending in a second direction different from the first direction is formed on the insulating layer 12 in the same manner as in [Step-320] of Example 3 (see FIG. 32A). Then, an opening portion is formed through the gate electrode 13 and the insulating layer 12 (that is, a first opening portion 14A is formed through the gate electrode and further, a second opening portion 14B is formed through the insulating layer 12), and an electron emitting portion 15 is exposed in the bottom portion of the opening portion (see FIG. 32B).

[Step-1520]

Then, the display is assembled in the same manner as in [Step-390] of Example 3.

While the present invention has been explained on the basis of preferred Examples, the present invention shall not be limited thereto. The constitutions and structures explained with regard to the anode panel, the cathode panel, the displays and the field emission devices in Examples are given as examples and may be modified as required. The manufacturing method, various conditions and materials explained with regard to the anode panel, the cathode panel, the displays and the field emission devices are given as examples and may be modified as required. Further, the various materials used in the manufacture of the anode panels and the cathode panels are also given as examples and may be changed as required. With regard to the display, color displays are explained as examples, while the display may be a monochromatic display.

A focus electrode may be formed in the three-electrodes-type display. The above focus electrode is provided for converging the pass of electrons which are emitted through the opening portion and attracted toward the anode electrode so that the brightness can be improved and that an optical crosstalk among neighboring pixels can be prevented. The focus electrode is effective particularly for a so-called high-voltage-type display in which the anode electrode and the cathode electrode have a potential difference on the order of several kilovolts and have a relatively large distance from one to the other. A relatively negative voltage is applied to the focus electrode from a focus-electrode control circuit. It is not necessarily required to provide the focus electrode provided in every field emission device. For example, the focus electrode may be extended in a predetermined direction in which the field emission devices are arranged, so that a common focusing effect can be exerted on a plurality of the field emission devices.

One example of the focus electrode can be formed by forming an insulating film made, for example, of $SiO_2$ on each surface of a metal sheet made, for example, of 42% Ni—Fe alloy having a thickness of several tens micrometers, and then forming the opening portions in regions corresponding to pixels by punching or etching. And, the cathode panel, the metal sheet and the anode panel are stacked, a frame is arranged in circumferential portions of the two panels, and a heat treatment is carried out to bond the insulating film formed on one surface of the metal sheet and the insulating layer and to bond the insulating film formed on the other surface of the metal sheet and the anode panel, whereby these members are integrated, followed by evacuating and sealing. Whereby, the display can be also completed.

In the three-electrodes-type display, the gate electrode can be formed so as to have a form in which the effective field is covered with one sheet of an electrically conductive material (having a first opening portion). In this case, a positive voltage is applied to the gate electrode. And, a switching element constituted, for example, of TFT is provided between the cathode electrode constituting a pixel and the cathode-electrode control circuit, and the voltage application state to the cathode electrode constituting the pixel is controlled by the operation of the above switching element, to control the light emission state of the pixel.

Alternatively, the cathode electrode can be formed so as to have a form in which the effective filed is covered with one sheet of an electrically conductive material. In this case, a voltage is applied to the cathode electrode. And, a switching element constituted, for example, of TFT is provided between the gate electrode constituting a pixel and the gate-electrode control circuit, and the voltage application state to the gate electrode constituting the pixel is controlled by the operation of the switching element, to control the light emission state of the pixel.

The anode electrode may be an anode electrode having a form in which the effective field is covered with one sheet-shaped electrically conductive material or may be an anode electrode having a form in which anode electrode units each of which corresponds to one or a plurality of electron emitting portions or one or a plurality of pixels are gathered. When the anode electrode has the former constitution, the anode electrode can be connected to the anode-electrode control circuit. When the anode electrode has the latter constitution, for example, each anode electrode unit can be connected to the anode-electrode control circuit.

In the so-called two-electrode-type display, there may be employed a constitution in which the cathode electrode is formed in the form of a rectangle corresponding to one pixel and each cathode electrode is connected to a cathode-electrode control circuit through a switching circuit constituted, for example, of TFT. In this case, the anode electrode may be an anode electrode having a type in which an effective field is covered with one sheet-like conductive material.

In the manufacturing method of the present invention, there is a case where a selective-growth-region-forming-layer and a selective-growth-region may be formed instead in the step of forming the thick-film-paste-material layer and the electron emitting portion. In the above case, there may be employed a constitution in which the selective-growth-region is finally formed, and then the electron emitting portion constituted of carbon-nanotubes, carbon-nanofibers or the like is formed on the selective-growth-region by a CVD method. The selective-growth-region can be formed from a material having catalytic activity for forming the electron emitting portion by a CVD method.

In the present invention, the surface of the resist-material layer is modified, and then the thick-film-paste-material layer is formed thereon, so that there can be reliably overcome the occurrence of the problem that the resist-material layer is dissolved due to the thick-film-paste-material layer. As a result, the patterning of the thick-film-paste-material layer and the manufacture of the cold cathode field emission device can be carried out easily, by simple methods and at a low cost, with using the resist-material layer. Further, since the resist-material layer is used, high-definition patterning can be performed. Moreover, when the cold cathode field emission display is a three-electrode-type, there can be reliably overcome the problem of occurrence of short-circuiting of the gate electrode and the cathode electrode by applying the method of manufacturing a cold cathode field emission device or the method of manufacturing a cold cathode field emission display provided by the present invention.

Further, in the manufacturing method of the present invention, when the electron emitting portion is formed by a reverse-surface exposure method, the electron emitting portion can be formed in a self-alignment manner in the bottom portion of the opening portion with regard to the opening portion formed, for example, through the gate electrode and the insulating layer. When the opening portion is formed by a reverse-surface exposure method, the opening portion can be formed through the gate electrode and the insulating layer in a self-alignment manner with regard to the hole portion. Unlike prior art, therefore, there can be suppressed the occurrence of display nonuniformity caused by a positional deviation caused between the exposure mask and the exposure site due to the deformation or shrinkage of the supporting member. Further, when the reverse-surface exposure method with using the hole portion as an exposure mask is employed, the number of photomasks is decreased, and the number of steps of positional adjustment during exposure can be decreased or omitted, so that a production cost is decreased, and that less expensive cold cathode field emission displays can be provided. Further, by high-definition patterning, the distance between the electron emitting portion and the gate electrode can be decreased, and the electron emission voltage can be decreased. Therefore, less expensive cold cathode field emission displays with low-power consumption can be manufactured. Further, since a screen printing method can be mainly employed, it is no longer necessary to use expensive semiconductor device manufacturing apparatuses in many steps, and finally, the manufacturing cost of cold cathode field emission displays can be decreased.

The invention claimed is:

1. A method of manufacturing a cold cathode field emission device comprising the steps of;
   (A) forming a cathode electrode on a front surface of a supporting member, said cathode electrode extending in a first direction,
   (B) forming an insulating layer on the entire surface,
   (C) forming a gate electrode on the insulating layer, said gate electrode extending in a second direction different from the first direction,
   (D) forming an opening portion through the gate electrode and the insulating layer to expose the cathode electrode in the bottom portion of the opening portion,
   (E) forming a resist-material layer covering the side wall of the opening portion, the gate electrode and the insulating layer,
   (F) modifying the surface of the resist-material layer,
   (G) forming a photosensitive thick-film-paste-material layer at least in the opening portion,
   (H) irradiating the front-surface side of the supporting member with exposure light to expose a portion of the thick-film-paste-material layer which portion is positioned in the bottom portion of the opening portion to the exposure light, and then developing the thick-film-paste-material layer, to form an electron emitting portion constituted of the thick-film-paste-material layer on the cathode electrode positioned in the bottom portion of the opening portion, and
   (I) removing the resist-material layer.

2. The method of manufacturing a cold cathode field emission device according to claim 1, in which ashing treatment is carried out between said steps (H) and (I) thereby to remove the modified layer formed by modifying the surface of the resist-material layer in said step (F).

3. The method of manufacturing a cold cathode field emission device according to claim 1, in which the modification of the surface of the resist-material layer in said step (F) is carried out by plasma treatment in an atmosphere containing a fluorine-containing gas.

4. The method of manufacturing a cold cathode field emission device according to claim 3, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

5. The method of manufacturing a cold cathode field emission device according to claim 1, in which the modification of the surface of the resist-material layer in said step (F) is carried out by ion implantation with fluorine ion.

6. The method of manufacturing a cold cathode field emission device according to claim 1, in which the thick-film-paste-material layer includes a carbon-nanotube structure.

7. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;
(A) forming a cathode electrode on a front surface of a supporting member, said cathode electrode extending in a first direction,
(B) forming an insulating layer on the entire surface,
(C) forming a gate electrode on the insulating layer, said gate electrode extending in a second direction different from the first direction,
(D) forming an opening portion through the gate electrode and the insulating layer to expose the cathode electrode in the bottom portion of the opening portion,
(E) forming a resist-material layer covering the side wall of the opening portion, the gate electrode and the insulating layer,
(F) modifying the surface of the resist-material layer,
(G) forming a photosensitive thick-film-paste-material layer at least in the opening portion,
(H) irradiating the front-surface side of the supporting member with exposure light to expose a portion of the thick-film-paste-material layer which portion is positioned in the bottom portion of the opening portion to the exposure light, and then developing the thick-film-paste-material layer, to form an electron emitting portion constituted of the thick-film-paste-material layer on the cathode electrode positioned in the bottom portion of the opening portion, and
(I) removing the resist-material layer.

8. A method of manufacturing a cold cathode field emission device comprising the steps of;
(A) forming a cathode electrode on a front surface of a supporting member that transmits exposure light, said cathode electrode having a hole portion having a bottom portion where the supporting member is exposed, being made of a material that transmits no exposure light and extending in a first direction,
(B) forming an insulating layer on the entire surface,
(C) forming a gate electrode on the insulating layer, said gate electrode extending in a second direction different from the first direction,
(D) forming an opening portion through the gate electrode and the insulating layer to expose the cathode electrode and the hole portion in the bottom portion of the opening portion,
(E) forming a resist-material layer covering the side wall of the opening portion, the gate electrode and the insulating layer,
(F) modifying the surface of the resist-material layer,
(G) forming a photosensitive thick-film-paste-material layer at least in the opening portion,
(H) irradiating the reverse surface of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer, said electron emitting portion spreading from the cathode electrode to the inside of the hole portion, and
(I) removing the resist-material layer.

9. The method of manufacturing a cold cathode field emission device according to claim 8, in which ashing treatment is carried out between said steps (H) and (I) thereby to remove the modified layer formed by modifying the surface of the resist-material layer in said step (F).

10. The method of manufacturing a cold cathode field emission device according to claim 8, in which the modification of the surface of the resist-material layer in said step (F) is carried out by plasma treatment in an atmosphere containing a fluorine-containing gas.

11. The method of manufacturing a cold cathode field emission device according to claim 10, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

12. The method of manufacturing a cold cathode field emission device according to claim 8, in which the modification of the surface of the resist-material layer in said step (F) is carried out by ion implantation with fluorine ion.

13. The method of manufacturing a cold cathode field emission device according to claim 8, in which in said step (B), an insulating layer made of a photosensitive material that transmits exposure light is formed,
in said step (C), a gate electrode made of a photosensitive material is formed, and
in said step (D), the reverse surface of the supporting member is irradiated with exposure light with using said hole portion as an exposure mask, to expose a portion of the insulating layer and a portion of the gate electrode above the hole portion to the exposure light, and the insulating layer and the gate electrode are developed to remove the portion of the insulating layer and the portion of the gate electrode above the hole portion, whereby an opening portion having a greater diameter than the hole portion is formed through the insulating layer and the gate electrode above the hole portion, and the cathode electrode and the hole portion are exposed in the bottom portion of the opening portion.

14. The method of manufacturing a cold cathode field emission device according to claim 8, in which in said step (B), an insulating layer made of a non-photosensitive material that transmits exposure light is formed,
in said step (C), a gate electrode made of a non-photosensitive material that transmits exposure light is formed, and
in said step (D), an etching mask layer made of a resist material is formed on the gate electrode and the insulating layer, then, the reverse surface of the supporting member is irradiated with exposure light with using said hole portion as an exposure mask, to expose the etching mask layer to the exposure light, then, the etching mask layer is developed to form an etching-mask-layer opening through a portion of the etching mask layer above the hole portion, then, the gate electrode and the insulating layer below the etching-mask-layer opening are etched with using the etching mask layer, and then etching mask layer is removed, whereby an opening portion having a larger diameter than the hole portion is formed through the insulating layer and the gate electrode above the hole portion, and the cathode electrode and the hole portion are exposed in the bottom portion of the opening portion.

15. The method of manufacturing a cold cathode field emission device according to claim 8, in which in said step (B), an insulating layer made of a photosensitive material is formed, in said step (C), a gate electrode made of a photosensitive material that transmits exposure light is formed, and in said step (D), the gate electrode and the insulating layer are irradiated with exposure light on the front-surface side of the supporting member, and then the gate electrode and the insulating layer are developed, thereby to form an opening portion having a larger diameter than the hole portion through the gate electrode and the insulating layer above the hole portion and to expose the cathode electrode and the hole portion in the bottom portion of the opening portion.

16. The method of manufacturing a cold cathode field emission device according to claim 8, in which the thick-film-paste-material layer includes a carbon-nanotube structure.

17. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;

(A) forming a cathode electrode on a front surface of a supporting member that transmits exposure light, said cathode electrode having a hole portion having a bottom portion where the supporting member is exposed, being made of a material that transmits no exposure light and extending in a first direction, (B) forming an insulating layer on the entire surface, (C) forming a gate electrode on the insulating layer, said gate electrode extending in a second direction different from the first direction, (D) forming an opening portion through the gate electrode and the insulating layer to expose the cathode electrode and the hole portion in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the reverse surface of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer, said electron emitting portion spreading from the cathode electrode to the inside of the hole portion, and (I) removing the resist-material layer.

18. A method of manufacturing a cold cathode field emission device comprising the steps of;

(A) forming a cathode electrode on a front surface of a supporting member that transmits exposure light, said cathode electrode having a hole portion having a bottom portion where the supporting member is exposed, being made of a material that transmits no exposure light and extending in a first direction, and forming, at least in the hole portion, a light-transmitting layer made of a conductive material or resistive material that transmits exposure light, (B) forming an insulating layer on the entire surface, (C) forming a gate electrode on the insulating layer, said gate electrode extending in a second direction different from the first direction, (D) forming an opening portion through the gate electrode and the insulating layer to expose the light-transmitting layer in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the reverse surface of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer on the light-transmitting layer, and (I) removing the resist-material layer.

19. The method of manufacturing a cold cathode field emission device according to claim 18, in which ashing treatment is carried out between said steps (H) and (I) thereby to remove the modified layer formed by modifying the surface of the resist-material layer in said step (F).

20. The method of manufacturing a cold cathode field emission device according to claim 18, in which the modification of the surface of the resist-material layer in said step (F) is carried out by plasma treatment in an atmosphere containing a fluorine-containing gas.

21. The method of manufacturing a cold cathode field emission device according to claim 20, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

22. The method of manufacturing a cold cathode field emission device according to claim 18, in which the modification of the surface of the resist-material layer in said step (F) is carried out by ion implantation with fluorine ion.

23. The method of manufacturing a cold cathode field emission device according to claim 18, in which in said step (B), an insulating layer made of a photosensitive material that transmits exposure light is formed, in said step (C), a gate electrode made of a photosensitive material is formed, and in said step (D), the reverse surface of the supporting member is irradiated with exposure light with using said hole portion as an exposure mask, to expose a portion of the insulating layer and a portion of the gate electrode above the hole portion to the exposure light, and the insulating layer and the gate electrode are developed to remove the portion of the insulating layer and the portion of the gate electrode above the hole portion, whereby an opening portion having a greater diameter than the hole portion is formed through the insulating layer and the gate electrode above the hole portion, and the light-transmitting layer is exposed in the bottom portion of the opening portion.

24. The method of manufacturing a cold cathode field emission device according to claim 18, in which in said step (B), an insulating layer made of a non-photosensitive material that transmits exposure light is formed, in said step (C), a gate electrode made of a non-photosensitive material that transmits exposure light is formed, and in said step (D), an etching mask layer made of a resist material is formed on the gate electrode and the insulating layer, then, the reverse surface of the supporting member is irradiated with exposure light with using said hole portion as an exposure mask, to expose the etching mask layer to the exposure light, then, the etching mask layer is developed to form an etching-mask-layer opening through a portion of the etching mask layer above the hole portion, then, the gate electrode and the insulating layer below the etching-mask-layer opening are etched with using the etching mask layer, and then etching mask layer is removed, whereby an opening portion having a larger diameter than the hole portion is formed through the insulating layer and the gate electrode above the hole portion, and the light-transmitting layer is exposed in the bottom portion of the opening portion.

25. The method of manufacturing a cold cathode field emission device according to claim 18, in which in said step (B), an insulating layer made of a photosensitive material is formed, in said step (C), a gate electrode made of a photosensitive material that transmits exposure light is formed, and in said step (D), the gate electrode and the insulating layer are irradiated with exposure light on the front-surface side of the supporting member, and then the gate electrode and the insulating layer are developed, thereby to form an opening portion having a larger diameter than the hole portion through the gate electrode and the insulating layer above the hole portion and to expose the light-transmitting layer in the bottom portion of the opening portion.

26. The method of manufacturing a cold cathode field emission device according to claim 18, in which the thick-film-paste-material layer includes a carbon-nanotube structure.

27. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;

(A) forming a cathode electrode on a front surface of a supporting member that transmits exposure light, said cathode electrode having a hole portion having a bottom portion where the supporting member is exposed, being made of a material that transmits no exposure light and extending in a first direction, and forming, at least in the hole portion, a light-transmitting layer made of a conductive material or resistive material that transmits exposure light, (B) forming an insulating layer on the entire surface, (C) forming a gate electrode on the insulating layer, said gate electrode extending in a second direction different from the first direction, (D) forming an opening portion through the gate electrode and the insulating layer to expose the light-transmitting layer in the bottom portion of the opening portion, (E) forming a resist-material layer covering the side wall of the opening portion, the gate electrode and the insulating layer, (F) modifying the surface of the resist-material layer, (G) forming a photosensitive thick-film-paste-material layer at least in the opening portion, (H) irradiating the reverse surface of the supporting member with exposure light with using said hole portion as an exposure mask, to expose a portion of the thick-film-paste-material layer above the hole portion to the exposure light, and developing the thick-film-paste-material layer, to form an electron emitting portion constituted of the thick-film-paste-material layer on the light-transmitting layer, and (I) removing the resist-material layer.

28. A method of manufacturing a cold cathode field emission device comprising the steps of;

(A) forming a cathode electrode on a front surface of a supporting member, said cathode electrode extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) carrying out the exposure of the thick-film-paste-material layer to exposure light on the front-surface side and then developing the thick-film-paste-material layer, to form an electron emitting portion constituted of the thick-film-paste-material layer on the cathode electrode covered with no resist-material layer, and (F) removing the resist-material layer.

29. The method of manufacturing a cold cathode field emission device according to claim 28, in which ashing treatment is carried out between said steps (E) and (F) thereby to remove the modified layer formed by modifying the surface of the resist-material layer in said step (C).

30. The method of manufacturing a cold cathode field emission device according to claim 28, in which the modification of the surface of the resist-material layer in said step (C) is carried out by plasma treatment in an atmosphere containing a fluorine-containing gas.

31. The method of manufacturing a cold cathode field emission device according to claim 30, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

32. The method of manufacturing a cold cathode field emission device according to claim 28, in which the modification of the surface of the resist-material layer in said step (C) is carried out by ion implantation with fluorine ion.

33. The method of manufacturing a cold cathode field emission device according to claim 28, in which the thick-film-paste-material layer includes a carbon-nanotube structure.

34. The method of manufacturing a cold cathode field emission device according to claim 28, comprising carrying out up to said step (F), and then carrying out the steps of;

(G) forming an insulating layer on the entire surface, (H) forming a gate electrode on the insulating layer, said gate electrode extending in a second direction different from the first direction, and (I) forming an opening portion through the gate electrode and the insulating layer to expose the electron emitting portion in the bottom portion of the opening portion.

35. The method of manufacturing a cold cathode field emission device according to claim 34, in which ashing treatment is carried out between said steps (E) and (F) thereby to remove the modified layer formed by modifying the surface of the resist-material layer in said step (C).

36. The method of manufacturing a cold cathode field emission device according to claim 34, in which the modification of the surface of the resist-material layer in said step (C) is carried out by plasma treatment in an atmosphere containing a fluorine-containing gas.

37. The method of manufacturing a cold cathode field emission device according to claim 36, in which the fluorine-containing gas is at least one member selected from the group consisting of $CF_4$, $C_4F_8$, $CH_2F_2$, $SF_6$, $C_2F_6$, $C_3F_8$, $C_5\mu l_2$, $F_2$, $NF_3$, $SiF_4$, $BF_3$ and $CHF_3$.

38. The method of manufacturing a cold cathode field emission device according to claim 34, in which the modification of the surface of the resist-material layer in said step (C) is carried out by ion implantation with fluorine ion.

39. The method of manufacturing a cold cathode field emission device according to claim 34, in which the thick-film-paste-material layer includes a carbon-nanotube structure.

40. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;

(A) forming a cathode electrode on a front surface of a supporting member, said cathode electrode extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) carrying out the exposure of the thick-film-paste-material layer to exposure light on the front-surface side and then developing the thick-film-paste-material layer, to form an electron emitting portion constituted of the thick-film-paste-material layer on the cathode electrode covered with no resist-material layer, and (F) removing the resist-material layer.

41. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;

(A) forming a cathode electrode on a front surface of a supporting member, said cathode electrode extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) carrying out the exposure of the thick-film-paste-material layer to exposure light on the front-surface side and then developing the thick-film-paste-material layer, to form an electron emitting portion constituted of the thick-film-paste-material layer on the cathode electrode covered with no resist-material layer, (F) removing the resist-material layer, (G) forming an insulating layer on the entire surface, (H) forming a gate electrode on the insulating layer, said gate electrode extending in a second direction different from the first direction, and (I) forming an opening portion through the gate electrode and the insulating layer to expose the electron emitting portion in the bottom portion of the opening portion.

42. A method of manufacturing a cold cathode field emission device comprising the steps of;

(A) forming a cathode electrode on a front surface of a supporting member that transmits exposure light, said cathode electrode having a hole portion having a bottom portion where the supporting member is exposed, being made of a material that transmits no exposure light and extending in a first direction, (B) forming a resist-material layer on the entire surface and then patterning the resist-material layer, to obtain the resist-material layer in a state where part of the cathode electrode is exposed, (C) modifying the surface of the resist-material layer, (D) forming a photosensitive thick-film-paste-material layer on the entire surface, (E) irradiating the reverse surface of the supporting member with exposure light with using said hole portion as an exposure mask, to expose a portion of the thick-film-paste-material layer above the hole portion to the exposure light, and then developing the thick-film-paste-material layer, to form an electron emitting portion constituted of the thick-film-paste-material layer, the electron emitting portion spreading from the cathode electrode to the inside of the hole portion, and (F) removing the resist-material layer.

43. The method of manufacturing a cold cathode field emission device according to claim 42, in which ashing treatment is carried out between said steps (E) and (F) thereby to remove the modified layer formed by modifying the surface of the resist-material layer in said step (C).

44. The method of manufacturing a cold cathode field emission device according to claim 42, in which the modification of the surface of the resist-material layer in said step (C) is carried out by plasma treatment in an atmosphere containing a fluorine-containing gas.

45. The method of manufacturing a cold cathode field emission device according to claim 44, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

46. The method of manufacturing a cold cathode field emission device according to claim 42, in which the modification of the surface of the resist-material layer in said step (C) is carried out by ion implantation with fluorine ion.

47. The method of manufacturing a cold cathode field emission device according to claim 42, in which the thick-film-paste-material layer includes a carbon-nanotube structure.

48. The method of manufacturing a cold cathode field emission device according to claim 42, comprising carrying out up to said step (F), and then carrying out the steps of;
(G) forming an insulating layer on the entire surface,
(H) forming a gate electrode on the insulating layer, said gate electrode extending in a second direction different from the first direction, and
(I) forming an opening portion through the gate electrode and the insulating layer, to expose the electron emitting portion in the bottom portion of the opening portion.

49. The method of manufacturing a cold cathode field emission device according to claim 48, in which ashing treatment is carried out between said steps (E) and (F) thereby to remove the modified layer formed by modifying the surface of the resist-material layer in said step (C).

50. The method of manufacturing a cold cathode field emission device according to claim 48, in which the modification of the surface of the resist-material layer in said step (C) is carried out by plasma treatment in an atmosphere containing a fluorine-containing gas.

51. The method of manufacturing a cold cathode field emission device according to claim 50, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

52. The method of manufacturing a cold cathode field emission device according to claim 48, in which the modification of the surface of the resist-material layer in said step (C) is carried out by ion implantation with fluorine ion.

53. The method of manufacturing a cold cathode field emission device according to claim 48, in which the thick-film-paste-material layer includes a carbon-nanotube structure.

54. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;
(A) forming a cathode electrode on a front surface of a supporting member that transmits exposure light, said cathode electrode having a hole portion having a bottom portion where the supporting member is exposed, being made of a material that transmits no exposure light and extending in a first direction,
(B) forming a resist-material layer on the entire surface and then patterning the resist-material layer, to obtain the resist-material layer in a state where part of the cathode electrode is exposed,
(C) modifying the surface of the resist-material layer,
(D) forming a photosensitive thick-film-paste-material layer on the entire surface,
(E) irradiating the reverse surface of the supporting member with exposure light with using said hole portion as an exposure mask, to expose a portion of the thick-film-paste-material layer above the hole portion to the exposure light, and then developing the thick-film-paste-material layer, to form an electron emitting portion constituted of the thick-film-paste-material layer, the electron emitting portion spreading from the cathode electrode to the inside of the hole portion, and
(F) removing the resist-material layer.

55. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;
(A) forming a cathode electrode on a front surface of a supporting member that transmits exposure light, said cathode electrode having a hole portion having a bottom portion where the supporting member is exposed, being made of a material that transmits no exposure light and extending in a first direction,
(B) forming a resist-material layer on the entire surface and then patterning the resist-material layer, to obtain the resist-material layer in a state where part of the cathode electrode is exposed,
(C) modifying the surface of the resist-material layer,
(D) forming a photosensitive thick-film-paste-material layer on the entire surface,
(E) irradiating the reverse surface of the supporting member with exposure light with using said hole portion as an exposure mask, to expose a portion of the thick-film-paste-material layer above the hole portion to the exposure light, and then developing the thick-film-paste-material layer, to form an electron emitting portion constituted of the thick-film-paste-material layer, the electron emitting portion spreading from the cathode electrode to the inside of the hole portion,
(F) removing the resist-material layer,
(G) forming an insulating layer on the entire surface,
(H) forming a gate electrode on the insulating layer, said gate electrode extending in a second direction different from the first direction, and
(I) forming an opening portion through the gate electrode and the insulating layer, to expose the electron emitting portion in the bottom portion of the opening portion.

56. A method of manufacturing a cold cathode field emission device comprising the steps of;
(A) forming a cathode electrode on a front surface of a supporting member that transmits exposure light, said cathode electrode having a hole portion having a bottom portion where the supporting member is exposed, being made of a material that transmits no exposure light and extending in a first direction, and then forming, at least in the hole portion, a light-transmitting layer made of a conductive material or resistive material that transmits exposure light,
(B) forming a resist-material layer on the entire surface and then patterning the resist-material layer, to obtain the resist-material layer in a state where at least the light-transmitting layer in the hole portion is exposed,
(C) modifying the surface of the resist-material layer,
(D) forming a photosensitive thick-film-paste-material layer on the entire surface,
(E) irradiating the reverse surface of the supporting member with exposure light with using said hole portion as an exposure mask, to expose a portion of the thick-film-paste-material layer above the light-transmitting layer to the exposure light, and then developing the thick-film-paste-material layer, to form an electron emitting portion constituted of the thick-film-paste-material layer on the light-transmitting layer, and
(F) removing the resist-material layer.

57. The method of manufacturing a cold cathode field emission device according to claim 56, in which ashing treatment is carried out between said steps (E) and (F)

thereby to remove the modified layer formed by modifying the surface of the resist-material layer in said step (C).

58. The method of manufacturing a cold cathode field emission device according to claim 56, in which the modification of the surface of the resist-material layer in said step (C) is carried out by plasma treatment in an atmosphere containing a fluorine-containing gas.

59. The method of manufacturing a cold cathode field emission device according to claim 58, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

60. The method of manufacturing a cold cathode field emission device according to claim 56, in which the modification of the surface of the resist-material layer in said step (C) is carried out by ion implantation with fluorine ion.

61. The method of manufacturing a cold cathode field emission device according to claim 56, in which the thick-film-paste-material layer includes a carbon-nanotube structure.

62. The method of manufacturing a cold cathode field emission device according to claim 56, comprising carrying out up to said step (F), and then carrying out the steps of;
   (G) forming an insulating layer on the entire surface,
   (H) forming a gate electrode on the insulating layer, said gate electrode extending in a second direction different from the first direction, and
   (I) forming an opening portion through the gate electrode and the insulating layer to expose the electron emitting portion in the bottom portion of the opening portion.

63. The method of manufacturing a cold cathode field emission device according to claim 62, in which ashing treatment is carried out between said steps (E) and (F) thereby to remove the modified layer formed by modifying the surface of the resist-material layer in said step (C).

64. The method of manufacturing a cold cathode field emission device according to claim 62, in which the modification of the surface of the resist-material layer in said step (C) is carried out by plasma treatment in an atmosphere containing a fluorine-containing gas.

65. The method of manufacturing a cold cathode field emission device according to claim 64, in which the fluorine-containing gas is at least one member selected from the group consisting of $CF_4$, $C_4F_8$, $CH_2F_2$, $SF_6$, $C_2F_6$, $C_3F_8$, $C_5F_{12}$, $F_2$, $NF_3$, $SiF_4$, $BF_3$ and $CHF_3$.

66. The method of manufacturing a cold cathode field emission device according to claim 62, in which the modification of the surface of the resist-material layer in said step (C) is carried out by ion implantation with fluorine ion.

67. The method of manufacturing a cold cathode field emission device according to claim 62, in which the thick-film-paste-material layer includes a carbon-nanotube structure.

68. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;
   (A) forming a cathode electrode on a front surface of a supporting member that transmits exposure light, said cathode electrode having a hole portion having a bottom portion where the supporting member is exposed, being made of a material that transmits no exposure light and extending in a first direction, and then forming, at least in the hole portion, a light-transmitting layer made of a conductive material or resistive material that transmits exposure light,
   (B) forming a resist-material layer on the entire surface and then patterning the resist-material layer, to obtain the resist-material layer in a state where at least the light-transmitting layer in the hole portion is exposed,
   (C) modifying the surface of the resist-material layer,
   (D) forming a photosensitive thick-film-paste-material layer on the entire surface,
   (E) irradiating the reverse surface of the supporting member with exposure light with using said hole portion as an exposure mask, to expose a portion of the thick-film-paste-material layer above the light-transmitting layer to the exposure light, and then developing the thick-film-paste-material layer, to form an electron emitting portion constituted of the thick-film-paste-material layer on the light-transmitting layer, and
   (F) removing the resist-material layer.

69. A method of manufacturing a cold cathode field emission display comprising arranging a substrate having an anode electrode and a phosphor layer formed thereon and a supporting member having a cold cathode field emission device formed thereon such that the phosphor layer and the cold cathode field emission device face each other, and bonding the substrate and the supporting member in their circumferential portions, and comprising manufacturing a cold cathode field emission device by the steps of;
   (A) forming a cathode electrode on a front surface of a supporting member that transmits exposure light, said cathode electrode having a hole portion having a bottom portion where the supporting member is exposed, being made of a material that transmits no exposure light and extending in a first direction, and then forming, at least in the hole portion, a light-transmitting layer made of a conductive material or resistive material that transmits exposure light,
   (B) forming a resist-material layer on the entire surface and then patterning the resist-material layer, to obtain the resist-material layer in a state where at least the light-transmitting layer in the hole portion is exposed,
   (C) modifying the surface of the resist-material layer,
   (D) forming a photosensitive thick-film-paste-material layer on the entire surface,
   (E) irradiating the reverse surface of the supporting member with exposure light with using said hole portion as an exposure mask, to expose a portion of the thick-film-paste-material layer above the light-transmitting layer to the exposure light, and then developing the thick-film-paste-material layer, to form an electron emitting portion constituted of the thick-film-paste-material layer on the light-transmitting layer,
   (F) removing the resist-material layer,
   (G) forming an insulating layer on the entire surface,
   (H) forming a gate electrode on the insulating layer, said gate electrode extending in a second direction different from the first direction, and
   (I) forming an opening portion through the gate electrode and the insulating layer to expose the electron emitting portion in the bottom portion of the opening portion.

* * * * *

UNITED STATES PATENT AND TRADEMARK OFFICE
CERTIFICATE OF CORRECTION

PATENT NO. : 7,297,469 B2  Page 1 of 1
APPLICATION NO. : 10/496295
DATED : November 20, 2007
INVENTOR(S) : Motohiro Toyota et al.

It is certified that error appears in the above-identified patent and that said Letters Patent is hereby corrected as shown below:

Column 59, Lines 20-21:
"$C_5\mu l_2$" should read -- $C_5F_{12}$ --.

Signed and Sealed this

Fifteenth Day of April, 2008

JON W. DUDAS
*Director of the United States Patent and Trademark Office*